(12) United States Patent
Yamaguchi et al.

(10) Patent No.: US 9,130,012 B2
(45) Date of Patent: *Sep. 8, 2015

(54) MICROSTRUCTURE, MICROMACHINE, AND MANUFACTURING METHOD OF MICROSTRUCTURE AND MICROMACHINE

(71) Applicant: Semiconductor Energy Laboratory Co., Ltd., Atsugi-shi, Kanagawa-ken (JP)

(72) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,748

(22) Filed: May 29, 2014

(65) Prior Publication Data
US 2014/0262000 A1    Sep. 18, 2014

Related U.S. Application Data

(62) Division of application No. 13/414,758, filed on Mar. 8, 2012, now Pat. No. 8,741,682, which is a division of application No. 11/748,183, filed on May 14, 2007, now Pat. No. 8,138,560.

(30) Foreign Application Priority Data

May 18, 2006    (JP) .................................. 2006-138835

(51) Int. Cl.
*H01L 21/20*    (2006.01)
*H01L 21/762*    (2006.01)
(Continued)

(52) U.S. Cl.
CPC .............. *H01L 21/762* (2013.01); *B32B 38/10* (2013.01); *B81C 3/008* (2013.01); *B81C 2201/019* (2013.01); *Y10T 428/24802* (2015.01)

(58) Field of Classification Search
CPC ............ H01L 27/1214; H01L 27/1251; H01L 27/1266; H01L 27/14625; H01L 27/3244; H01L 29/66772
USPC ............. 257/415, 418, E21.141, 259, 33.014, 257/23.143
See application file for complete search history.

(56) References Cited

U.S. PATENT DOCUMENTS 6,245,249 B1    6/2001    Yamada et al.
6,557,607 B2    5/2003    Yamada et al.
(Continued)

FOREIGN PATENT DOCUMENTS

EP    1411024 A    4/2004
EP    1659437 A    5/2006
(Continued)

OTHER PUBLICATIONS

European Search Report (Application No. 07743258.1) Dated Jul. 4, 2014.
(Continued)

*Primary Examiner* — Michael Lebentritt
(74) *Attorney, Agent, or Firm* — Fish & Richardson P.C.

(57) ABSTRACT

Without sacrificial layer etching, a microstructure and a micromachine are manufactured. A separation layer 102 is formed over a substrate 101, and a layer 103 to be a movable electrode is formed over the separation layer 102. At an interface of the separation layer 102, the layer 103 to be a movable electrode is separated from the substrate. A layer 106 to be a fixed electrode is formed over another substrate 105. The layer 103 to be a movable electrode is fixed to the substrate 105 with the spacer layer 103 which is partially provided interposed therebetween, so that the layer 103 to be a movable electrode and a layer 106 to be a fixed electrode face each other.

10 Claims, 38 Drawing Sheets

(51) Int. Cl.
   *B81C 3/00*   (2006.01)
   *B32B 38/10*  (2006.01)

(56) References Cited

U.S. PATENT DOCUMENTS

| | | | |
|---|---|---|---|
| 6,663,820 B2 | 12/2003 | Arias et al. | |
| 6,860,939 B2 | 3/2005 | Hartzell | |
| 6,930,368 B2 | 8/2005 | Hartwell et al. | |
| 6,995,495 B2 | 2/2006 | Ko et al. | |
| 7,125,451 B2 | 10/2006 | Hartzell | |
| 7,128,783 B2 | 10/2006 | Hartzell | |
| 7,135,070 B2 | 11/2006 | Hartzell | |
| 7,156,916 B2 | 1/2007 | Hartzell | |
| 7,508,111 B2 | 3/2009 | Ko et al. | |
| 7,763,203 B2 | 7/2010 | Arias et al. | |
| 8,138,560 B2 * | 3/2012 | Yamaguchi et al. | 257/415 |
| 8,741,682 B2 * | 6/2014 | Yamaguchi et al. | 438/59 |
| 2001/0023010 A1 | 9/2001 | Yamada et al. | |
| 2001/0042598 A1 | 11/2001 | Yamada et al. | |
| 2003/0196591 A1 | 10/2003 | Hartzell | |
| 2004/0063322 A1 | 4/2004 | Yang | |
| 2005/0012197 A1 | 1/2005 | Smith et al. | |
| 2005/0023547 A1 | 2/2005 | Hartwell et al. | |
| 2005/0130360 A1 | 6/2005 | Zhan et al. | |
| 2005/0153475 A1 | 7/2005 | Hartzell | |
| 2006/0267153 A1 | 11/2006 | Yamaguchi et al. | |
| 2006/0270238 A1 | 11/2006 | Izumi et al. | |
| 2007/0065595 A1 | 3/2007 | Yamada et al. | |

FOREIGN PATENT DOCUMENTS

| | | |
|---|---|---|
| JP | 10-040597 A | 2/1998 |
| JP | 10-270718 A | 10/1998 |
| JP | 10-305488 A | 11/1998 |
| JP | 2000-208018 A | 7/2000 |
| JP | 2002-217390 A | 8/2002 |
| JP | 2003-326500 A | 11/2003 |
| JP | 2004-001201 A | 1/2004 |
| JP | 2004-139085 A | 5/2004 |
| JP | 2004-526581 | 9/2004 |
| JP | 2005-052963 A | 3/2005 |
| JP | 2005-216551 A | 8/2005 |
| JP | 2066-116696 A | 5/2006 |
| WO | WO-02/072189 | 9/2002 |

OTHER PUBLICATIONS

International Search Report (Application No. PCT/JP2007/059823) Dated Jul. 10, 2007.
Written Opinion (Application No. PCT/JP2007/059823) Dated Jul. 10, 2007.

* cited by examiner

FIG. 2A1
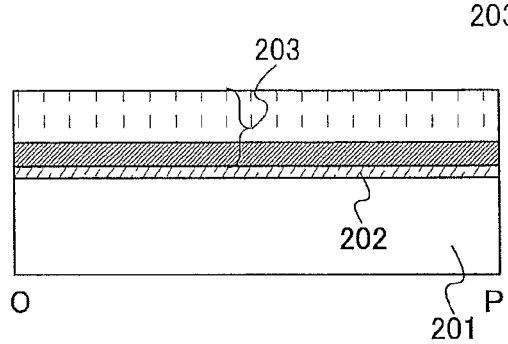
FIG. 2A2
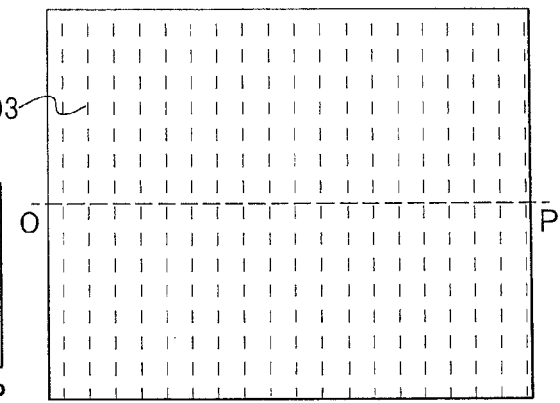
FIG. 2B1
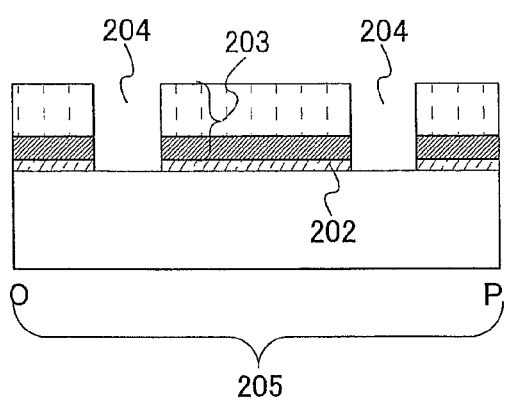
FIG. 2B2
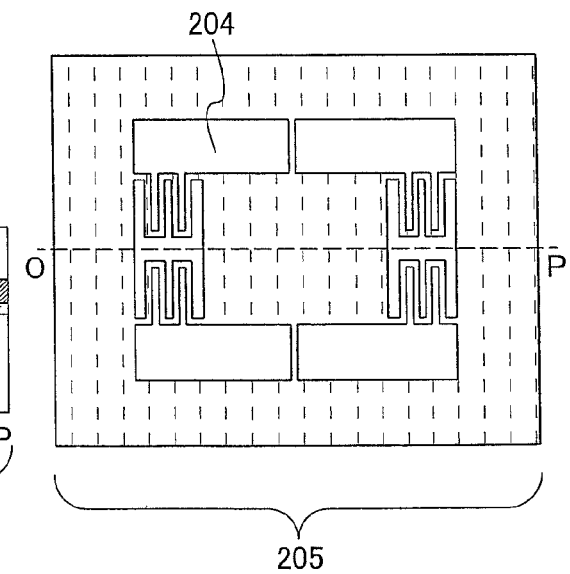

FIG. 3A1
FIG. 3A2
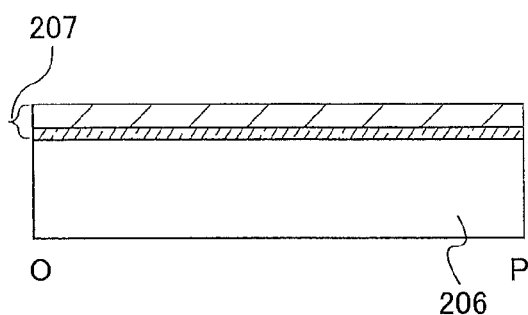
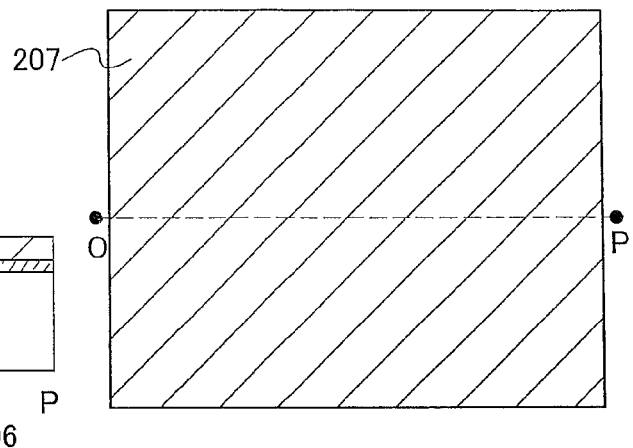
FIG. 3B1
FIG. 3B2
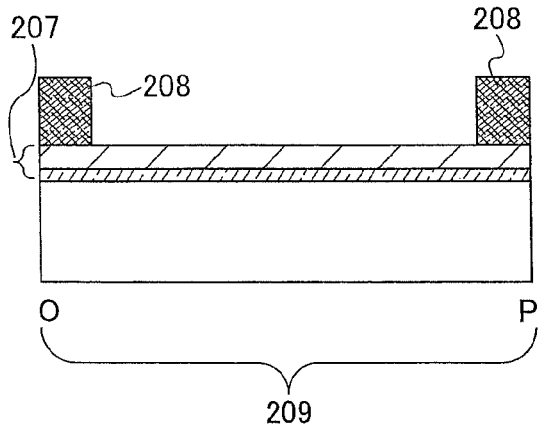
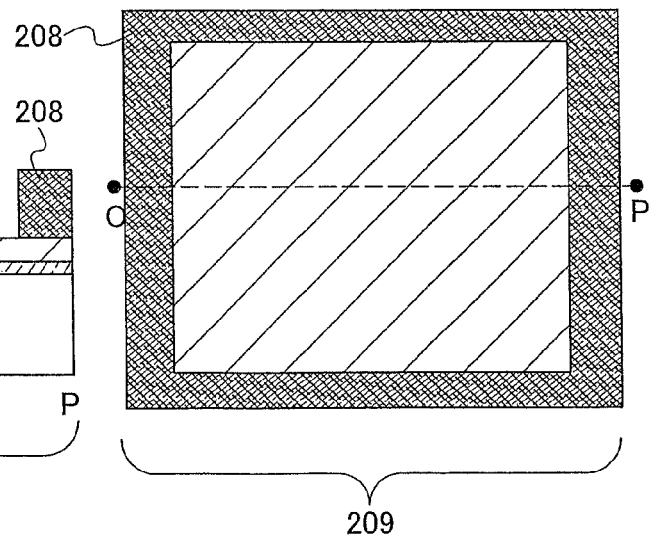

FIG. 4A
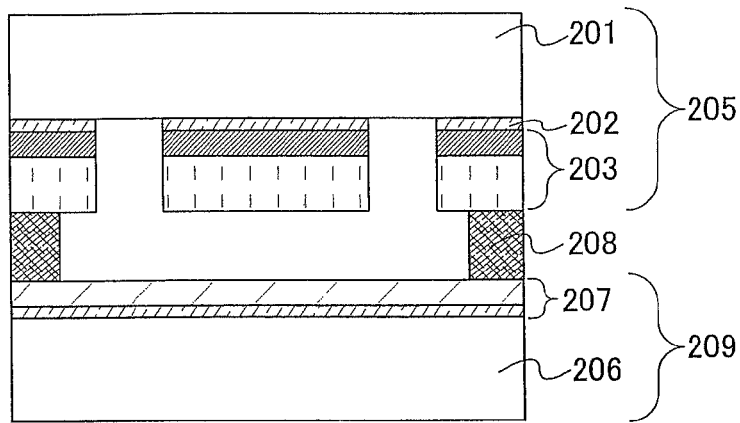
FIG. 4B
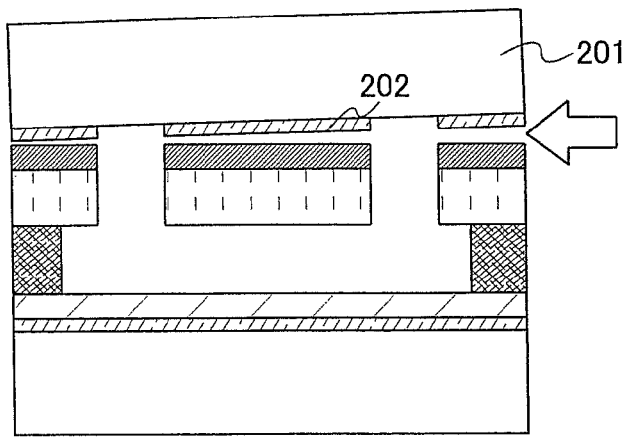
FIG. 4C1
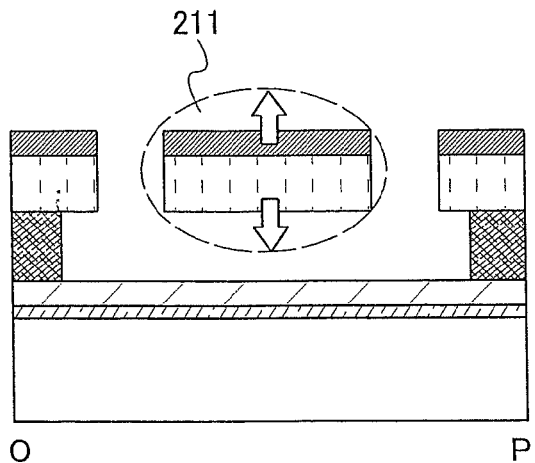
FIG. 4C2
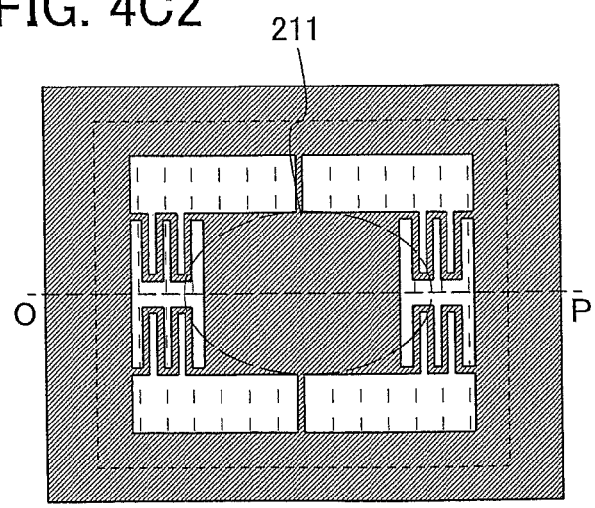

FIG. 5A
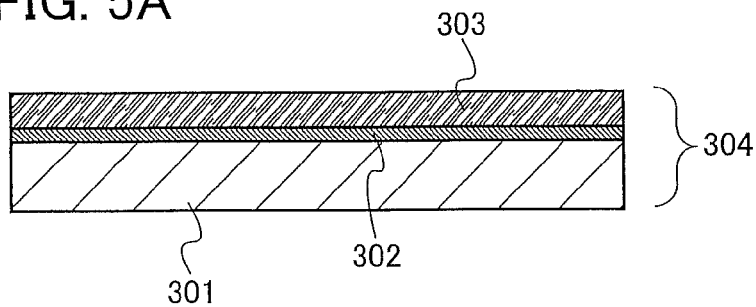
FIG. 5B
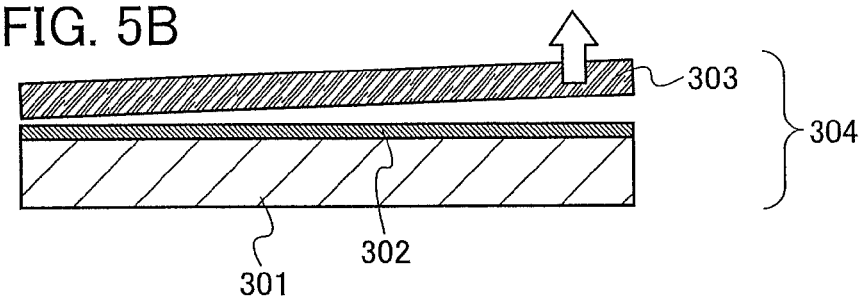
FIG. 5C
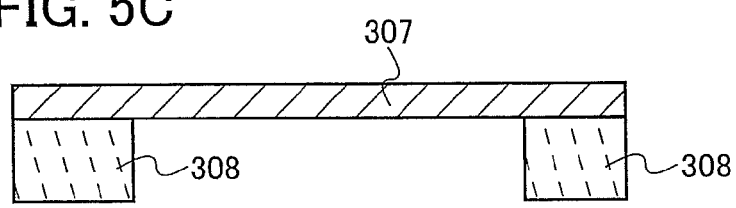
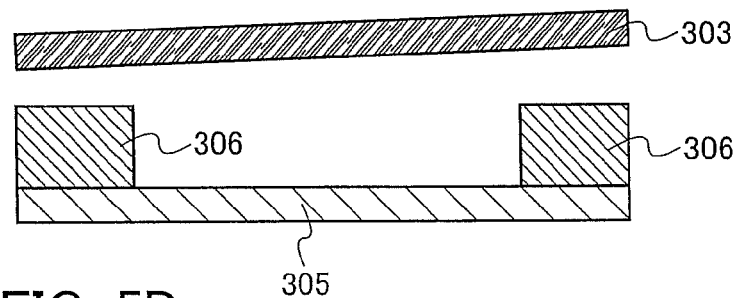
FIG. 5D
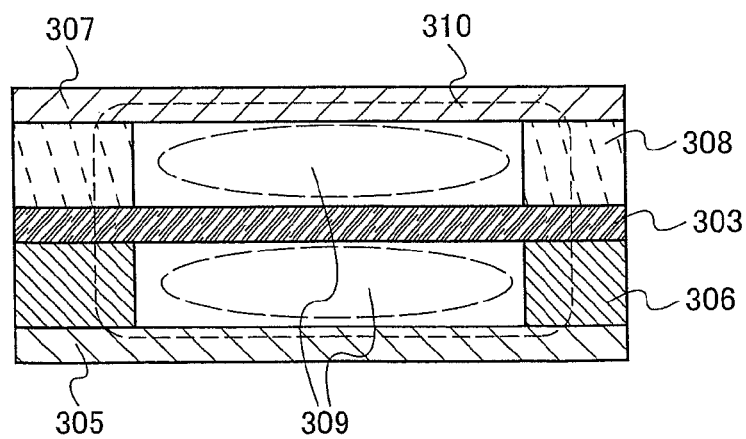

FIG. 10A1
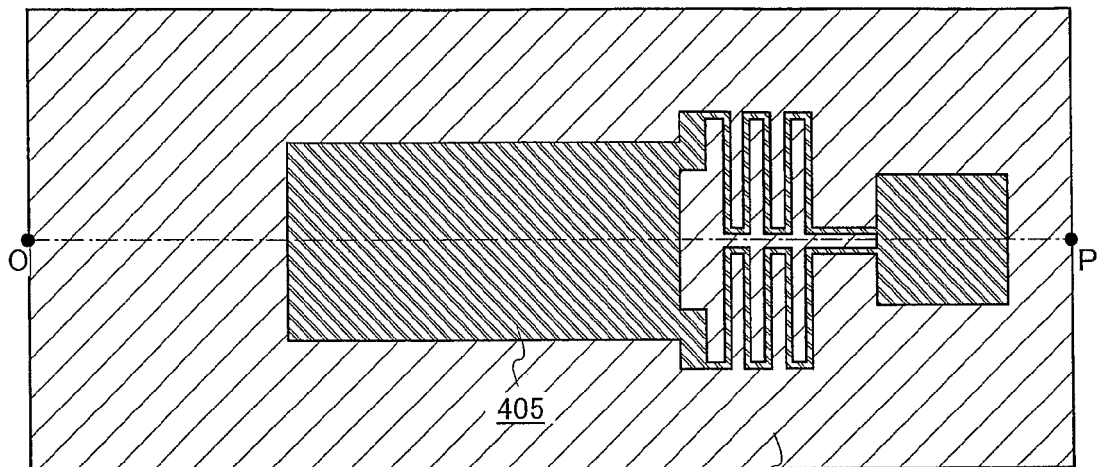
FIG. 10A2
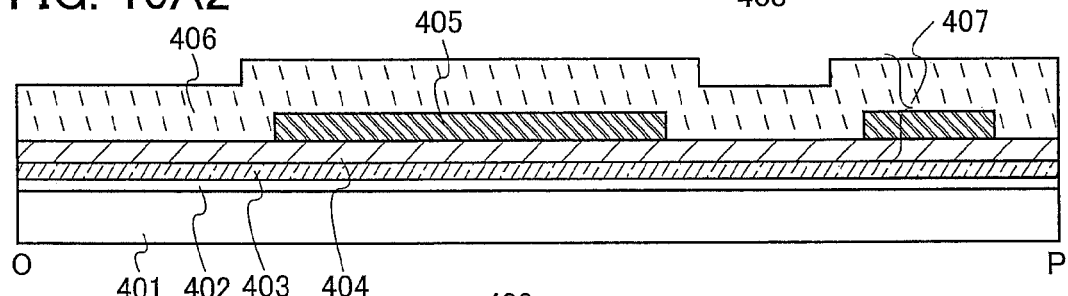
FIG. 10B1
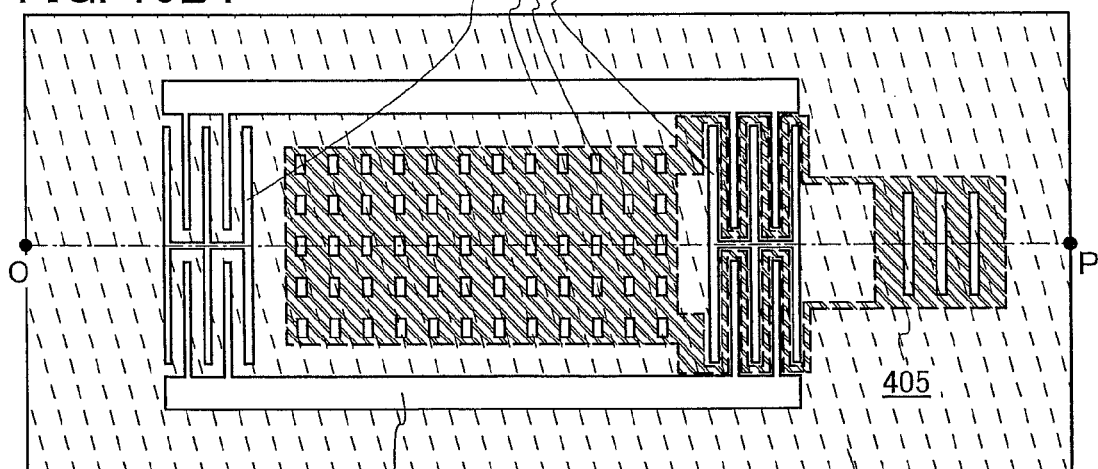
FIG. 10B2
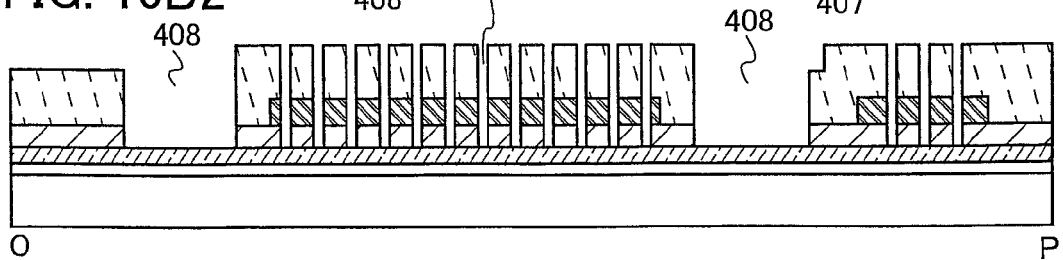

FIG. 13A1
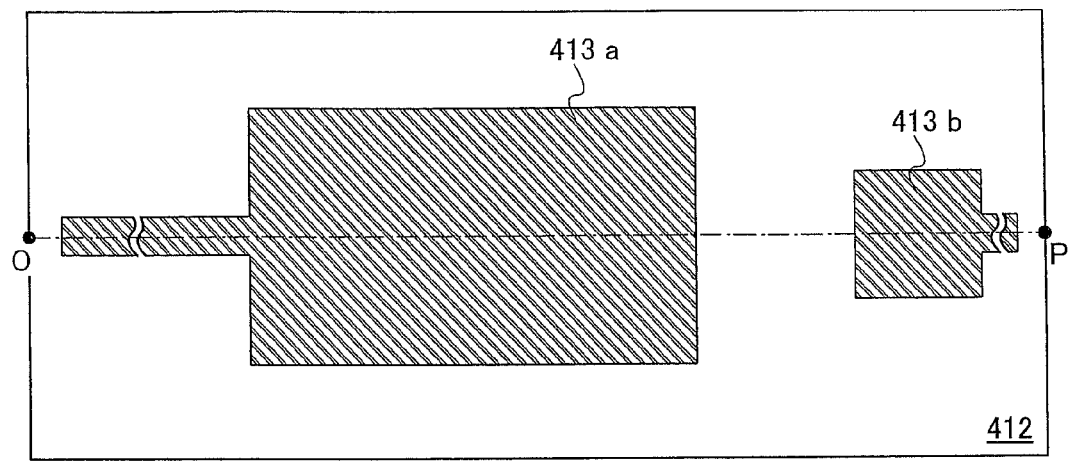
FIG. 13A2
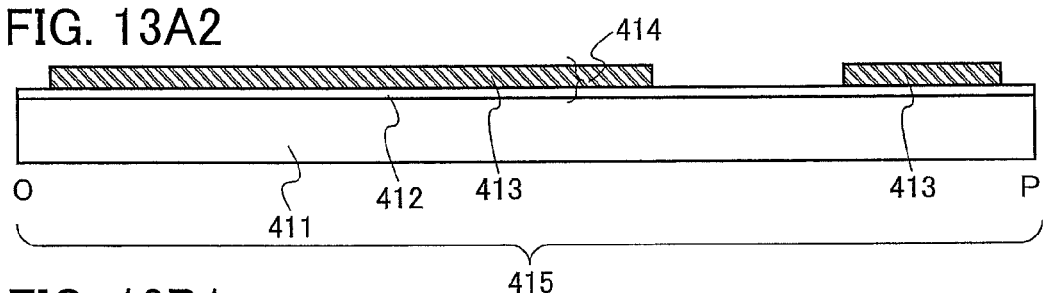
FIG. 13B1
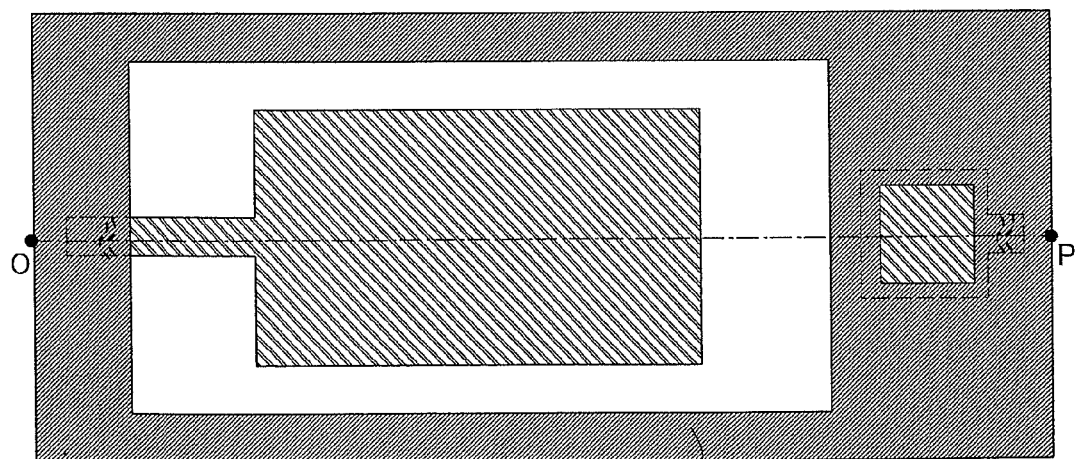
FIG. 13B2
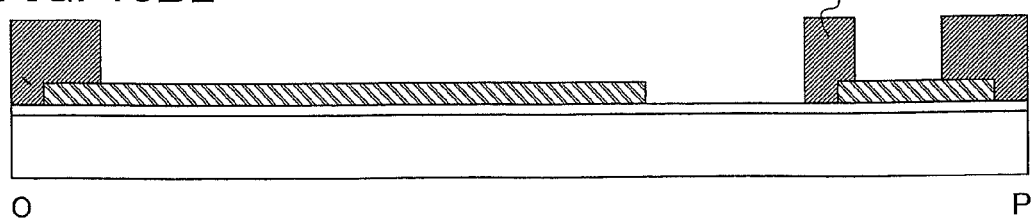

FIG. 17A1
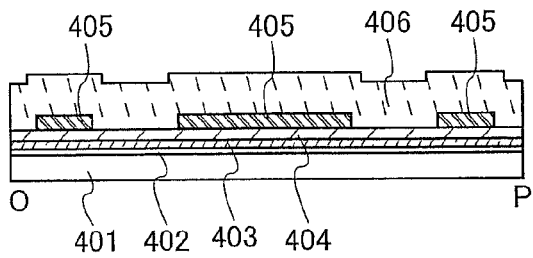
FIG. 17A2
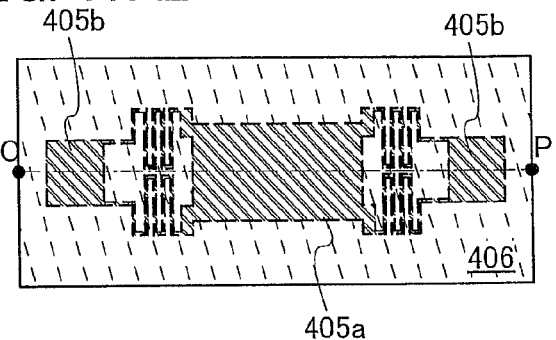
FIG. 17B1
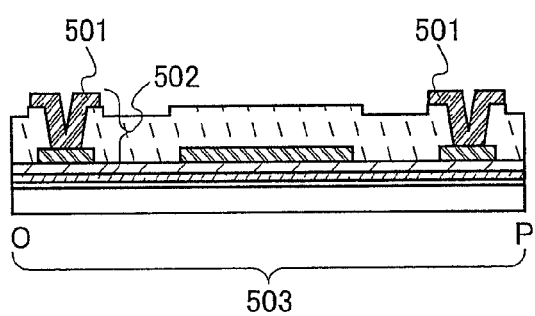
FIG. 17B2
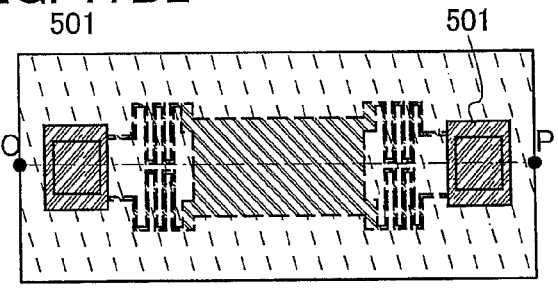
FIG. 17C1
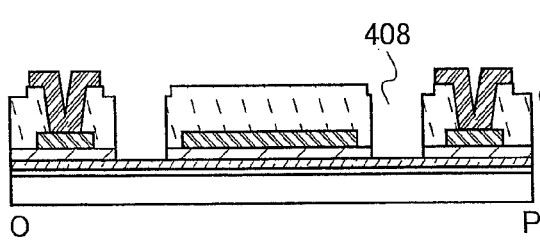
FIG. 17C2
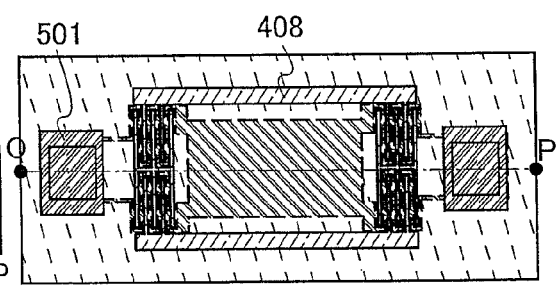
FIG. 17D
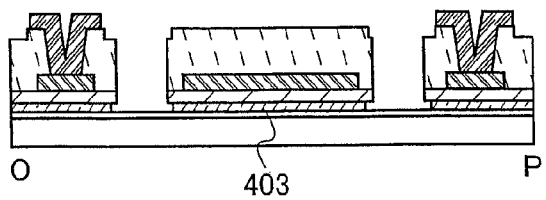

FIG. 18A1
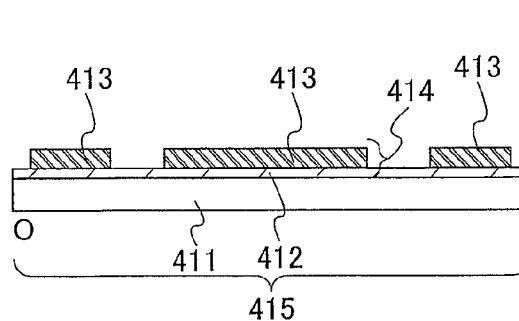
FIG. 18A2
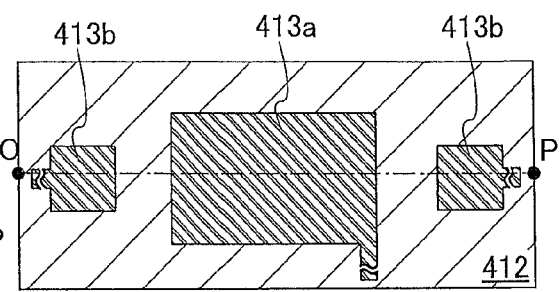
FIG. 18B1
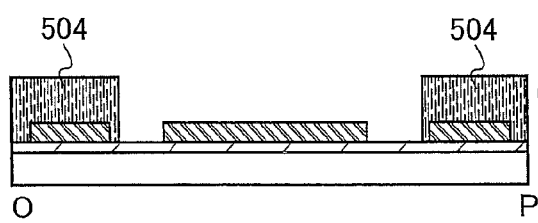
FIG. 18B2
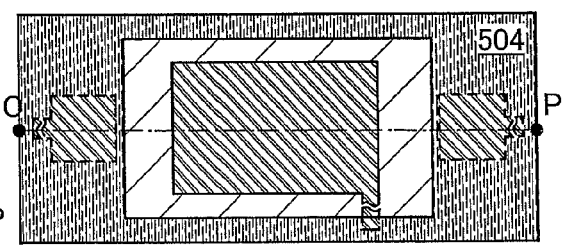

FIG. 20A1
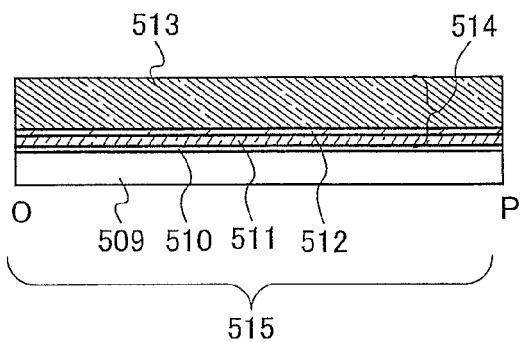
FIG. 20A2
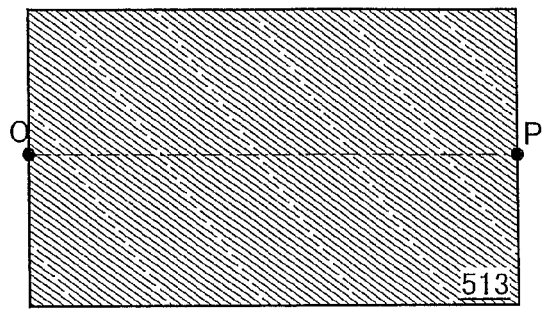
FIG. 20B1
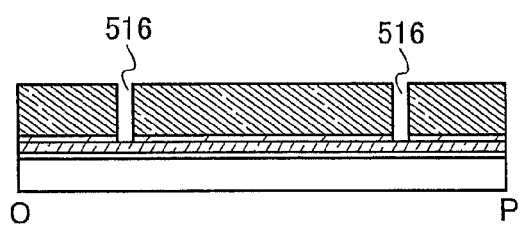
FIG. 20B2
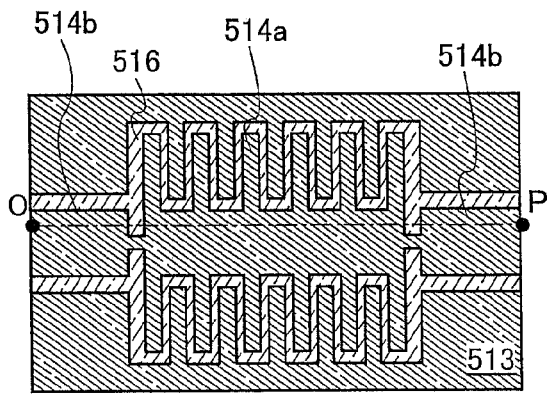
FIG. 20C
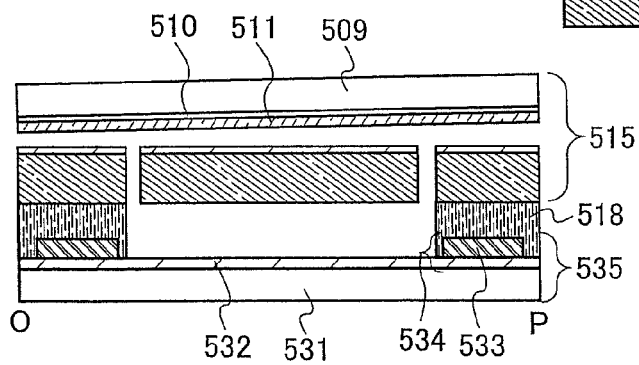
FIG. 20D
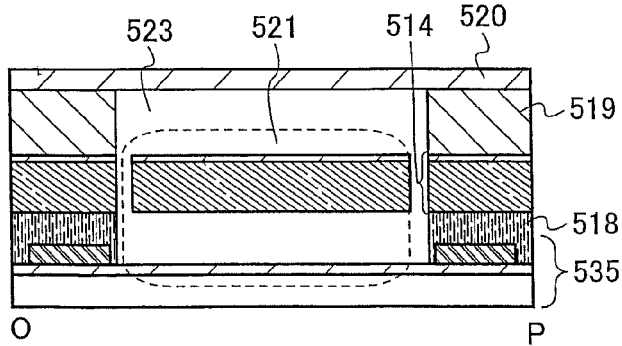

FIG. 26A1
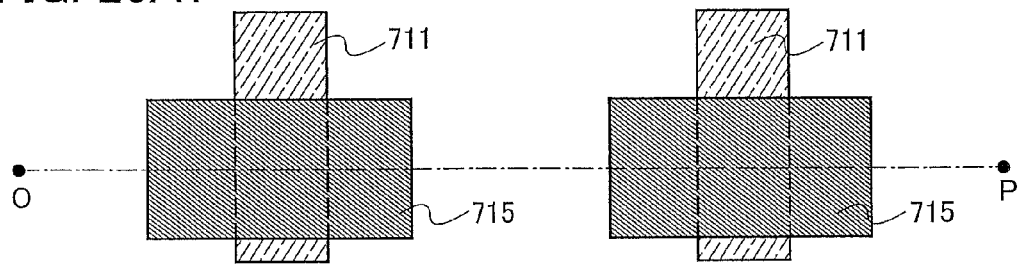
FIG. 26A2
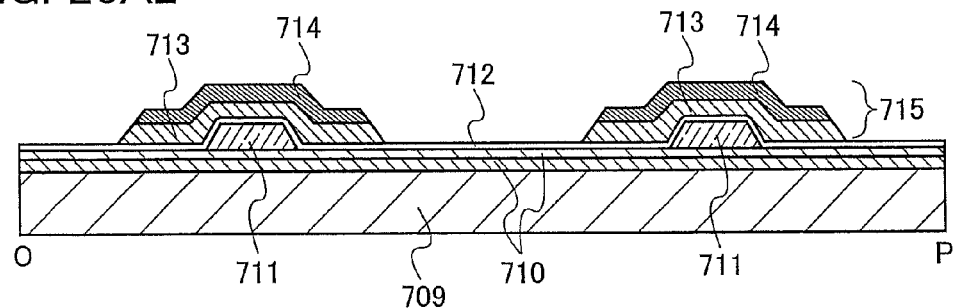
FIG. 26B1
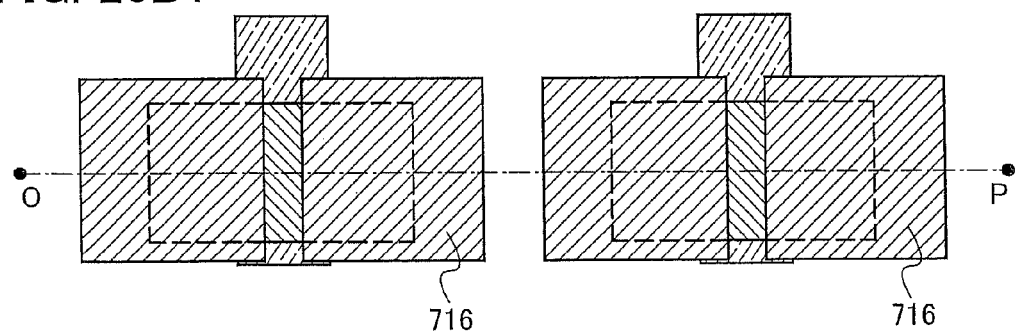
FIG. 26B2
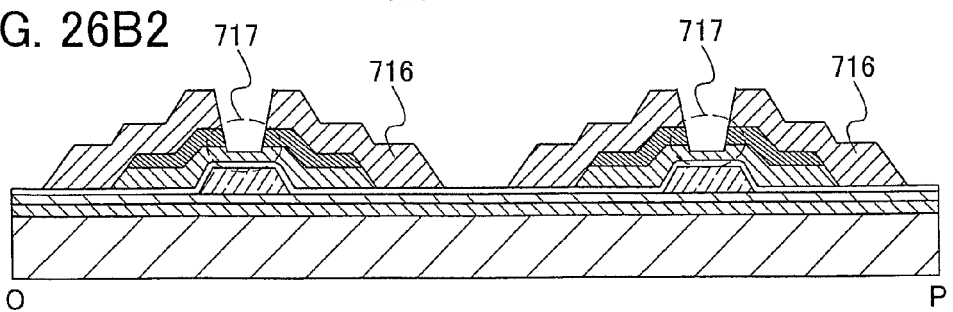

FIG. 34A
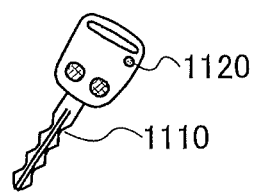
FIG. 34B
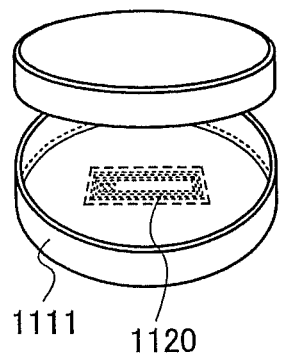
FIG. 34C
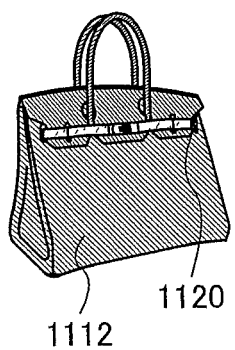
FIG. 34D
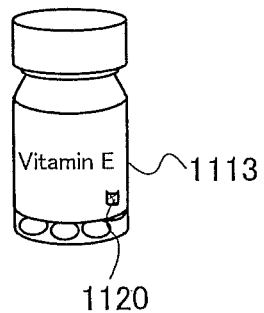
FIG. 34E
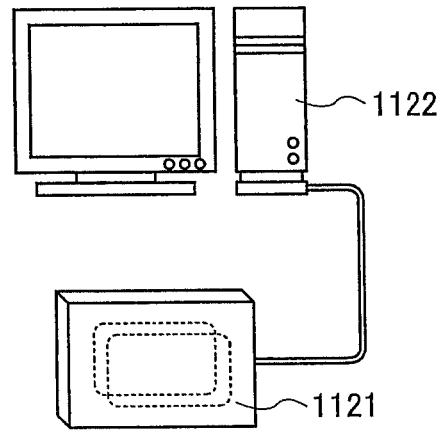
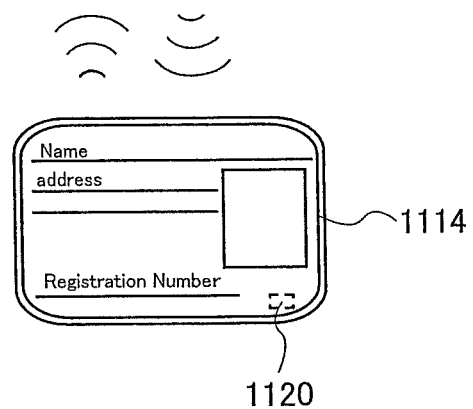

210   212   211   212

MICROSTRUCTURE, MICROMACHINE, AND MANUFACTURING METHOD OF MICROSTRUCTURE AND MICROMACHINE

CROSS-REFERENCE TO RELATED APPLICATIONS

This application is a divisional of U.S. application Ser. No. 13/414,758, filed Mar. 8, 2012, now allowed, which is a divisional of U.S. application Ser. No. 11/748,183, filed May 14, 2007, now U.S. Pat. No. 8,138,560, which claims the benefit of a foreign priority application filed in Japan as Serial No. 2006-138835 on May 18, 2006, both of which are incorporated by reference.

TECHNICAL FIELD

The present invention relates to a microstructure for forming a micromachine, a micromachine, and a semiconductor device. Further, the present invention relates to a manufacturing method of a microstructure and a micromachine including a microstructure.

BACKGROUND ART

A micromachine is also called MEMS (Micro Electro Mechanical System) or MST (Micro System Technology) and refers to a comprehensive system combining a minute mechanical microstructure and an electric circuit. The above-described microstructure is different from a general semiconductor element and has a three-dimensional structure, and a part of the microstructure is movable in many cases. The micromachine can have various functions of a passive element such as a sensor, an actuator, an inductor, or a variable capacitor, a switch, or the like. The electric circuit is generally formed using a semiconductor element and can control the operation of the microstructure, or receive and process a weak signal output from the microstructure.

Further, micromachines can be classified into groups according to their manufacturing methods. One is bulk micromachines in which microstructures are manufactured using crystal anisotropy of a silicon substrate, and the other is surface micromachines in which thin films are formed over various substrates to manufacture three-dimensional microstructures (Reference 1: Japanese Patent No. 3590283). In particular, the surface micromachines have been actively researched, especially in the United States, because a microstructure and an electric circuit can be formed over one substrate.

DISCLOSURE OF INVENTION

A microstructure included in a micromachine has a three-dimensional structure including a portion fixed to a substrate, a movable portion (structural layer) partially fixed to the substrate, and a space portion provided therebetween. A step of forming a temporal layer (referred to as a sacrificial layer) for forming the shape of the space portion, and a step of lastly removing the sacrificial layer, which is referred to as sacrificial layer etching, are required in order to provide the space portion in the microstructure. Since these steps are different from those in manufacturing a general semiconductor element, a semiconductor element included in an electric circuit, and a microstructure are often formed over different substrates through different steps. A micromachine is often manufactured in the following manner: the semiconductor element and the electric circuit are separately formed, and the substrates are attached to each other or the semiconductor element and the electric circuit are put in one package and then connected to each other so as to be integrated.

As well as being an important step in manufacturing a microstructure, the sacrificial layer etching is a rate-controlling point with many problems. First, the most common problem in the sacrificial layer etching is that it requires an extremely long time. For example, it takes, in some cases, several hours to several tens of hours to remove a sacrificial layer with a thickness of 2 to 3 µm. This is because a large volume of sacrificial layer which is thick and large has to be removed by etching to form a space of the microstructure. Further, another reason is that the sacrificial layer etching is conducted using isotropic etching, since the sacrificial layer has a complicate shape of existing below the structural layer.

As the isotropic etching for the sacrificial layer etching, wet etching is employed in many cases. However, the sacrificial layer etching using a liquid has a problem in that at the time of drying after the sacrificial layer etching, a structural layer and a substrate attach to each other by a capillary phenomenon and buckling (also referred to as sticking) of the microstructure is caused.

In addition, there is also a problem in that a portion, of the sacrificial layer existing below the structural layer, which has been etched, and a portion which has not been etched are generated on a substrate surface or between substrates, thereby reducing a yield. Further, there is a problem in that the variation in the size of the space portion of the microstructure formed over the substrate, that is, the distance between the substrate and the structural layer or the like is caused by the sacrificial layer etching. By steps before the sacrificial layer etching, a slight variation of a processing object over the substrate, which does not produce influence by short-time etching, is generated. The variation becomes significant by sacrificial layer etching which requires a long time, thereby greatly influencing the variation in the size of the space portion.

The thickness of the sacrificial layer is limited to a certain range. For example, when the sacrificial layer is too thick, the sacrificial layer etching takes a long time, whereas when the sacrificial layer is too thin, an etching agent does not diffuse and the sacrificial layer etching does not proceed, which causes a problem of the attachment between the structural layer and the substrate. In addition, in many cases, the area where the sacrificial layer is formed is also limited to a certain range. This is for prevention of the attachment and for reduction of time required for the sacrificial layer etching as much as possible.

Since the sacrificial layer etching is conducted for a long time, it may adversely influence another layer which is not removed by the etching. For example, while the sacrificial layer etching is conducted, a problem in that a structural layer or a wiring layer is removed little by little by an etching agent, arises. In order to avoid such problems as much as possible, the lamination relation and the material to be used of a thin film need to be considered carefully. This limits the lamination relation and the material to be used greatly. Further, this also complicates the manufacturing process of a micromachine, and for example, it becomes very difficult to form microstructures having different functions over the same substrate at the same time.

Since the sacrificial layer etching adversely affects another portion, it is very hard to form the microstructure requiring the sacrificial layer etching and another component such as a semiconductor element at the same time over the same substrate. A cause of the yield of the semiconductor element and a cause of the yield of the microstructure are different. In the case of forming them over the same substrate, the yield of the completed article is the product of each yield, and the yield is reduced extremely.

The microstructure is formed from the stack of a plurality of layers, by repetition of film formation and processing of thin films having a certain thickness. In such a process, a thin film formed over a step portion generated by a lower layer has a more nonuniform film thickness compared with that of a flat portion, and a break is likely to be generated from the portion over the step portion, reducing the strength of the microstructure.

In this manner, the manufacture of a microstructure including a step called sacrificial layer etching and the manufacture of a micromachine including the microstructure have many problems.

The present invention is made in order to solve the problem of the long manufacturing time and the problem of the frequent defect generation as described above, which are caused by the step of sacrificial layer etching.

First, a micromachine and a microstructure included in the micromachine are described. The micromachine includes a microstructure having a three-dimensional structure with a selectively-formed space portion and an electric circuit for controlling the microstructure or for detecting the output from the microstructure. The electric circuit includes a semiconductor element. The microstructure includes two electrodes which face each other with the space portion interposed therebetween. One of them is a movable electrode which is partially fixed to a substrate and is movable (also referred to as a first conductive layer in this specification), and the other is a fixed electrode which is fixed to a substrate and is not movable (also referred to as a second conductive layer in this specification). The first conductive layer which is movable may be formed of a single layer, but a movable portion may also be formed of a stack of an insulating layer, a semiconductor layer, or the like over or below the first conductive layer. In this specification, a movable layer formed using a single layer or stacked layers of the first conductive layer or an insulating layer is referred to as a structural layer.

Generally, the space portion included in the microstructure is formed in the following manner: a sacrificial layer is formed first to form the shape of the space and the sacrificial layer is removed lastly. The removal of the sacrificial layer is conducted by etching, and in this specification, the step is referred to as sacrificial layer etching. The space is filled with air.

In the microstructure, the structural layer can move in the space portion in many cases. The movement of the structural layer here includes up-and-down movement (along a direction perpendicular to a substrate surface), lateral movement (along a direction parallel to a substrate surface), and rotation on a certain axis, with one or more points of the structural layer connected to and supported by the substrate.

In order to solve the above-described problems, the present invention is characterized by manufacturing a microstructure without a step of forming a sacrificial layer and a step of sacrificial layer etching. In other words, a first layer is formed over a first substrate, and a second layer is formed over a second substrate. Then, the first layer is separated from the first substrate and attached to the second substrate with a spacer layer interposed therebetween. By the attachment of the first layer and the second layer with the spacer layer interposed therebetween, a space portion can be formed between the second layer formed over the second substrate and the first layer attached thereover, thereby forming a microstructure in which the first layer is movable.

One microstructure according to the present invention is characterized in that a spacer layer and a first layer are included over a surface, the spacer layer is selectively provided between the surface and the first layer, a structural layer includes a portion fixed to the surface by the spacer layer and a portion which faces the surface with a distance therebetween. The spacer layer is provided so as to provide a non-contact portion between the first layer and the surface, making the first layer possible to move while being fixed to the surface.

A microstructure according to the present invention includes a first spacer layer, a first layer, a second spacer layer, and a protective substrate over a surface. The protective substrate is provided to face the surface. The first spacer layer is provided between the surface and a structural layer. The second spacer layer is provided between the structural layer and the protective substrate. The structural layer is fixed to the surface by the first spacer layer, and includes a portion fixed to the protective substrate by the second spacer layer and a portion which faces the surface and the protective substrate with a distance therebetween. The first spacer layer and the second spacer layer fix the first layer so as not to contact the surface, the substrate, another layer, and the like.

In the microstructure according to the present invention, the first layer includes a first region, a second region, and a third region. The first region is fixed to the surface by the first spacer layer which is provided between the surface and the first layer. The second region is separated from the first region and faces the surface with a distance therebetween. The third region functions as a spring and connects the first region to the second region. A space portion is each provided between the surface and the second region and between the surface and the third region, and the second region faces the surface with a distance therebetween. In the case of providing a protective substrate, the first region of the first layer is fixed to the protective substrate by the second spacer layer.

In a microstructure according to the present invention, a second layer which attaches to a part of the surface or the entire surface can be provided. The second layer can be provided as a layer including a conductive layer. In addition, a third layer may be included. The third layer is provided to attach to a part of a surface, which faces the first layer, of the protective substrate, or the entire surface. The third layer can be provided as a layer including a conductive layer.

Further, in a microstructure according to the present invention, a structural layer can be provided between a pair of substrates. One microstructure according to the present invention includes a pair of facing substrates, and a first layer, a first spacer layer, and a second spacer layer which are provided between the pair of facing substrates. In addition, a second layer can be formed between the pair of substrates. Further, a third layer can be formed.

The first spacer layer and the second spacer layer fix the first layer to the pair of substrates so that the first layer does not contact the pair of substrates, or another layer such as the second layer or the third layer. The first spacer layer is selectively provided over one of the substrates, between the one of the substrates and the first layer. The second spacer layer is selectively provided over the other substrate between the other substrate and the first layer. A part of the first layer is movable, and another part thereof is fixed to the one of the substrates by the first spacer layer and fixed to the other substrate by the second spacer layer.

In this specification, the mechanical change means a displacement of the movable portion in the first layer in a direction perpendicular to the substrate surface or a direction parallel to the substrate surface, owing to various external forces such as acceleration, pressure, or electrostatic attraction. The electrical change means the change in electromagnetic physical amount, such as the change in voltage, the change in the current amount, the change in the resistance value, or the change in capacitance.

In accordance with the present invention, a microstructure can be formed without sacrificial layer etching. In other words, since a similar step to the sacrificial layer etching is conducted in the separation and the attachment, the step can be completed in a considerably short time. In addition, the microstructure does not contact a liquid etchant as in wet etching, and accordingly a microstructure can be formed so as not to generate attachment of a structural layer and a substrate by a capillary phenomenon. When applying the present invention in this way, the time required for the manufacture can be reduced and generation of various defects caused by the process called sacrificial layer etching can be reduced.

BRIEF DESCRIPTION OF DRAWINGS

In the accompanying drawings:

FIGS. 2A1 to 2B2 show a manufacturing method of a microstructure of the present invention;

FIGS. 3A1 to 3B2 show a manufacturing method of a microstructure of the present invention;

FIGS. 4A to 4C2 show a manufacturing method of a microstructure of the present invention;

FIGS. 5A to 5D show a manufacturing method of a microstructure of the present invention;

FIGS. 10A1 to 10B2 show a manufacturing method of a microstructure of the present invention;

FIGS. 13A1 to 13B2 show a manufacturing method of a microstructure of the present invention;

FIGS. 17A1 to 17D show a manufacturing method of a microstructure of the present invention;

FIGS. 18A1 to 18B2 show a manufacturing method of a microstructure of the present invention;

FIGS. 20A1 to 20D show a manufacturing method of a microstructure of the present invention;

FIGS. 26A1 to 26B2 show a manufacturing method of a layer including a semiconductor element of the present invention;

FIGS. 34A to 34E show embodiment modes of a semiconductor device of the present invention;

BEST MODE FOR CARRYING OUT THE INVENTION

Embodiment Mode

Figure 1A:
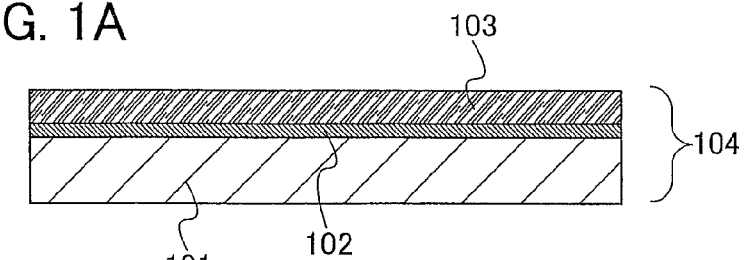
FIGS. 1A to 1E show a manufacturing method of a microstructure of the present invention.

Embodiment modes of the present invention will be described with reference to the drawings. The present invention is not limited to the following description. It is easily understood by those skilled in the art that various changes may be made in forms and details without departing from the spirit and the scope of the invention. Therefore, the present invention should not be limited to the descriptions of the embodiment modes below. In addition, in the description of a structure of the present invention with reference to the drawings, the same reference numerals are commonly given to the same components or components having the same function.

Embodiment Mode 1

In Embodiment Mode 1, a manufacturing method of a microstructure of the present invention will be described.

First, with reference to FIGS. 1A to 1E, a manufacturing method of a microstructure of the present invention and a separation method which is important in carrying out the manufacturing method will be described. Here, the drawings are substrate cross sectional views.

Figure 1B:
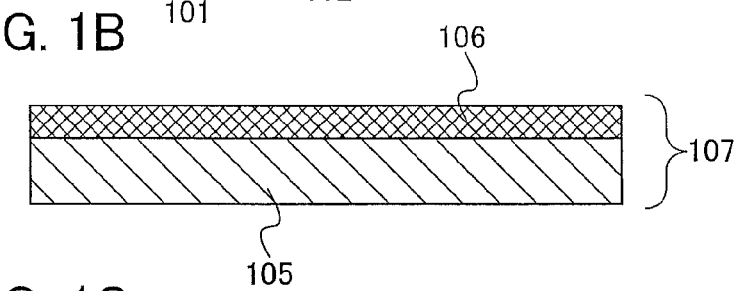

In order to manufacture the microstructure of the present invention, a separation layer 102 and a first layer 103 are formed over a first substrate (also referred to as a first support substrate) 101 first, as shown in FIG. 1A so that a substrate including the first layer 104 is manufactured. Then, as shown in FIG. 1B, a second layer 106 is formed over a second substrate (also referred to as a first protective substrate) 105 to manufacture a substrate including the second layer 107.

Figure 1C:
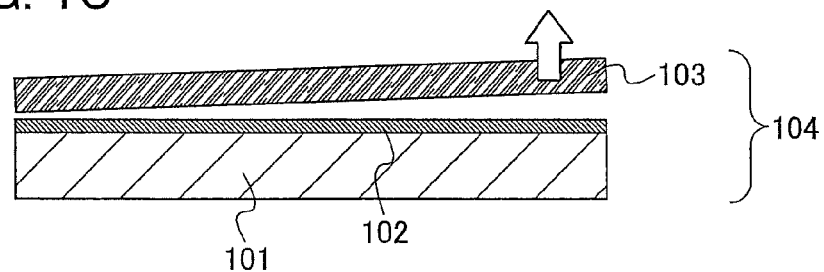
Figure 1D:
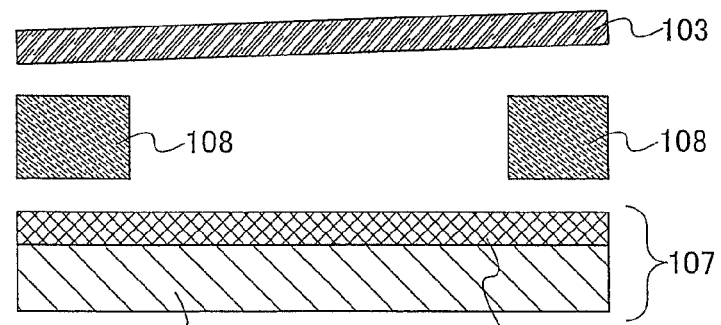

Then, as shown in FIG. 1C, the first layer 103 is separated from the substrate including the first layer 104, using the separation layer 102 as a boundary. As shown in FIG. 1D, the first layer 103 is attached to the substrate including the second layer 107 with a spacer layer 108 interposed therebetween. The spacer layer 108 is selectively formed over the first layer 103 or the second layer 106 here.

Figure 1E:
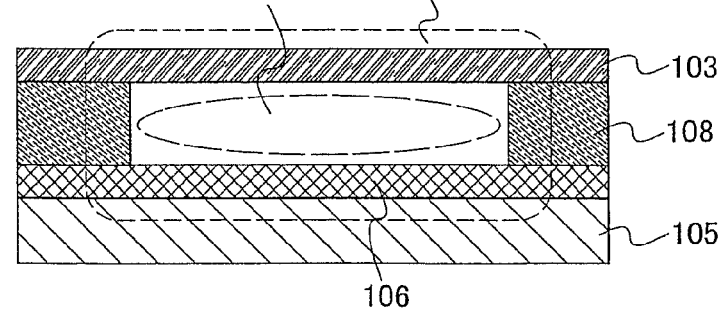

By attachment of the first layer 103 to the substrate including the second layer 107 with the spacer layer 108 interposed therebetween, a space portion 109 is provided between the second layer 106 formed over the second substrate 105 and the first layer 103 attached thereto, as shown in FIG. 1E. In other words, owing to the spacer layer 108, the first layer 103 has a portion which is not in contact with and does not adhere to the second layer 106, making the first layer 103 movable. In this case, a microstructure 110 in which the first layer 103 serves as a layer (=structural layer) which can move in a direction perpendicular to the second substrate 105, can be manufactured.

As the separation layer 102 in which the boundary is formed for separating the first layer 103 from the first substrate 101, a plurality of films stacked with low physical adhesion; a film which is weakened by the change of film quality owing to some sort of treatment such as heating, laser irradiation, or ultraviolet irradiation; or a film which can lower the adhesion of stacked films is employed.

The first substrate 101 and the first layer 103 can be separated from each other at an interface in the film having lowered adhesion. For example, it is known that a metal film which is hard to be oxidized like a noble metal and an oxide film (e.g., an oxide film of silicon) have low adhesion. By using this, a metal film and an oxide film of silicon are stacked over the first substrate 101 as the separation layer 102, and the first layer 103 is formed thereover. Then, at an interface between the metal film and the oxide film of silicon, the first layer 103 can be separated from the first substrate 101.

As a material for the separation layer 102 which is formed over the first substrate 101 and as a method for separating the first layer 103 from the first substrate 101, the followings (1) to (4) can be given as examples.

(1) As the separation layer 102, a single layer or stacked layers of a metal oxide film is provided over the first substrate 101. Then, the metal oxide film as the separation layer 102 is weakened by heating, laser irradiation, or the like, and separation of the first substrate 101 and the first layer 103 is conducted. In the case of using a light-transmitting substrate such as a glass substrate or a quartz substrate as the first substrate 101, laser irradiation can be conducted from a rear surface of the substrate. It is considered that the metal oxide film is weakened by heating or laser irradiation because the metal oxide film is crystallized.

(2) An amorphous silicon film containing hydrogen is provided over the first substrate 101, as the separation layer 102. Then, the separation layer 102 is weakened by heating or laser irradiation, or the separation layer 102 is removed by etching. Accordingly, separation of the first substrate 101 and the first layer 103 is conducted.

(3) Without the provision of the separation layer 102, the first layer 103 is provided over the first substrate 101. The first substrate 101 is thinned or removed by polishment of the first substrate 101 from the rear surface, or the first substrate 101 is removed by etching so that the first layer 103 is obtained. In the case of using a quartz substrate as the first substrate 101 for example, the first substrate 101 can be removed by etching which uses an HF solution, an HF vapor, $CHF_3$, a mixed gas of $H_2$ and $C_4H_8$, or the like. Further, in the case of using a silicon substrate as the first substrate 101, the substrate can be removed by etching using a halogen fluoride gas such as $NF_3$, $BrF_3$, or $ClF_3$.

(4) A metal and a metal oxide film are stacked as the separation layer 102, over the first substrate 101. Then, the metal oxide film is weakened by heating, laser irradiation, or the like; a part of the separation layer 102 is removed by etching; and physical separation is conducted at an interface between the weakened metal oxide film and the metal. In the case of forming the separation layer 102 with the use of a metal such as tungsten or molybdenum for example, etching of the separation layer 102 can be conducted by using a solution such as an ammonia peroxide solution, or a combination of $O_2$ and a chlorine-based gas typified by $CCl_4$ or a fluorine-based gas typified by $CF_4$, $SF_6$, or $NF_3$. Alternatively, in the case of forming the separation layer 102 using a metal such as aluminum or titanium, an acid solution or a $Cl_2$ gas can be used.

Here, the physical separation can be conducted without the step of weakening the metal oxide film or the etching step of the separation layer 102. The physical separation method can be conducted in such a way that an end portion of the first substrate 101 is cut to form a trigger for the separation between the first substrate 101 and the first layer 103 and the separation of the first layer 103 starting from the end portion can be conducted.

By the above-described process, the microstructure 110 can be manufactured without a step called sacrificial layer etching. When external force is applied to the thus formed microstructure 110, the structural layer can move in a direction in which the force is applied, and therefore, the microstructure 110 can function as a sensor by sensing the movement.

When using the manufacturing method of the microstructure of the present invention described in this embodiment mode, the microstructure 110 can be manufactured without sacrificial layer etching. Therefore, the problems caused by the sacrificial layer etching, as described in Disclosure of Invention can be avoided. The present invention causes the following useful effects (a) to (e).

(a) By employing the present invention, typically, a microstructure can be manufactured without conducting sacrificial layer etching. That is, since a similar step to the sacrificial layer etching is conducted in the separation and the attachment, the step can be completed in a considerably short time.

(b) When separation and attachment are substituted for the sacrificial layer etching in this way, the microstructure 110 can be manufactured so as not to generate attachment of the structural layer and the substrate by a capillary phenomenon because the microstructure does not contact a liquid etchant as in wet etching.

(c) Since the microstructure 110 is manufactured by separation and attachment, the microstructure 110 can be manufactured without a problem that a sacrificial layer or a by-product of etching remains in the space portion 109. In other words, a problem that when sacrificial layer etching is completed in a substrate or a part of a substrate, sacrificial layer etching is not completed in another substrate or another part of the substrate, can be avoided. Further, in the method of the present invention, since the first layer 103 separated from the first substrate 101 is attached to the second substrate 105 including the second layer 106, space portions 109 of all the microstructures 110 manufactured over the substrate can be formed uniformly.

(d) Since variation in an etching rate in a surface of the substrate owing to sacrificial layer etching for a long time is not caused, a microstructure and a micromachine can be manufactured with the use of a large substrate. When using a large substrate as in this case, many products can be manufactured at once and cost of the products can be reduced.

(e) Since a step of sacrificial layer etching requiring a long time is not necessary, an adverse influence is not caused on another layer. For example, a film reduction of the structural layer is not caused by the sacrificial layer etching; accordingly, the structural layer can be formed with a uniform thickness. Further, in the case where the separation layer etching is conducted, even when a material on which an influence by the etching is worried is used, the influence can be avoided by the formation of the material over the second substrate 105 to which the sacrificial layer etching is not conducted.

Embodiment Mode 2

Embodiment Mode 2 will concretely describe a manufacturing method of the microstructure described in Embodiment Mode 1, with reference to FIGS. 2A1 to 4C2. Note that the drawings on the right side are top views of substrates and the drawings on the left side are cross sectional views taken along a dashed line O-P of the top views.

First, a processing method of one substrate having a first layer will be described with reference to FIGS. 2A1 and 2B2.

As shown in FIGS. 2A1 and 2A2, a separation layer 202 is formed over a first substrate (also referred to as a first support substrate) 201. Here, various substrates such as a substrate having an insulating property, for example, of glass, quartz, or plastic, or a substrate having a conductive property such as metal, as well as a substrate having a semiconductor property such as a silicon substrate can be used for the first substrate 201.

The separation layer 202 is formed by a CVD method, a sputtering method, or the like using an element such as metal or silicon or a compound as described in the above examples (1) to (4). The separation layer 202 may be formed over an entire surface of the first substrate 201, or can be formed selectively over a part of the substrate. In the case where the separation layer 202 is formed selectively over a part of the substrate, a resist mask is formed by photolithography over the separation layer 202 and processing can be conducted by etching.

Next, as shown in FIGS. 2A1 and 2A2, a first layer 203 to be a structural layer is formed over the separation layer 202. The first layer 203 can be formed using various materials such as silicon, a compound thereof, a metal element, or a compound thereof, by a film formation method such as a CVD method or a sputtering method. Here, the first layer 203 may have a single layer structure with a single material, or can have a lamination structure with a plurality of materials. In the case of forming the first layer 203 with a lamination structure, although a plurality of layers can be formed continuously, the first layer 203 can also be formed by repetition of film formation and processing.

In this embodiment mode, an example where the first layer 203 has a lamination structure in which two kinds of films are formed continuously is described as shown in FIGS. 2A1 and 2A2. The structure of the first layer 203 is not limited to this example and may have an electrode or a mass (a weight) which is formed by film formation using metal or a dense material and processing.

Then, the first layer 203 is processed so that the shape of a structural layer is determined, as shown in FIGS. 2B1 and 2B2. In processing the first layer 203, a resist mask is formed over the first layer 203 by photolithography and etching is conducted, so that openings 204 can be formed in the first layer 203 as shown in FIGS. 2B1 and 2B2. As the etching for forming the openings 204 in the first layer 203, wet etching or dry etching can be employed depending on the material included in the first layer 203, or a combination thereof can also be used.

As shown in FIGS. 2B1 and 2B2, in the processing of the first layer 203, not only the first layer 203 but also the separation layer 202 can be processed. However, the processing can be conducted so as to form the openings 204 only in the first layer 203.

Through the above-described process, a substrate including the first layer 205 can be formed.

Next, processing of a substrate including a second layer will be described with reference to FIGS. 3A1 to 3B2. As shown in FIGS. 3A1 and 3A2, a second layer 207 is formed over a second substrate (also referred to as a first protective substrate) 206. Various substrates such as a substrate having a semiconductor property, a substrate having an insulating property, or a substrate having a conductive property can be used for the second substrate 206, similarly to the first substrate 201.

Similarly to the first layer 203, the second layer 207 can be formed using various materials such as silicon, a compound thereof, a metal element, or a compound thereof, by a film formation method such as a CVD method or a sputtering method. The second layer 207 can have a single layer structure or a lamination structure, similarly to the first layer 203. In the case of forming the second layer 207 with a lamination structure, although a plurality of layers can be formed continuously, the second layer 207 can also be formed by repetition of film formation and processing. For example, in the case where the second substrate 206 is a substrate having a special function, without the formation of the second layer 207, the next step can be carried out.

In this embodiment mode, an example where the second layer 207 has a lamination structure in which two kinds of films are formed continuously is described as shown in FIGS. 3A1 and 3A2. However, the structure of the second layer 207 is not limited to this example and can have an electrode, a wiring, or the like which is formed by film formation of a metal film or the like and processing.

Then, as shown in FIGS. 3B1 and 3B2, a spacer layer 208 is formed over the second layer 207. The spacer layer 208 is a layer for attaching the substrate including the first layer 205 to the second substrate 206 over which the second layer 207 is formed, with a space kept therebetween. Therefore, the spacer layer is also referred to as an attachment layer in this specification. The spacer 208 can have a single layer structure or a lamination structure using an insulating inorganic compound, an insulating organic compound, or the like. Further, a thick film permanent resist which mainly contains an organic compound such as polyimide or epoxy can also be used.

The spacer layer 208 is selectively formed over the second layer 207. Accordingly, if a photosensitive material such as a thick film resist is used, the spacer layer 208 can be formed easily only by film formation, exposure to light, and development. Even in the case of using a material which is not photosensitive, a resist mask is formed by photolithography after film formation and processing is conducted by etching so that the spacer layer 208 can be formed. Further, the spacer layer 208 can also be formed by a screen printing method, a droplet discharging method typified by an ink-jet method, or the like.

In this embodiment mode, the example of forming the spacer layer 208 over the second layer 207 has been described; however, the spacer layer 208 can be formed over the substrate including the first layer 205, as well.

Through the above-described process, a substrate including the second layer 209 can be formed.

Next, an example of a manufacturing method of a microstructure using the substrate including the first layer 205 and the substrate including the second layer 209 will be described with reference to FIGS. 4A to 4C2.

As show in FIG. 4A, the substrate including the first layer 205 and the substrate including the second layer 209 which are formed in the above-described process are attached with the spacer layer 208 interposed therebetween so that the first layer 203 and the second layer 207 face to each other. In order to attach these substrates, the spacer layer 208 has adhesiveness. Owing to the spacer layer 208, the first layer 203 is fixed to the second substrate 206 without contact with the second layer 207.

Then, as shown in FIG. 4B, the first substrate 201 is separated at an interface of the separation layer 202 (a part shown by an arrow in FIG. 4B) and removed. The methods mentioned in the above-described examples (1) to (4) can be used as the method for separating the first layer 203 from the first substrate 201. Here, the separation layer 202 may remain over the first layer 203. Further, a step for removing the remaining separation layer 202 may be added. The separated first substrate 201 can be used repeatedly.

When the first substrate 201 is separated in the above-described process, the second layer 207, the spacer layer 208 and the first layer 203 can be stacked over the second substrate 206 without sacrificial layer etching. Consequently, a microstructure in which a space portion is included between the second substrate 206 and the first layer 203 and the first layer 203 serves as a movable layer (structural layer), can be formed as shown in FIGS. 4C1 and 4C2.

In the formed microstructure, the first layer 203 serves as a structural layer (also referred to as a movable layer or a movable electrode), and the second layer 207 serves as a fixed layer (also referred to as a fixed electrode) fixed over the second substrate 206. The structural layer (the first layer 203) is fixed to the second substrate 206 with the spacer layer 208 and the second layer 207 interposed therebetween. The structural layer can move in directions perpendicular to the substrate, directions parallel to the substrate, or directions having a certain angle with respect to the substrate by combining the perpendicular direction and the parallel direction. The first layer 203 includes a portion having a shape of a plurality of S shapes connected in a movable portion. The portion connects the movable portion of the first layer 203 to a portion, of the first layer 203, which is fixed by the spacer layer 208.

Figure 38A:
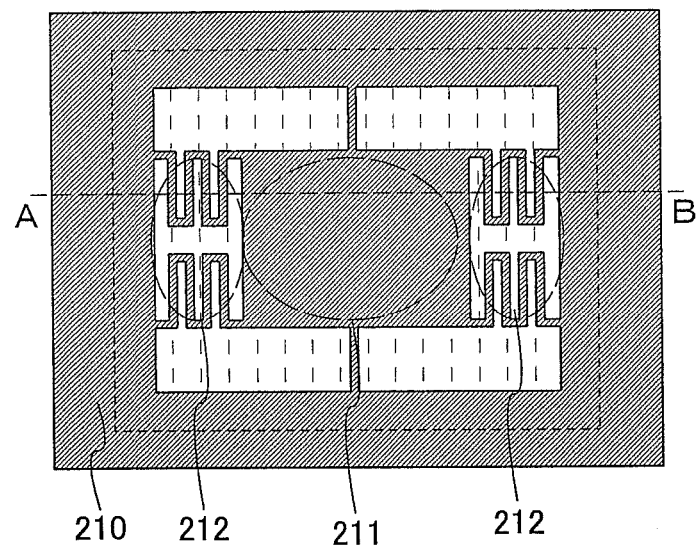
FIGS. 38A and 38B show a manufacturing method of a microstructure of the present invention.
Figure 38B:
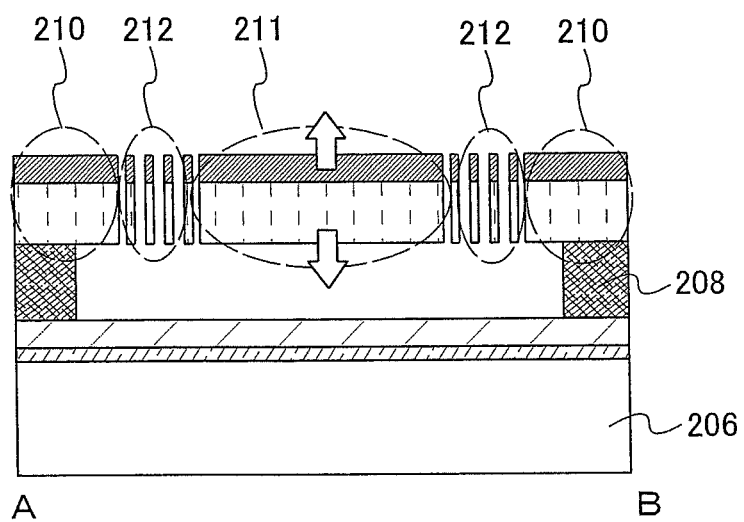

In other words, as shown in FIGS. 38A and 38B, the structural layer (first layer 203) includes a first region 210 fixed to the substrate, a movable second region 211 and a third region 212 functioning as a spring. The spacer layer 208 is provided between the first region of the structural layer and the second substrate 206, and the first region 210 is fixed to the second substrate 206 by the spacer layer 208. A space portion is provided between a surface of the substrate including the second layer 209 and the second region 211 and the third region 212, and the second region 211 faces the surface of the substrate including the second layer 209 with a distance therebetween. The second region 211 is separated from the first region 210, faces the second substrate 206 with a distance therebetween, and serves as a movable portion. The third region 212 connects the fixed first region 210 to the movable second region 211. The third region 212 is processed into a bent serpentine shape, that is a shape of a plurality of S shapes connected. By this processing, the third region 212 can function as a spring.

The distance between the substrate including the second layer 209 and the first layer 203 is determined by the thickness of the spacer layer 208. Further, the distance between the movable portion of the first layer 203 and the portion fixed by the spacer layer 208 is determined by processing of the first layer 203, which is described with reference to FIGS. 2B1 and 2B2. Accordingly, the size of the space portion formed between the second substrate 206 and the first layer 203 and the size of the opening formed in the first layer 203 can be adjusted optionally by the thickness of the spacer layer 208 and the processing of the first layer 203.

The manufacturing method of the microstructure described in this embodiment mode has been described using a simple example; however, the first layer 203, the second layer 207 and the spacer layer 208 can each have a lamination structure or can each be processed into an arbitrary shape, so that the microstructure can have various functions.

When external force is applied to the microstructure manufactured in such a manner, the structural layer can move in a direction in which the force is applied, and therefore, the microstructure can function as a sensor by sensing the movement. Alternatively, opposing electrodes can be formed in the first layer 203 and the second layer 207 so that the structural layer moves by electrostatic attraction. Accordingly, the microstructure can function as an actuator. Further, by utilizing this actuator, a switch, a capacitor having variable capacitance, or the like can be manufactured.

When using the manufacturing method of the microstructure of the present invention described in this embodiment, the microstructure can be manufactured without sacrificial layer etching. Therefore, the problems caused by the sacrificial layer etching as described in Disclosure of Invention can be avoided. That is, the same effects (a) to (e) as those in Embodiment Mode 1 can be obtained.

Further, according to this embodiment mode, the following effects (f) to (i) can be obtained.

(f) In the method of the present invention, the distance of the space portion between the substrate and the first layer is determined by the thickness of the spacer layer, and the distance of the space between the portion fixed to the substrate and the movable portion in the first layer can be determined by the first etching. Accordingly, the size of the space portion included in the microstructure can be set optionally without limitation by the thickness or area of the sacrificial layer owing to sacrificial layer etching.

(g) Since the microstructure is manufactured by separation and attachment in the present invention, a microstructure with an arbitrary size can be manufactured without limitation on size. For example, a large microstructure which is several mm square to several tens of mm square can also be manufactured.

(h) In the present invention, since a microstructure is manufactured by attachment of two layers, the first layer and the second layer, as described above, the degree of freedom for materials to be used and the structure is heightened. Specifically, since the shape of the structural layer is determined by the processing of the first layer by first etching shown in FIGS. 2B1 and 2B2, a microstructure with high degree of freedom for shape can be manufactured. In addition, since sacrificial layer etching need not be considered, variation in the lamination is widened and microstructures having different functions can be concurrently manufactured with ease. For example, a sensor and a passive element can be concurrently formed.

(i) In addition, in the present invention, since a sacrificial layer is not formed and further a first layer and a second layer are separately formed and attached to each other, a step portion caused by a thick film such as a sacrificial layer is not generated, and a break generated from a portion which crosses the step is not generated. Therefore, a microstructure with high strength can be manufactured.

This embodiment mode can be implemented by being freely combined with any of other embodiment modes.

Embodiment Mode 3

In Embodiment Mode 3, an example for manufacturing a microstructure, which employs the method described in Embodiment Mode 1, will be described with reference to FIGS. 5A to 9C. Here, the drawings are cross sectional views.

As shown in FIG. 5A, a first separation layer 302 and a first layer 303 are formed over a first substrate (also referred to as a first support substrate) 301 to form a substrate including the first layer 304. As shown in FIG. 5B, the first layer 303 is separated from the substrate including the first layer 304 at an interface of the first separation layer 302.

Next, a first spacer layer 306 is selectively formed over a second substrate 305, and a second spacer layer 308 is selectively formed over a third substrate 307. The second substrate 305 including the first spacer layer 306 and the third substrate 307 including the second spacer layer 308 are attached to each other so as to interpose the first layer 303 therebetween (FIG. 5C).

Thus, the second substrate 305 and the third substrate 307 are attached so as to interpose the first layer 303 through the first spacer layer 306 and the second spacer layer 308. Accordingly, space portions 309 are formed between the second substrate 305 and the first layer 303 and between the third substrate 307 and the first layer 303. In this way, a microstructure 310, which is sealed by the second substrate 305 and the third substrate 307 and in which the first layer 303 serves as a movable layer (=structural layer), can be manufactured (FIG. 5D).

Here, since a thin film is formed over the first substrate 301, the first substrate 301 is preferably a substrate which can resist film formation with a high temperature or processing using an etchant, for example, a substrate of glass, quartz, metal, semiconductor, or the like. A substrate formed using an organic resin material such as plastic can also be used as long as the substrate satisfies film formation conditions or processing conditions. Further, since the second substrate (also referred to as a first protective substrate) 305 and the third substrate (also referred to as a second protective substrate) 307 have a function as a package, which protects the first layer 303 with a space portion interposed therebetween, a thin, soft, and inexpensive substrate, for example a substrate such as a plastic film can be used. Similarly to the first substrate 301, a substrate of glass, quartz, or the like can also be used.

The methods described in Embodiment Modes 1 and 2 can be applied to a material and formation method of the first separation layer 302 which is formed over the first substrate 301, and a method of separating the first layer 303 from the substrate including the first layer 304.

For the first layer 303, a material capable of foaming a layer which shows a function due to being able to move, is selected and processed. For example, a material having a film characteristic, such as an electric resistance, varied by distortion due to being able to move is used, and the material can be processed so as to have a larger distortion by the movement.

An insulating inorganic compound, an insulating organic compound, or the like is used for the first spacer layer 306 and the second spacer layer 308, similarly to the spacer layer of Embodiment Mode 2, and a single layer structure or a lamination structure can be employed. Alternatively, a thick film permanent resist which mainly contains acrylic, epoxy, polyimide, or the like can be used.

Through the above-described process, a microstructure 310 which functions by movement of the first layer 303 in the space portions 309 can be manufactured. For example, the first layer (structural layer) 303 can be formed so as to have an electric resistance varied by a distortion and, accordingly, a microstructure 310 which electrically detects the movement of the structural layer due to external force such as acceleration and pressure and functions as a sensor, can be manufactured.

Figure 6A:
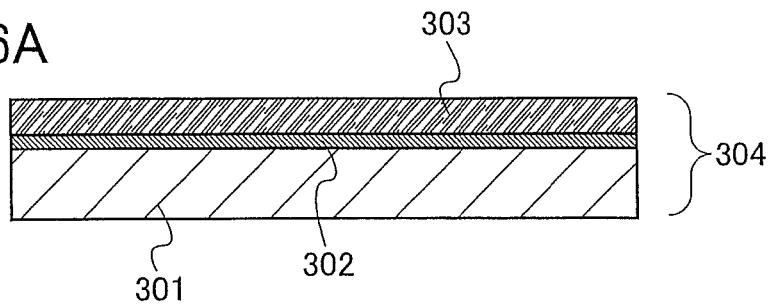
FIGS. 6A to 6E show a manufacturing method of a microstructure of the present invention.
Figure 6B:
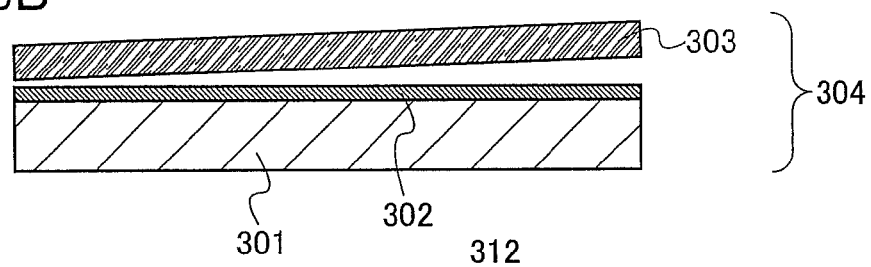

The other manufacturing example of a microstructure, to which the manufacturing example of FIGS. 5A to 5D is applied, will be described with reference to FIGS. 6A to 6E. As shown in FIG. 6A, the first separation layer 302 and the first layer 303 are formed over the first substrate 301, to form the substrate including the first layer 304. As shown in FIG. 6B, the first layer 303 is separated from the substrate including the first layer 304 at an interface of the first separation layer 302.

Figure 6C:
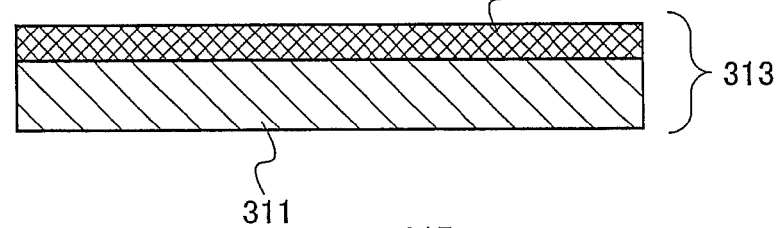
Figure 6D:
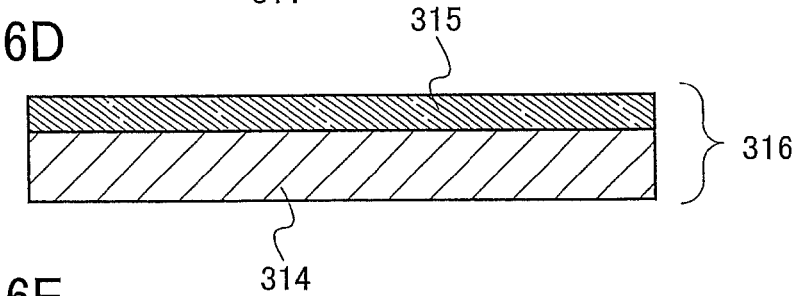

Then, as shown in FIG. 6C, a second layer 312 is formed over a second substrate 311 to form a substrate including the second layer 313. Similarly, as shown in FIG. 6D, a third layer 315 is formed over a third substrate 314 to form a substrate including the third layer 316.

Then, a first spacer layer 317 is selectively formed over the substrate including the second layer 313, and a second spacer layer 318 is selectively formed over the substrate including the third layer 316. The substrate including the second layer 313 which includes the first spacer layer 317 is attached to the substrate including the third layer 316 which includes the second spacer layer 318, so that the second layer 312 and the third layer 315 face each other and the first layer 303 is interposed therebetween.

Thus, the substrate including the second layer 313 and the substrate including the third layer 316 are attached so that the first layer 303 is interposed through the first spacer layer 317 and the second spacer layer 318 and the second layer 312 and the third layer 315 face each other. Accordingly, space portions 319 are provided between the second layer 312 and the first layer 303 and between the third layer 315 and the first layer 303. In this way, a microstructure 320, which is sealed by the second substrate 311 and the third substrate 314 and in which the first layer 303 serves as a movable layer (=structural layer), can be manufactured.

Here, since a thin film is formed over the second substrate 311 and the third substrate 314, each of the second substrate 311 and the third substrate 314 is preferably a substrate which can resist film formation with a high temperature or processing using an etchant, for example, a substrate of glass, quartz, metal, semiconductor, or the like. A substrate formed using an organic resin material such as plastic can also be used as long as the substrate satisfies film formation conditions or processing conditions. Particularly when a thin and light-weight substrate is applied to the second substrate 311 and the third substrate 314, a small microstructure can be manufactured.

Figure 6E:
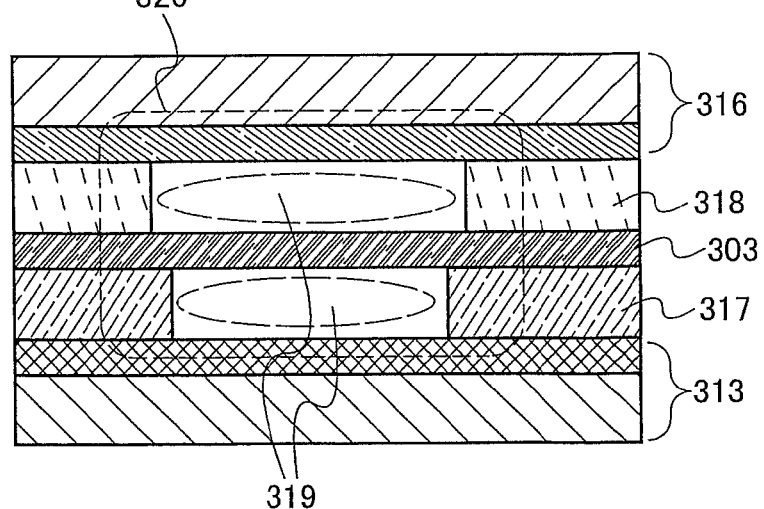

For the first layer 303, the second layer 312, and the third layer 315, materials capable of forming layers which show a function due to facing one another through the space portions 319 as shown in FIG. 6E, are selected and processed. For example, when at least two layers of the first layer 303, the second layer 312, and the third layer 315 are formed using conductive materials, the two faced conductive layers can serve as a capacitor.

Through the above-described process, the microstructure 320 which functions by cooperation of the first layer 303, the second layer 312, and the third layer 315 due to movement of the first layer 303 in the space portions can be manufactured. For example, in the case where the first layer 303, the second layer 312, and the third layer 315 are formed using conductive materials and when the structural layer moves by reception of external force such as acceleration and pressure, the distance between the second layer 312 and the first layer 303 and the distance between the third layer 315 and the first layer 303 are each varied. Accordingly, a microstructure 320 which detects the variation of the distances as a variation of a capacitance and functions as a sensor, can be manufactured.

Further, in the microstructure 320 thus manufactured, the first layer 303 can be electromagnetically separated from the outside. For example, the first layer 303 is formed as a waveguide transmitting a signal with a high frequency, and the second layer 312 and the third layer 315 are set at a grounding potential (ground potential); accordingly, a transmission line with low loss can be formed. In this case, the first layer 303 need not move.

Figure 7A:
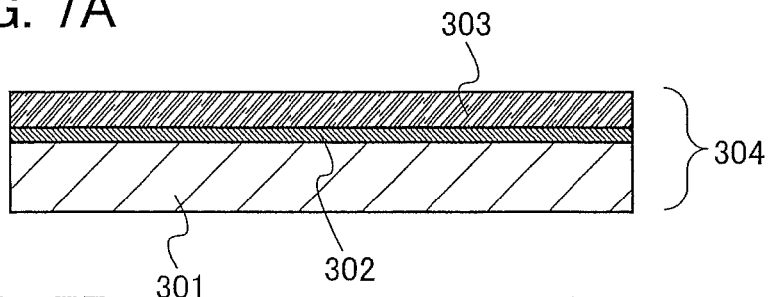
FIGS. 7A to 7E show a manufacturing method of a microstructure of the present invention.
Figure 7B:
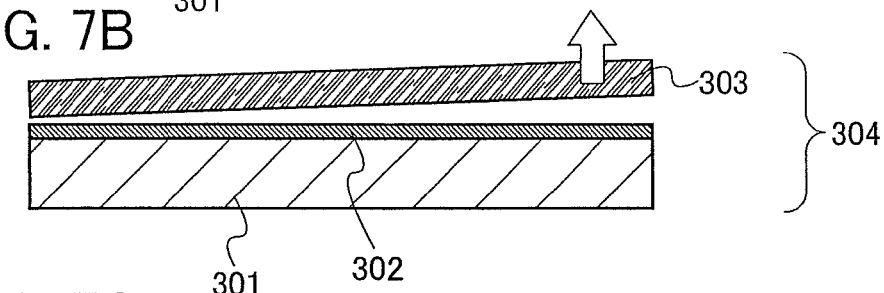

Further, another manufacturing example of a microstructure, to which the manufacturing example of FIGS. 5A to 5D is applied, will be described with reference to FIGS. 7A to 7E. In the microstructure of the present invention, as shown in FIG. 7A, the first separation layer 302 and the first layer 303 are formed over the first substrate 301, to form the substrate including the first layer 304. As shown in FIG. 7B, the first layer 303 is separated from the substrate including the first layer 304 at an interface of the first separation layer 302.

Figure 7C:
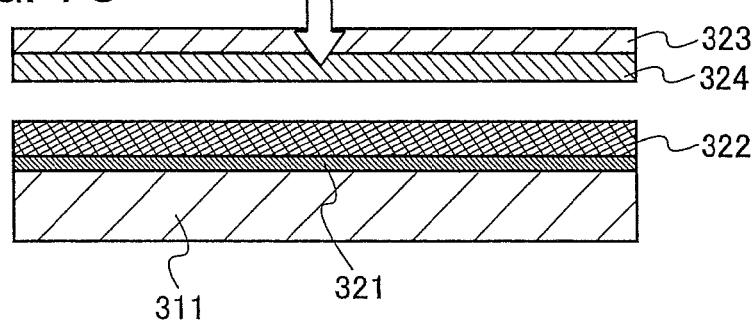

Next, as shown in FIG. 7C, a second separation layer 321 is formed over the second substrate 311, and a second layer 322 is formed over the second separation layer 321. A first protective substrate 323 is attached to an upper surface of the second layer 322 with an adhesive 324.

Figure 7D:
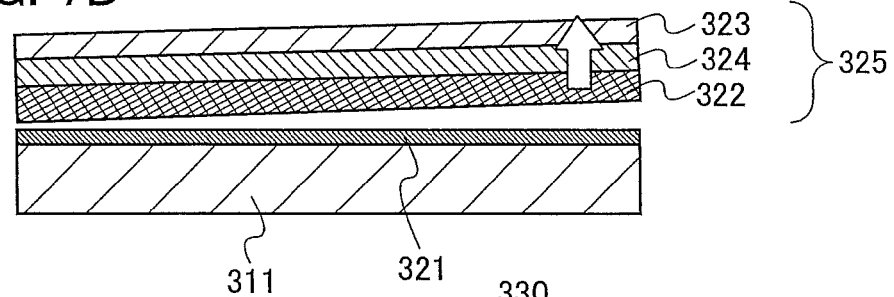

The second layer 322 is separated from the second substrate 311 at an interface of the second separation layer 321, and displaced to the first protective substrate 323 side, so that a substrate including the second layer 325 is formed (FIG. 7D).

Then, a first spacer layer 326 is selectively formed over the substrate including the second layer 325, and a second spacer layer 327 is selectively formed over a third substrate (also referred to as a second protective substrate) 328. The substrate including the second layer 325 and the third substrate 328 are attached to each other so as to interpose the first layer 303 therebetween (FIG. 7E).

Thus, the substrate including the second layer 325 and one surface of the first layer 303 are attached with the first spacer layer 326 interposed therebetween, and the third substrate 328 and the other surface of the first layer 303 are attached with the second spacer layer 327 interposed therebetween, thereby forming space portions 329 between the second layer 322 and the first layer 303 and between the third substrate 328 and the first layer 303. In this way, a microstructure 330, which is sealed by the first protective substrate 323 and the third substrate 328 and in which the first layer 303 serves as a movable layer (=structural layer), can be manufactured.

Here, since the first protective substrate 323 and the third substrate 328 have a function as a package which protects the first layer 303 with a space portion 329 interposed therebetween, a thin, soft, and inexpensive substrate, for example a substrate such as a plastic film can be used as each of the first protective substrate 323 and the third substrate 328. Similarly to the first substrate 301, a substrate of glass, quartz, or the like can also be used.

Figure 7E:
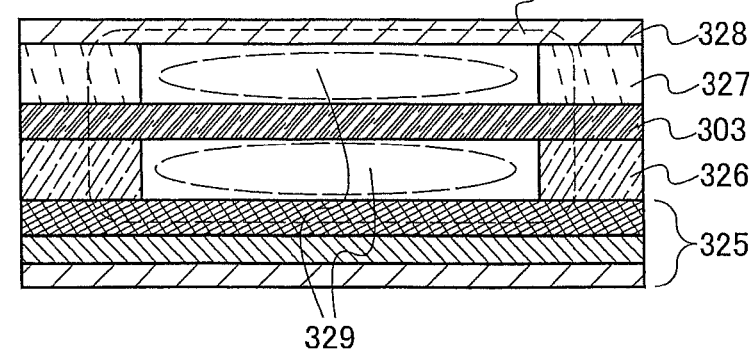

For the first layer 303 and the second layer 322, materials which show a function due to facing each other through the space 329 as shown in FIG. 7E, are selected and processed. For example, when the first layer 303 and the second layer 322 are formed using conductive materials, the two faced conductive layers can serve as a capacitor.

The second separation layer 321, the first spacer layer 326, and the second spacer layer 327 can be formed similarly to the above-described examples, and the methods described in Embodiment Modes 1 and 2 can be applied to a method of separating the first layer 303 from the substrate including the first layer 304.

Figure 8A:
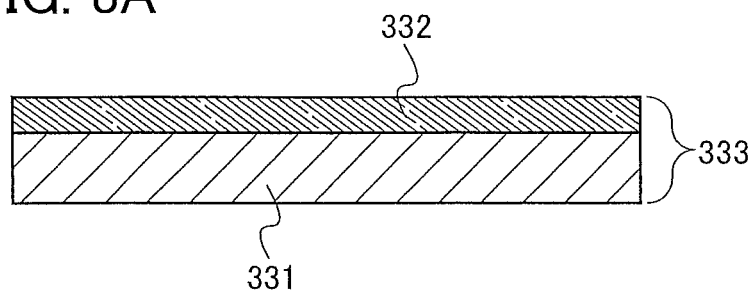
FIGS. 8A and 8B show a manufacturing method of a microstructure of the present invention.

Further, an example into which the manufacturing example shown in FIGS. 7A to 7E is transformed, will be described with reference to FIGS. 8A and 8B. As shown in FIG. 8A, a third layer 332 is formed over a third substrate 331 to form a substrate including the third layer 333.

Then, the substrate including the third layer 333 is used instead of using the third substrate 328 shown in FIG. 7E, and the second spacer layer 327 is selectively provided over this substrate including the third layer 333.

The substrate including the second layer 325 is attached to the one surface of the first layer 303 with the first spacer layer 326 interposed therebetween, and the substrate including the third layer 333 and the other surface of the first layer 303 are attached with the second spacer layer 327 interposed therebetween, so that the third layer 332 and the first layer 303 face each other. Accordingly, space portions 334 are provided between the second layer 322 and the first layer 303 and between the third layer 332 and the first layer 303. In this way, a microstructure 335, which is sealed by the first protective substrate 323 and the third substrate 331 and in which the first layer 303 serves as a movable layer (=structural layer), can be formed. Other steps, materials, and components can be similar to those in FIGS. 5A to 7E.

Figure 8B:
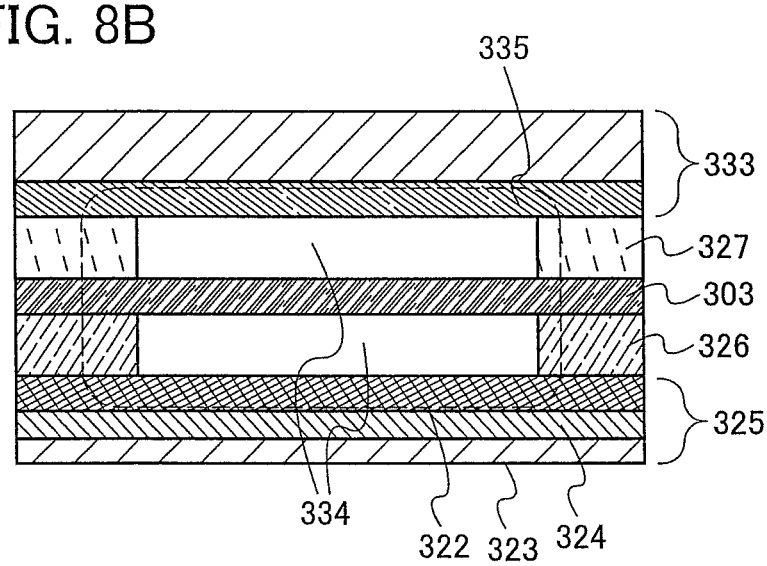

For the first layer 303, the second layer 322 and the third layer 332, materials which show a function due to facing one another through the space portions 334 as shown in FIG. 8B, are selected and processed. For example, when at least two layers of the first layer 303, the second layer 322 and the third layer 332 are formed using conductive materials, the two faced conductive layers can serve as a capacitor.

Figure 9A:
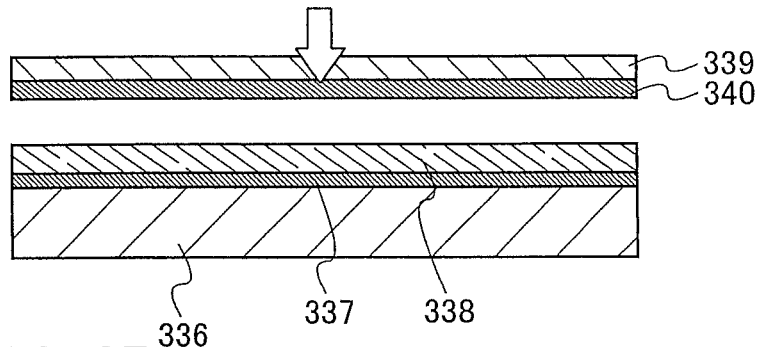
FIGS. 9A to 9C show a manufacturing method of a microstructure of the present invention.

Further, an example into which the manufacturing example of FIGS. 7A to 7E is transformed, will be described with reference to FIGS. 9A to 9C. As shown in FIG. 9A, a third separation layer 337 and a third layer 338 are formed over a third substrate 336, and a second protective substrate 339 is attached to an upper surface of the third layer 338 with an adhesive 340.

Figure 9B:
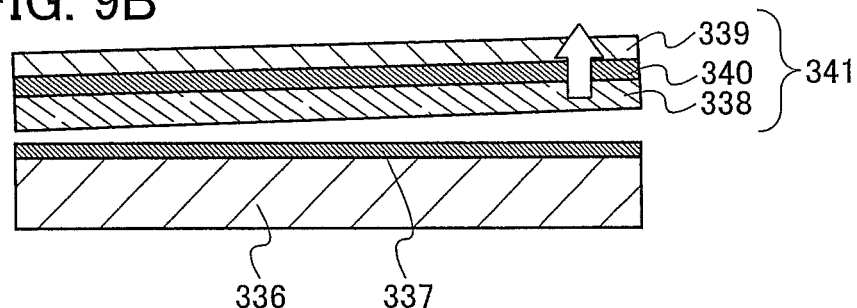

As shown in FIG. 9B, the third layer 338 is separated from the third substrate 336 at an interface of the third separation layer 337 and displaced to the second protective substrate 339 side, so that a substrate including the third layer 341 is formed.

A second spacer layer 343 is selectively formed over the substrate including the third layer 341. The substrate including the second layer 325 and the substrate including the third layer 341 which includes the second spacer layer 343 are attached so as to face each other and to interpose the first layer 303 therebetween (FIG. 9C).

The substrate including the second layer 325 is attached to the one surface of the first layer 303 with the first spacer layer 342 interposed therebetween, and the substrate including the third layer 341 and the other surface of the first layer 303 are attached with the second spacer layer 343 interposed therebetween, so that the third layer 338 and the first layer 303 face each other. Accordingly, space portions 344 are provided between the second layer 322 and the first layer 303 and between the third layer 338 and the first layer 303. In this way, a microstructure 345, which is sealed by the first protective substrate 323 and the second protective substrate 339 and in which the first layer 303 serves as a movable layer (=structural layer), can be formed. Other steps, materials, and components can be similar to those in FIGS. 5A to 7E.

Figure 9C:
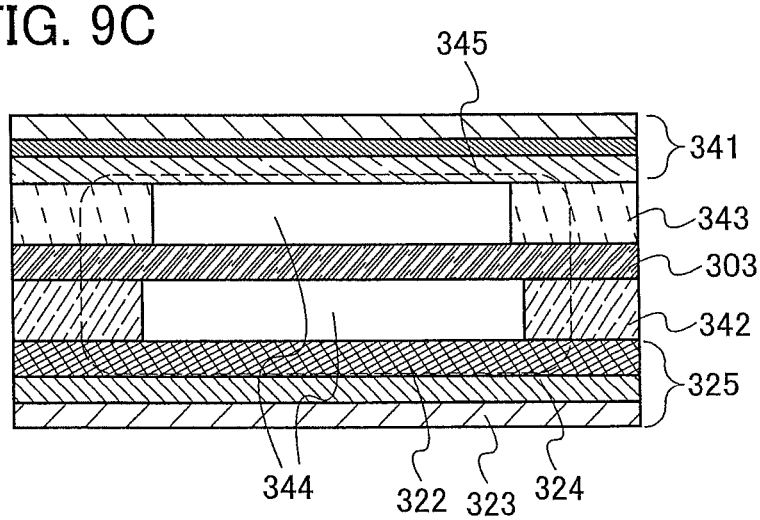

For the first layer 303, the second layer 322 and the third layer 338, materials which show a function due to facing one another through the space portions 344 as shown in FIG. 9C, are selected and processed. For example, when at least two layers of the first layer 303, the second layer 322 and the third layer 338 are formed using conductive materials, the two faced conductive layers can serve as a capacitor.

Through the above-described process, the microstructure 345 which functions by cooperation of the first layer 303, the second layer 322, and the third layer 338 due to movement of the first layer 303 in the space portions, can be manufactured. For example, in the case where the first layer 303, the second layer 322, and the third layer 338 are formed using conductive materials and when the structural layer moves by reception of external force such as acceleration and pressure, the distance between the second layer 322 and the first layer 303 and the distance between the third layer 338 and the first layer 303 are each varied. Accordingly, a microstructure 345 which detects the variation of the distances as a variation of a capacitance and functions as a sensor, can be manufactured.

Further, in the microstructure 345 thus manufactured, the first layer 303 can be electromagnetically separated from the outside. For example, the first layer 303 is formed as a waveguide transmitting a signal with a high frequency, and the second layer 322 and the third layer 332 are set at a grounding potential (ground potential); accordingly, a transmission line with low loss can be formed. In this case, the first layer 303 need not move.

When the manufacturing method of the microstructure of the present invention is used, similarly to Embodiment Modes 1 and 2, the following effects can be obtained.

(a) A microstructure can be manufactured without sacrificial layer etching. That is, since a similar step to the sacrificial layer etching is conducted in the separation and the attachment, the step can be completed in a considerably short time.

(b) When separation and attachment are substituted for the sacrificial layer etching, a microstructure can be manufactured so as not to generate attachment of the structural layer and the substrate by a capillary phenomenon because the microstructure does not contact a liquid etchant as in wet etching.

(e) Since a step of sacrificial layer etching requiring a long time is not necessary in the present invention, an adverse influence is not caused on another layer. For example, in the sacrificial layer etching, a film reduction of the structural layer is not caused; accordingly, the structural layer can be formed with a uniform thickness. Further, in the case where the separation layer etching is conducted, even when a material on which an influence by the etching is worried is used, the influence can be avoided by the formation of the material over the second substrate or the third substrate to which the sacrificial layer etching is not conducted.

(f) In the method of the present invention, the distance of the space portion between the substrate and the first layer is determined by the thickness of the spacer layer, and the distance of the space between the portion fixed to the substrate and the movable portion in the first layer can be determined by the first etching. Accordingly, the size of the space portion included in the microstructure can be set optionally without limitation by the thickness or area of the sacrificial layer owing to sacrificial layer etching.

(g) Since the microstructure is manufactured by separation and attachment in the present invention, a microstructure with an arbitrary size can be manufactured without limitation on size. For example, a large microstructure which is several mm square to several tens of mm square can also be manufactured.

(i) In addition, in the present invention, since a sacrificial layer is not formed and further a first layer and a second layer are separately formed and attached to each other, a step portion caused by a thick film such as a sacrificial layer is not generated, and a break generated from a portion which crosses the step is not generated. Therefore, a microstructure with high strength can be manufactured.

This embodiment mode can be implemented by being freely combined with any of other embodiment modes.

Embodiment Mode 4

Embodiment Mode 4 specifically describe a manufacturing method of the microstructure, which is described in Embodiment Mode 1, of the present invention with reference to FIGS. 10A1 to 16D. Note that FIGS. 10A1, 10B1, 12B, 13A1 and 13B1 are top views and FIGS. 10A2, 10B2, 12A, 13A2 and 13B2 and 14A to 16D are cross sectional views taken along a dashed line O-P of the top views.

First, an example for manufacturing a substrate including a first layer will be described with reference to FIGS. 10A to 11.

As shown in FIGS. 10A1 and 10A2, a separation layer 403 is formed over a first substrate 401. Here, as the first substrate 401, for example, a glass substrate, a quartz substrate, a plastic substrate, or the like can be used. Alternatively, a conductive substrate such as a metal substrate or a semiconductor substrate of silicon, germanium, a compound of silicon and germanium, or the like can also be used. In this embodiment mode, a manufacturing example of a microstructure using a glass substrate is described.

When the above-described substrate is used, the prepared substrate can be directly used, or a layer for protecting a surface of the substrate (for example, an insulating layer) can be formed on the surface and the substrate can be used. Such a protective layer 402 can be formed using an insulating film containing silicon oxide, silicon nitride, silicon oxynitride, or the like. In this embodiment mode, an example of forming a silicon oxynitride layer having a thickness of 100 nm over the first substrate 401 by a CVD method as the protective layer 402 and forming the separation layer 403 over the protective layer 402 is described.

The separation layer 403 is formed over the protective layer 402. For the separation layer 403, for example, a material containing an element selected from tungsten, molybdenum, titanium, tantalum, niobium, nickel, cobalt, zirconium, zinc, ruthenium, rhodium, tin, osmium, iridium, and silicon; an alloy material containing the element as its main component; or a compound material such as an oxide or nitride of the element can be used. These materials can be formed by a known method such as a sputtering method, a plasma CVD method, or the like. The separation layer 403 can be formed with a single layer structure using a single material, or with a lamination structure using a plurality of materials.

In the case of forming the separation layer 403 with a lamination structure, for example, one of a tungsten layer, a molybdenum layer, and a layer containing a mixture of tungsten and molybdenum can be formed as a first layer, and a layer containing an oxide, nitride, oxynitride, or nitride oxide of tungsten, molybdenum, or a mixture of tungsten and molybdenum can be formed as a second layer.

In the case where a lamination structure of a layer containing metal such as tungsten and a layer containing an oxide of the metal is employed for the separation layer 403, the following method can be utilized: a layer containing silicon oxide is formed on the layer containing metal so that the layer containing the oxide of metal is formed at an interface of the layer containing metal and the layer containing silicon oxide.

Alternatively, thermal oxidization treatment, oxygen plasma treatment, treatment using highly oxidative solution such as ozone water or the like can be applied to the surface of the layer containing the metal such as tungsten to form a layer containing an oxide of the metal on the layer containing the metal. Then, a silicon nitride layer, a silicon oxynitride layer, or a silicon nitride oxide layer can be formed thereover. The layer containing a nitride of the metal, the layer containing an oxynitride of the metal, and the layer containing a nitride oxide of the metal can be similarly formed. In this embodiment mode, an example of forming a tungsten layer having a thickness of 30 nm by a sputtering method, as the separation layer 403 is described.

Next, a base layer 404 is formed over the separation layer 403. The base layer 404 can be formed by a known method such as a sputtering method, a plasma CVD method, or the like using silicon oxide, silicon oxynitride, silicon nitride, silicon nitride oxide, or the like. The formation of the base layer 404 can prevent an impurity from entering from the outside. In this embodiment mode, an example of stacking a layer containing silicon nitride oxide having a thickness of 50 nm and a layer containing silicon oxynitride having a thickness of 100 nm by a CVD method, as the base layer 404 is described.

Then, a first conductive layer 405 to be a movable electrode in driving the microstructure is formed over the base layer 404. The first conductive layer 405 is formed using a conductive metal element or a compound thereof, and a resist mask is formed by photolithography and etching is conducted so that the first conductive layer 405 can be processed. The shape of the first conductive layer 405 is determined in consideration of the structure of the structural layer (a first layer 407) to be formed. In this embodiment mode, an example of processing the first conductive layer 405 into a shape which remains after subtraction of alignment margins from dimensions of the first layer, based on the shape of the first layer, is described.

The first conductive layer 405 can be formed by a known method such as a sputtering method or a plasma CVD method using a metal element such as aluminum (Al), tungsten (W), molybdenum (Mo), titanium (Ti), or tantalum (Ta) or a conductive compound containing the metal element as its main component. In this embodiment mode, an example of forming titanium with a thickness of 400 nm by a sputtering method for the first conductive layer 405 is described.

The processing of the first conductive layer 405 can be conducted by etching such as wet etching or dry etching. In particular, anisotropic dry etching is often used, and as an example, ICP (Inductively Coupled Plasma) etching can be used. At this time, workability (such as the etching rate and shape of a side surface of the layer to be processed) can be heightened by appropriate adjustment of etching conditions (such as the electric power to be applied to a coil-shaped electrode, the electric power to be applied to an electrode on the substrate side, and the electrode temperature on the substrate side). As an etching gas, for example, in the case where the first conductive layer 405 is formed of aluminum, $Cl_2$, $BCl_3$, $SiCl_4$, or the like can be used. Further, in the case of forming the first conductive layer 405 using metal such as tungsten or molybdenum, a chlorine-based gas typified by $CCl_4$, or a fluorine-based gas typified by $CF_4$, $SF_6$, or $NF_3$, with which $O_2$ is combined, can be used.

Then, a first insulating layer 406 is formed over the first conductive layer 405. In the top view of FIG. 10A1, the first insulating layer 406 is not shown. The first insulating layer 406 forms the skeleton of the structural layer, with the first conductive layer 405, and the material, thickness, lamination structure, and the like of the first insulating layer 406 are determined in consideration of the performance (for example, the weight of the structural layer, the spring constant, the range of movement, or the like) of the microstructure to be manufactured. The first layer 407 can be formed of a single layer or layers of an insulating inorganic compound, an insulating organic compound, or the like. For example, as the inorganic material forming the first insulating layer 406, silicon oxide or silicon nitride can be used. As the organic material, polyimide, acrylic, polyamide, polyimideamide, resist, benzocyclobutene, siloxane, or polysilazane can be used. In this embodiment mode, an example of forming silicon oxynitride with a thickness of 900 nm by a CVD method for the first insulating layer 406 is described.

In this embodiment mode, the lamination structure of the base layer 404, the first conductive layer 405, and the first insulating layer 406 formed as described above is referred to as the first layer 407. The first layer 407 serves as a structural layer which forms a microstructure.

Next, as shown in FIGS. 10B1 and 10B2, first etching for determining the shape of the first layer 407 is conducted. By the first etching, openings 408 are formed so as to determine the shape of the first layer 407. The formation of the openings 408 by the first etching can be conducted in the following way: a resist mask is formed by photolithography and etching is conducted using the resist mask. Since the first insulating layer 406 is formed after processing of the first conductive layer 405 in this embodiment mode, the base layer 404 and the first insulating layer 406 are processed in the first etching. In the first etching of the present invention, all the layers forming the first layer 407 can be processed as well.

The first etching can be conducted by etching such as wet etching or dry etching, and anisotropic dry etching is applied in this embodiment mode. Since the first insulating layer 406 is formed using silicon oxynitride in this embodiment mode, as an etching gas for the first etching, a combination of $H_2$ and $CHF_3$, HF, $C_2F_6$, or $C_4F_8$, or the like can be used. Further, when Ar, He, or the like is mixed to the above-described gas, accumulation of a compound generated in etching can be suppressed. In the case of stacking a plurality of materials for the first insulating layer 406, a plurality of layers can be continuously etched by switching the etching gases in the first etching.

Since the structural layer is made to have a low spring constant so as to easily move in this embodiment mode, the first layer 407 which serves as a support beam of the structural layer is processed into a bent serpentine shape, that is a shape of a plurality of S shapes connected. In addition, since the first conductive layer 405 forming the structural layer is electrically connected to an external power source or a signal line in this embodiment mode, the first conductive layer 405 is processed so as to be provided in the support beam. The first conductive layer 405 and the first insulating layer 406 can be processed at the same time by the first etching.

When the first layer 407 is processed to have a post-and-beam structure as shown in FIGS. 10B1 and 10B2, a microstructure in which the structural layer can move in perpendicular directions to the substrate (upper and lower directions), can be manufactured. Further, the beam can be lengthened or a cantilever structure can be employed in order to lower the spring constant of the structural layer so that the range of movement of the microstructure can be increased. Alternatively, the first layer 407 can be formed thick and processed into a comb shape, thereby manufacturing a microstructure including the structural layer which can move in lateral directions.

Figure 11:
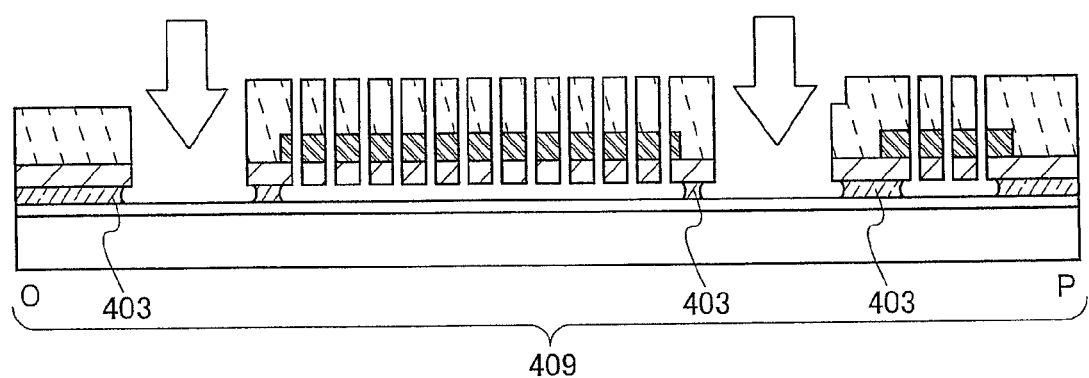
FIG. 11 shows a manufacturing method of a microstructure of the present invention.

Next, as shown in FIG. 11, separation layer etching for removing a part of the separation layer 403 is conducted. The etching can make the separation of the first layer 407 from the first substrate 401 easier. For example, in the case of forming tungsten for the separation layer 403 as in this embodiment mode, etching of the separation layer 403 can be conducted by wet etching using an ammonia peroxide solution. Here, the ammonia peroxide solution is a liquid which is a mixture of ammonia, oxygenated water, and pure water, and for example the ammonia peroxide solution can be obtained by mixing 28% of ammonia, 31% of oxygenated water, and pure water at a ratio of 3:5:2.

The process can be performed without the separation layer etching as shown in FIG. 11. Instead of the separation layer etching, a step of heating the first substrate 401 or a step for laser light irradiation from the rear side can be conducted, so as to weaken the separation layer 403; accordingly, the separation of the first layer 407 from the first substrate 401 becomes easier.

Figure 12A:
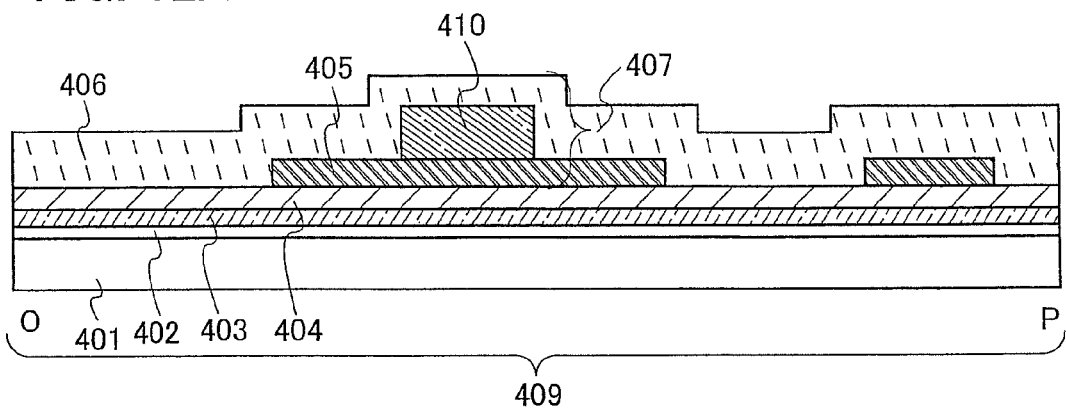
FIGS. 12A and 12B show manufacturing methods of a microstructure of the present invention.

Through the above-described process, a substrate including the first layer 409 can be formed. The substrate including the first layer 409 is not limited to the above-described example, and for example, a layer serving as a weight is formed in the first layer 407 as shown in FIG. 12A and accordingly the movability of the structural layer can be heightened. Here, the layer serving as a weight can be formed using a dense substance such as metal.

Figure 12B:
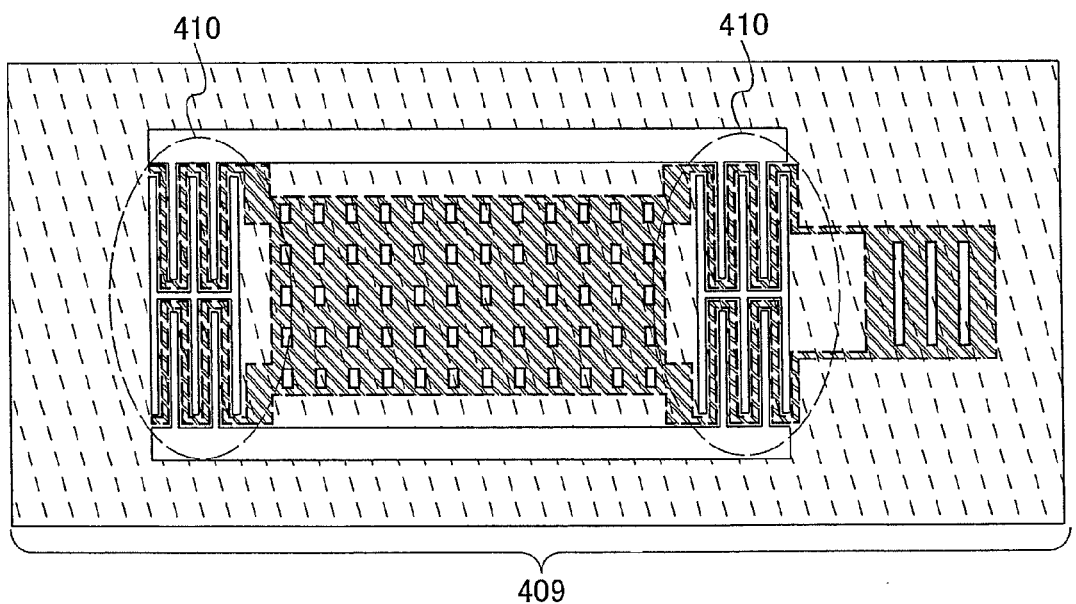

As shown in FIGS. 10B1 and 10B2, when the first conductive layer 405 is formed in only one side of the beams, the spring constant is different between right and left sides. Accordingly, processing in which the first conductive layer 405 is formed in both beams 410 as shown in FIG. 12B can be conducted so that the spring constants of the beams 410 on the right and left in the post-and-beam structure can be balanced.

Next, a manufacturing example of a substrate including a second layer will be described with reference to FIGS. 13A1 and 13A2.

First, as shown in FIGS. 13A1 and 13A2, a second conductive layer 413 is formed over a second substrate 411. Here, similarly to the first substrate 401, a glass substrate, a quartz substrate, a plastic substrate, a conductive substrate such as a metal substrate, or a semiconductor substrate of silicon, germanium, a compound of silicon and germanium, or the like can be used as the second substrate 411. In this embodiment mode, similarly to the first substrate 401, an example of using a glass substrate is described.

The substrate used as the first substrate 401 or the second substrate 411 is not limited to the examples of this embodiment mode, and another substrate can be used. For example, in the case where a process of forming or processing a film at a high temperature is desired to be used, a semiconductor substrate of silicon or the like can be applied to one of the first substrate 401 and the second substrate 411, and an inexpensive substrate such as a glass substrate or a quartz substrate can be used as the other of them. Specifically, a microstructure in accordance with its purpose can be manufactured when substrates are separately used in a manner such as the following: a semiconductor substrate is used as one of the substrates and an electronic circuit including a semiconductor element is formed thereon, and a glass substrate is used as the other substrate and a structural layer (the first layer 407) is formed thereover.

As the second substrate 411, a prepared substrate can be directly used, similarly to the first substrate 401, or the substrate over which a protective layer is formed using an insulating film containing silicon oxide, silicon nitride, silicon oxynitride, or the like can be used. In this embodiment mode, an example of forming, as a protective layer 412, a silicon oxynitride layer having a thickness of 100 nm over the second substrate 411 by a CVD method and forming second conductive layers 413 over the protective layer 412, similar to the first substrate 401, is described.

Then, as shown in FIGS. 13A1 and 13A2, the second conductive layers 413 are formed over the protective layer 412. The second conductive layers 413 are conductive layers for driving a structural layer together with the first conductive layer 405, and becomes fixed electrodes which are fixed over the substrate. The formation of the second conductive layers 413 can be conducted in the following manner. A conductive material is formed by a sputtering method, a plasma CVD method, or the like. Over the formed material, a resist mask is formed by photolithography. The formed material is processed by etching using the resist mask. The material of the second conductive layers 413 can be, similarly to those of the first conductive layer 405, a metal element such as aluminum (Al), tungsten (W), molybdenum (Mo), titanium (Ti), or tantalum (Ta) or a conductive compound containing the metal element as its main component. In this embodiment mode, an example of stacking a titanium layer with a thickness of 100 nm and an aluminum layer with a thickness of 400 nm by a sputtering method as the second conductive layers 413 is described.

In this embodiment mode, as the second conductive layers 413, a fixed electrode 413a used for driving the microstructure and a wiring 413b for connecting the movable electrode (the first conductive layer 405) and the fixed electrode to a power source or a signal line are formed. The wiring 413b shown in FIGS. 13A1 and 13A2 is a wiring electrically connected to the first conductive layer 405. Although these wirings are connected to any parts in the substrate or outside the substrate, for convenience of explanation, only the fixed electrode 413a and the wiring 413b which are within the paper of the drawing are shown.

In this embodiment mode, the lamination structure of the protective layer 412 and the second conductive layers 413 which are described above is referred to as a second layer 414. Through the above-described process, a substrate including the second layer 415 can be formed.

Then, as shown in FIGS. 13B1 and 13B2, a first spacer layer 416 is selectively formed over the substrate including the second layer 415. The first spacer layer 416 can be formed with a single layer structure or a lamination structure using an insulating inorganic compound, an insulating organic compound, or the like, similarly to Embodiment Modes 1 to 3. For example, silicon oxide or silicon nitride can be used as the inorganic material forming the first spacer layer 416. As the organic material, polyimide, acrylic, polyamide, polyimide-amide, resist, benzocyclobutene, siloxane, or polysilazane can be used. Further alternatively, a thick film permanent resist containing an organic compound such as polyimide or epoxy can be used.

As a forming method of the first spacer layer 416 in a selected region, a screen printing method, a droplet discharging method typified by an ink-jet method, or the like can be used. These methods are effective in many cases when an organic material capable of adjusting viscosity by a solvent is used particularly. Alternatively, when using a photosensitive material such as a resist, the first spacer layer 416 can be formed only by film formation, exposure to light and development.

Next, with reference to FIGS. 14A to 15D, an example of separating the first layer 407 from the substrate including the first layer 409 and attaching the first layer 407 to the substrate including the second layer 415 will be described. Note that the drawings are cross sectional views taken along a dashed line O-P of the top views of the substrate including the first layer 409 and the substrate including the second layer 415.

Figure 14A:
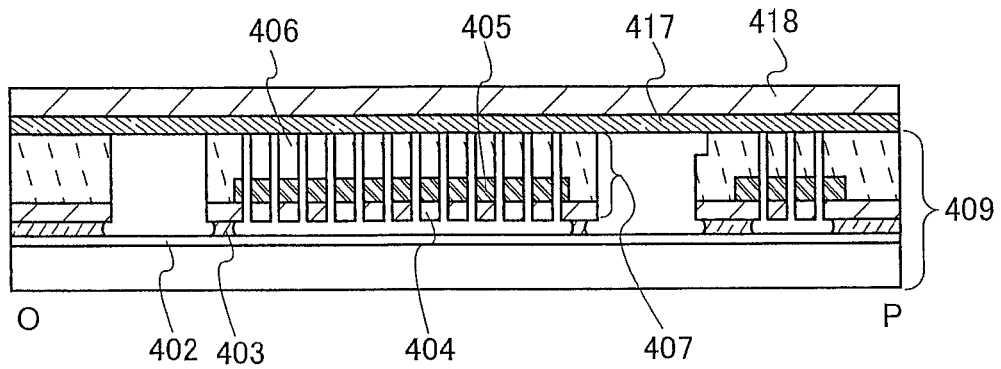
FIGS. 14A to 14C show a manufacturing method of a microstructure of the present invention.

As shown in FIG. 14A, a third substrate 418 is attached to an upper surface of the substrate including the first layer 409. Since the third substrate 418 is a support substrate for separating the first layer 407 from the first substrate 401, a substrate which is thin as a film and soft can be used as the third substrate 418, other than a glass substrate or a plastic substrate.

For the attachment of the third substrate 418 and the substrate including the first layer 409, an adhesive 417 which has a low adhesiveness and can be easily removed, can be utilized. As a typical examples for the adhesive 417 which can be easily removed, a thermoplastic resin can be given. A thermoplastic resin forms a layer whose adhesiveness is lowered by heat treatment, and for example, a material which softens by heating, a material in which a microcapsule that expands by heating or a foaming agent is mixed, a thermosetting resin to which a thermal fusibility or a pyrolytic property is given, or a material in which interface intensity deteriorates because of entry of moisture, or a material in which a water-absorbing resin is expanded in accordance with the entry of moisture can be used. As the adhesive 417, a resin whose adhesiveness is lowered by ultraviolet radiation can be used. The adhesive 417 can be selectively formed on the third substrate 418, so as not to attach to a portion, of the first layer 407, to be the structural layer.

Figure 14B:
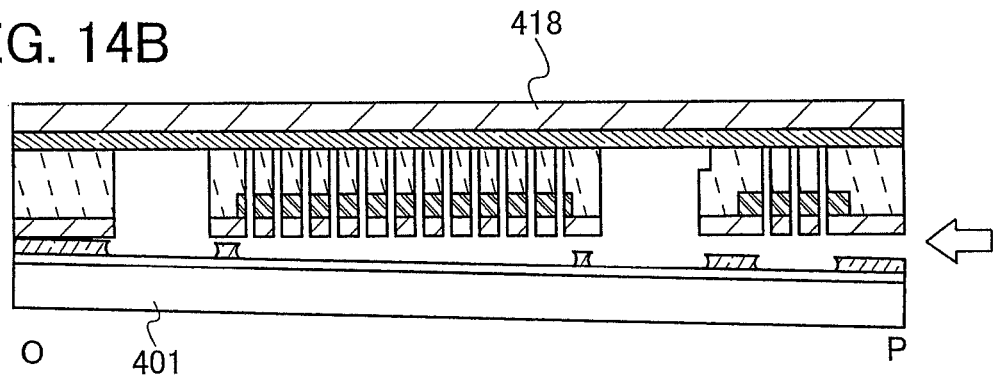

Then, as shown in FIG. 14B, the first layer 407 is separated from the substrate. In this embodiment mode, since tungsten is formed for the separation layer 403 and silicon nitride oxide is formed thereover as the base layer 404, a layer of tungsten oxide is formed between the separation layer 403 and the base layer 404, and the adhesiveness decreases at an interface between the layer of tungsten oxide and the base layer 404. Further, since the part of the separation layer 403 is removed by the etching of the separation layer 403, a method of physically displacing the first layer 407 to a third layer is employed for the separation. At this time, laser irradiation from the rear side of the substrate can also be conducted in order to lower the adhesiveness of the separation layer 403.

As the physical displacing method (transfer method), specifically, the third substrate 418 is attached to the substrate including the first layer 409 in which the separation layer 403 is subjected to etching, and the third substrate 418 is separated from the first substrate 401, thereby displacing the first layer 407 to the third substrate 418 side. At this time, since there is a case where the separation layer 403 attaches to the first layer 407, a step of removing the separation layer 403 from the first layer 407 can be added.

Figure 14C:
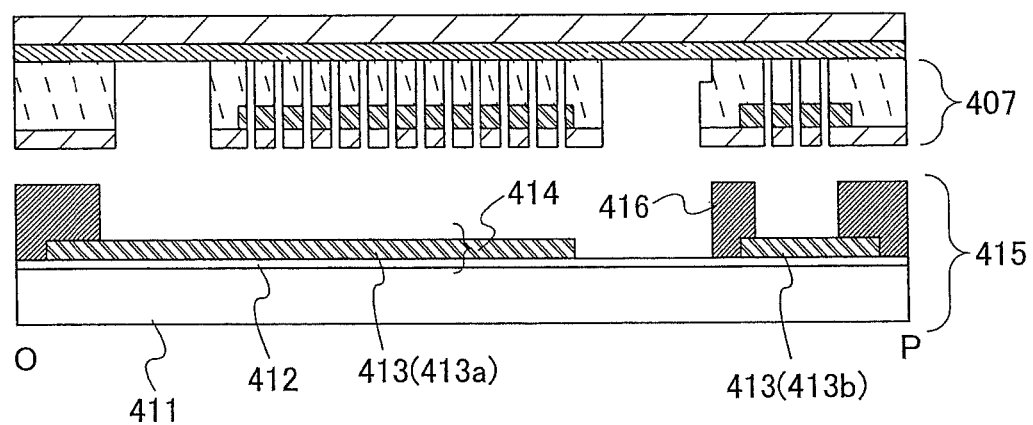

Then, as shown in FIG. 14C, the first layer 407 attached to the third substrate 418 is attached to an upper surface of the substrate including the second layer 415. In FIG. 14C, an example of attaching the substrate including the second layer 415 to the side of the first layer 407, which has been attached to the first substrate 401 through the first spacer layer 416, is shown.

Figure 15A:
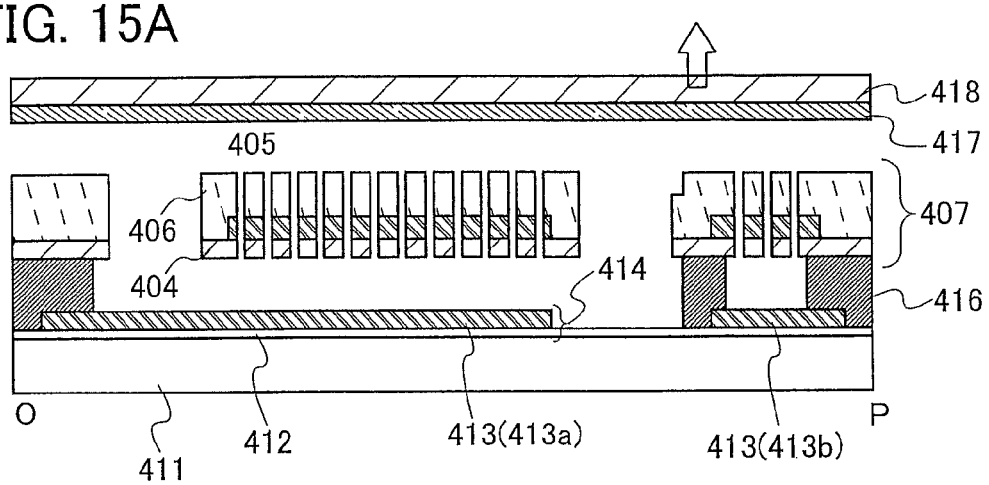
FIGS. 15A to 15D show a manufacturing method of a microstructure of the present invention.

Then, as shown in FIG. 15A, the adhesiveness of the adhesive 417 is lowered by treatment such as heating, and the separation of the first layer 407 and the third substrate 418 is conducted. For example, in the case of using a thermoplastic resin as the adhesive 417, the third substrate 418 can be separated by heat treatment at about 120° C. At this time, the adhesive 417 attaches to the side of the third substrate 418 and does not remain on the first layer 407.

Figure 15B:
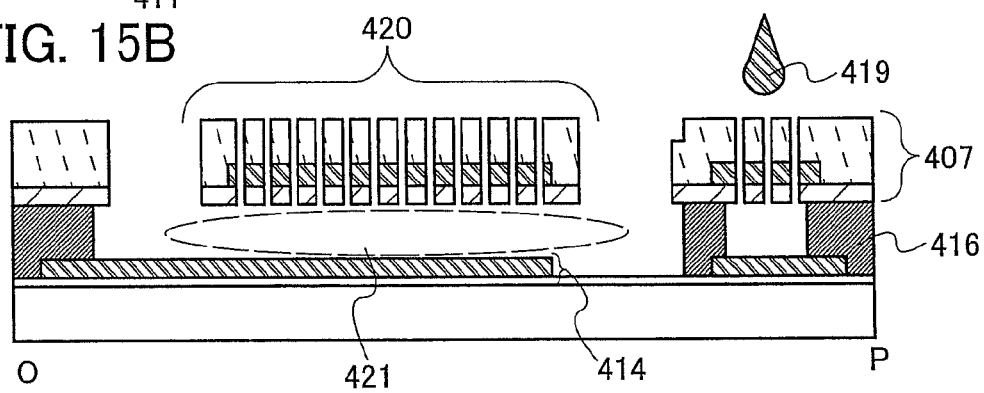

By separation of the first layer 407 and the third substrate 418 from each other, a microstructure 420 as shown in FIG. 15B is formed. In the microstructure 420, the second layer 414, the first spacer layer 416 and the first layer 407 are stacked over the second substrate 411, and in a portion where the first spacer layer 416 does not exist, a space portion 421 is provided between the first layer 407 and the second layer. The first layer 407 is formed over the space portion 421. A portion of the first layer 407, which is attached to the first spacer layer 416, is supported by the second substrate 411, and a portion of the first layer 407, which is provided apart from the substrate including the second layer 415, serves as a movable structural layer.

Figure 15C:
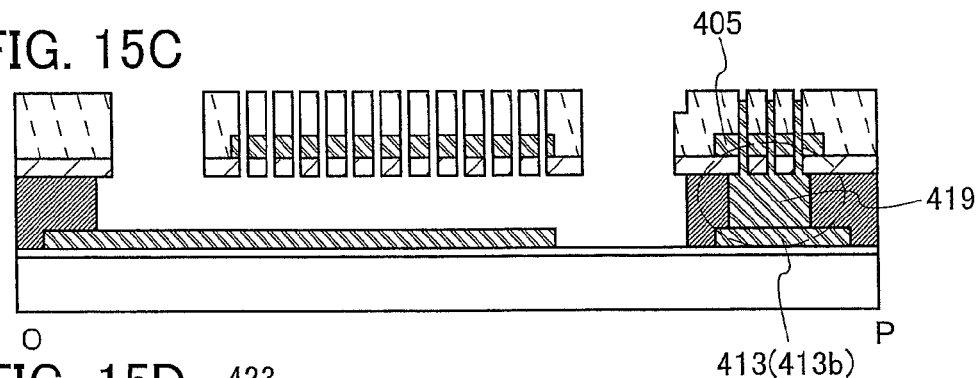

Then, in order to electrically connect the first conductive layer 405 in the first layer 407 to the second conductive layer 413 forming a wire, a conductive paste 419 is dropped on a region forming the wire as shown in FIG. 15B. The space between the first layer 407 and the second layer 414 is filled with the conductive paste 419 as shown in FIG. 15C; accordingly, the first conductive layer 405 can be electrically connected to the wiring 413b included in the second conductive layers 413.

Here, the conductive paste 419 indicates conductive particles having a grain size of several μm to several tens of μm, which are dissolved or dispersed in an organic resin can be used. As the conductive particles, metal particles of silver, copper, aluminum, gold, nickel, platinum, palladium, tantalum, molybdenum, titanium, or the like; fine particles of silver halide; or dispersible nanoparticles can be used. In addition, as the organic resin included in the conductive paste, one or more selected from organic resins functioning as a binder of metal particles, a solvent, a dispersing agent and a coating material can be used. Typically, organic resins such as an epoxy resin, a phenol resin, and a silicon resin can be given. When forming a conductive layer, baking is preferably performed after the paste is applied. For example, in the case where fine particles (having a grain size of 1 nm or more and 100 nm or less) containing silver as its main component are used as a material for the paste, the paste is hardened by baking at a temperature of 150 to 300° C., so that a conductive layer can be obtained.

Figure 15D:
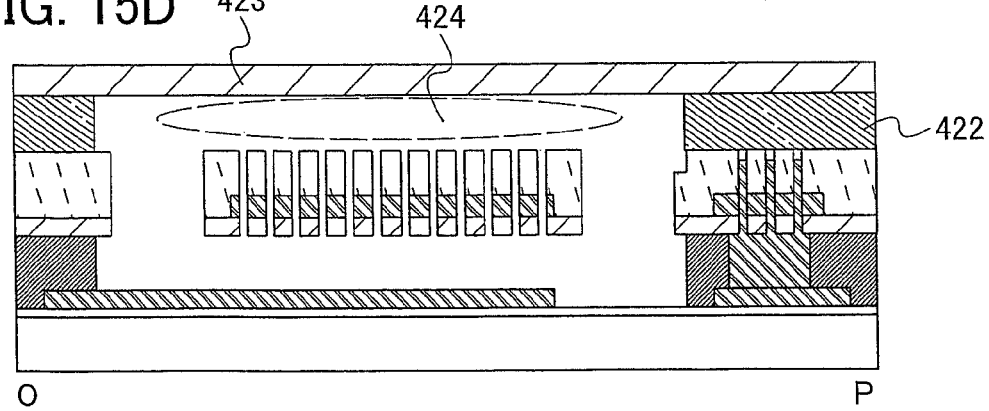

To protect the microstructure 420, a second spacer layer 422 can be formed over the first layer 407 and the substrate including the first layer 409 and a fourth substrate 423 can be attached to each other, as shown in FIG. 15D. The second spacer layer 422 can be formed with a single layer structure or a lamination structure using an insulating inorganic compound, an insulating organic compound, or the like, similarly to the first spacer layer 416. Alternatively, the second spacer layer 422 can be formed over the fourth substrate 423 and then attachment of the substrate including the first layer 409 and the fourth substrate 423 can be conducted. Since the fourth substrate 423 serves as a package which protects the first layer 407 with the space portion 424 interposed therebetween, a thin, soft and inexpensive substrate, for example, a substrate like a plastic film can be used. However, similarly to the first substrate 401, a substrate of glass, quartz, or the like can also be used.

In the microstructure 420 obtained in the above-described process, the first layer 407 (structural layer) includes a first region 425, a second region 426 and a third region 427. The first region 425 is a region fixed by the first spacer layer 416 and the second spacer layer 422. The first spacer layer 416 is provided between the surface of the substrate including the second layer 415 and the first region 425 and fixes the first region 425 to the second substrate 411. In addition, the second spacer layer 422 is provided between the first region 425 and the fourth substrate (protective substrate) 423 and fixes the first region 425 to the fourth substrate 423. A space portion is each provided between a surface of the substrate including the second layer 415, and the second region 426 and the third region 427, and between the fourth substrate 423, and the second region 426 and the third region 427. The second region 426 faces the surface of the substrate including the second layer 415 and the fourth substrate 423, with a distance therebetween, and serves as a movable portion. The third region 427 functions as a spring and connects the fixed first region 425 to the movable second region 426.

Next, a method for attaching the first layer 407 to the substrate including the second layer 415 without using the adhesive 417 and the third substrate 418, which is different from the above-described method, will be described with reference to FIGS. 16A to 16D.

Figure 16A:
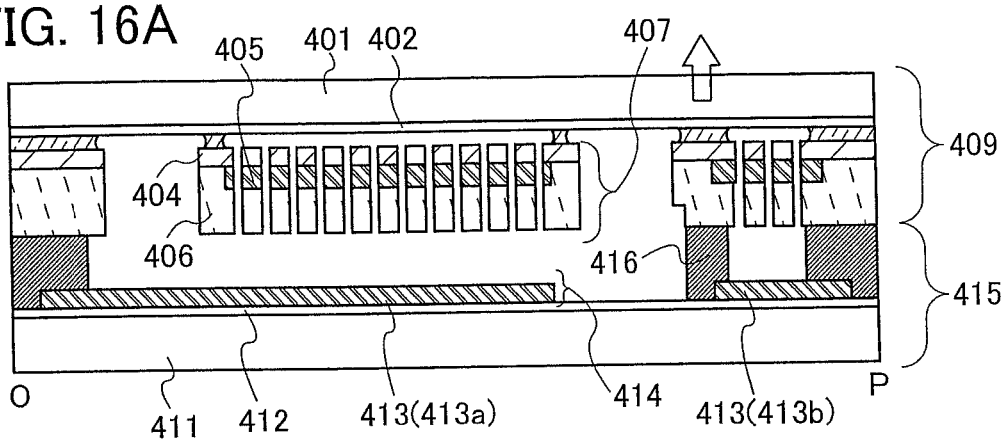
FIGS. 16A to 16D show a manufacturing method of a microstructure of the present invention.
Figure 16B:
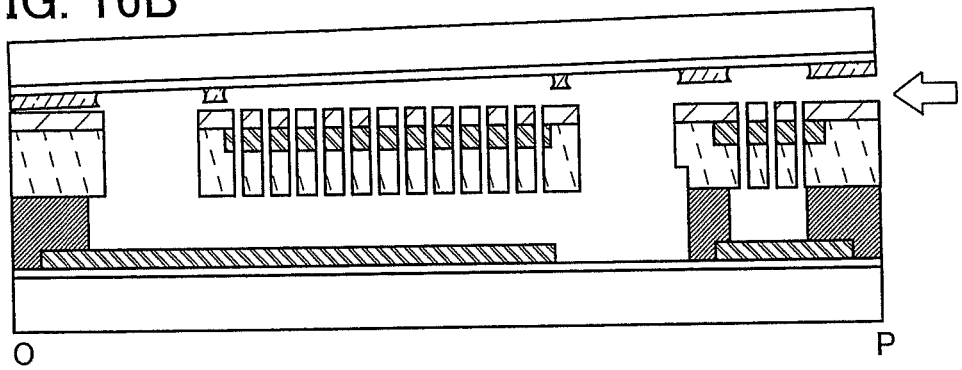
Figure 16C:
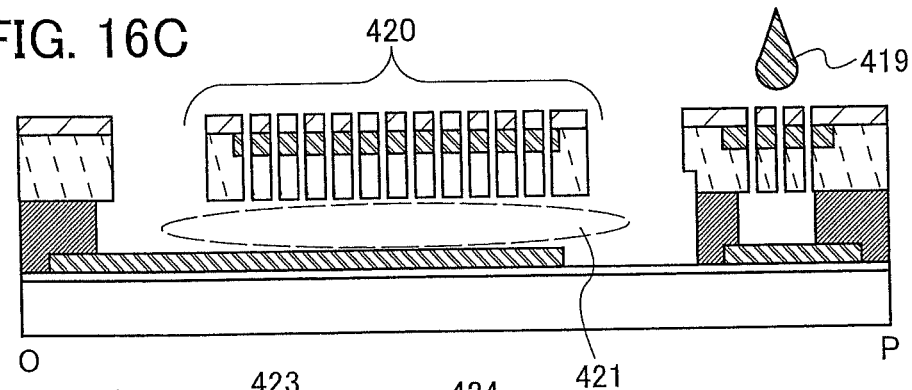
Figure 16D:
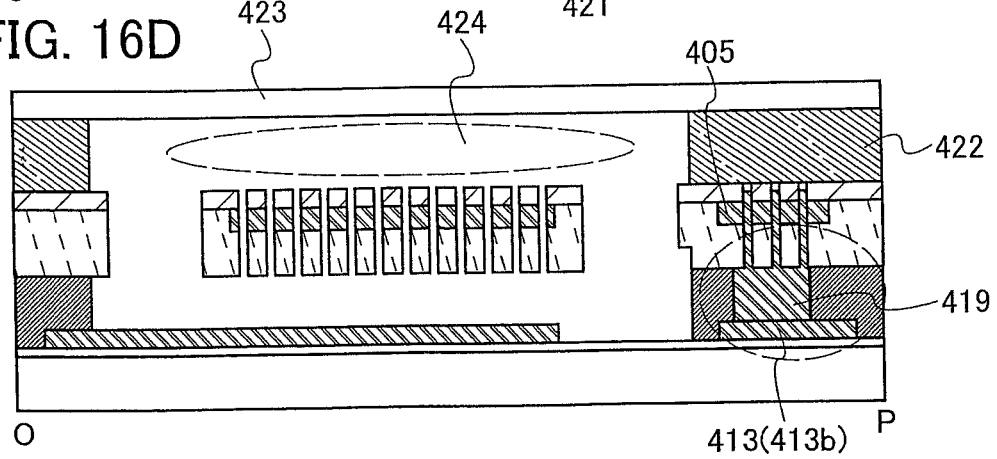

As shown in FIG. 16A, the substrate including the first layer 409 and the substrate including the second layer 415 are attached so as to face each other with the first spacer layer 416 interposed therebetween. Then, as shown in FIG. 16B, the first substrate 401 is separated from the substrate including the first layer 409. Here, not only the first substrate 401 but also the protective layer 402 is separated. Then, as shown in FIG. 16C, the conductive paste 419 is dropped from the above of the portion where the wiring 413b is formed, in order to connect the first conductive layer 405 to the second conductive layer 413. When the second spacer layer 422 is formed and the fourth substrate 423 is attached thereto as shown in FIG. 16D, the microstructure 420 can be protected.

In the attaching method described with reference to FIGS. 14A to 15D, after the separation of the first layer 407 from the first substrate 401, the first layer 407 and the substrate including the second layer 415 are attached. In the attaching method described with reference to FIGS. 16A to 16D, after attachment of the substrate including the first layer 409 and the substrate including the second layer 415, the first substrate 401 is separated from the first layer 407. Thus, the above-described two methods are different in the order of steps. By this difference in the process, the surface which faces the second layer 414, of two surfaces included in the first layer 407, varies between the two methods. In other words, in the case of the former process, the surface of the first layer 407, which has been in contact with the first substrate 401, faces the second layer 414, and in the latter process, the other surface faces the second layer 414. Accordingly, the lamination order of the first layer 407 is reversed in some cases, depending on which method is to be employed.

When external force is applied to the microstructure manufactured in such a manner, the structural layer can move in a direction in which the force is applied, and therefore, the microstructure can function as a sensor by sensing the movement. Alternatively, opposing electrodes can be formed in the first layer 407 and the second layer 414 so that the structural layer moves by electrostatic attraction. Accordingly, the microstructure can function as an actuator. Further, by utilizing this actuator, a switch, a capacitor having variable capacitance, or the like can be manufactured.

When using the manufacturing method of the microstructure of the present invention described in this embodiment, the microstructure can be manufactured without sacrificial layer etching. Therefore, the problems caused by the sacrificial layer etching can be avoided, similarly to Embodiment Modes 1 to 3. Hereinafter, some effects of this embodiment mode will be described.

(a) Since a similar step to the sacrificial layer etching is conducted in the separation and the attachment, the step can be completed in a considerably short time.

(b) When separation and attachment are substituted for the sacrificial layer etching, a microstructure can be manufactured so as not to generate attachment of the structural layer and the substrate by a capillary phenomenon because the microstructure does not contact a liquid etchant as in wet etching.

(c) Since the microstructure is manufactured by separation and attachment in the method of the present invention, a problem that a sacrificial layer or a by-product of etching remains in the space portion is not caused. In other words, a problem that when sacrificial layer etching is completed in a substrate or a part of a substrate, sacrificial layer etching is not completed in another substrate or another part of the substrate, can be avoided. Further, in the method of the present invention, since the first layer 407 separated from the first substrate 401 is attached to the second substrate including the second layer 411, space portions of all the microstructures manufactured over the substrate can be formed uniformly.

(e) Since a step of sacrificial layer etching requiring a long time is not necessary, an adverse influence is not caused on another layer. For example, in the sacrificial layer etching, a film reduction of the structural layer is not caused; accordingly, the structural layer can be formed with a uniform thickness. Further, in the case where etching of the separation layer 403 is conducted, even when a material on which an influence by the etching is worried is used, the influence can be avoided by the formation of the material over the second substrate 411 to which the sacrificial layer etching is not conducted.

(f) In the method of the present invention, the distance of the space portion between the substrate and the first layer 407 is determined by the thickness of the first spacer layer 416, and the distance of the space between the portion fixed to the substrate and the movable portion in the first layer 407 can be determined by the first etching. Accordingly, the size of the space portion included in the microstructure can be set optionally without limitation by the thickness or area of the sacrificial layer owing to sacrificial layer etching.

(g) Since the microstructure is manufactured by separation and attachment in the present invention, a microstructure with an arbitrary size can be manufactured without limitation on size. For example, a large microstructure which is several mm square to several tens of mm square can also be manufactured.

(i) In addition, in the present invention, since a sacrificial layer is not formed and further the first layer 407 and the second layer are separately formed and attached to each other, a step portion caused by a thick film like a sacrificial layer is not generated, and a break generated from a portion which crosses the step is not generated. Therefore, a microstructure with high strength can be manufactured.

This embodiment mode can be implemented by being freely combined with any of other embodiment modes.

Embodiment Mode 5

Embodiment Mode 5 will concretely describe the manufacturing method of the microstructure described in the above embodiment mode, with reference to FIGS. 17A1 to 20D. Note that the drawings on the right side are top views of substrates and the drawings on the left side are cross sectional views taken along a dashed line O-P of the top views.

First, a processing method of a first substrate will be described with reference to FIGS. 17A1 to 17D.

As shown in FIGS. 17A1 and 17A2, over the first substrate 401, the protective layer 402, the separation layer 403, the base layer 404, the first conductive layer 405 and the first insulating layer 406 are sequentially formed. For the process up to here, a similar method to that described in Embodiment Mode 4 can be used.

Here, the first conductive layer 405 includes a portion 405a for forming a movable electrode of the microstructure and a portion 405b for forming a wiring which electrically connects the movable electrode to another conductive layer. Similarly to Embodiment Mode 4, since the first layer is made to have the post-and-beam structure having bent support beams, the first conductive layer 405 is provided along a shape of the support beams in the support beams which are provided between the wirings and the movable electrode.

Then, as shown in FIGS. 17B1 and 17B2, contact holes are provided in the first insulating layer 406 which is provided over the wiring portions 405b of the first conductive layer 405, so as to expose the first conductive layer. In addition, third conductive layers 501 are formed over the first insulating layer 406 and over the contact holes.

The contact holes are formed by the formation of a resist mask by photolithography and etching. For example, when the first insulating layer is formed of silicon oxynitride and the contact holes are formed by anisotropic dry etching, a combination of $H_2$ and $CHF_3$, HF, $C_2F_6$, or $C_4F_8$, or the like can be used can be used as an etching gas. Further, when Ar, He, or the like is mixed to the above-described gas, accumulation of a compound generated in etching can be suppressed.

For the third conductive layers 501, similarly to the first conductive layer 405, a conductive metal element such as aluminum (Al), tungsten (W), molybdenum (Mo), titanium (Ti), or tantalum (Ta) or a conductive compound containing the metal element as its main component is used. A film containing the above conductive material is formed by a known method such as a sputtering method or a plasma CVD method. A resist mask is formed by photolithography and the formed conductive material is processed into a predetermined shape by etching, to form the third conductive layers 501. In this embodiment mode, an example of forming aluminum with a thickness of 400 nm by a sputtering method for the third conductive layers 501 is described.

Through the above-described process, the third conductive layers 501 which are electrically connected to the first conductive layer 405 are provided as top layers. Here, the base layer 404, the first conductive layer 405, the first insulating layer 406, and the third conductive layers 501, which are formed in the above-described process, are referred to as a first layer 502.

Next, as shown in FIGS. 17C1 and 17C2, first etching in which the openings 408 are formed in order to determine the shape of the first layer 502 is conducted. Then, as shown in FIG. 17D, separation layer etching which removes a part of the separation layer, is conducted. The first etching and the separation layer etching can be conducted by a method similar to that of Embodiment Mode 4.

In the first etching, in order to make the structural layer to have a low spring constant so as to easily move, the first layer 502 to be a support beam of the structural layer is processed into a bent serpentine shape, that is a shape of a plurality of S shapes connected. In addition, since the first conductive layer 405 forming the structural layer is electrically connected to an external power source or a signal line, the first conductive layer 405 is processed so as to be provided in the support beam. The first conductive layer 405 and the first insulating layer 406 can be processed at the same time by the first etching.

Through the above-described process, a substrate including the first layer 503 can be formed.

Next, an example of forming the substrate including the second layer will be described with reference to FIGS. 18A1 to 18B2.

First, as shown in FIGS. 18A1 and 18A2, the protective layer 412 and the second conductive layers 413 are formed over the second substrate 411. For the process up to here, a similar method to that described in Embodiment Mode 4 can be used.

In this embodiment mode, as the second conductive layers 413, the fixed electrode 413a used for driving the microstructure and the wirings 413b for connecting the movable electrode (the first conductive layer) and the fixed electrode to a power source or a signal line are formed. The wirings 413b shown in FIGS. 18A1 and 18A2 are wirings electrically connected to the third conductive layers 501. The wirings 413b are connected to any parts in the substrate or outside the substrate.

The stack of the protective layer 412 and the second conductive layers 413 is referred to as a second layer 414. Through the above-described process, the substrate including the second layer 415 can be formed.

Then, as shown in FIGS. 18B1 and 18B2, a first spacer layer 504 is selectively formed over the substrate including the second layer 415. As the first spacer layer 504, an adhesive having conductivity only in a perpendicular direction to the substrate surface (here, referred to as an anisotropic conductive adhesive) is used. As the method for forming the first spacer layer 504, a similar method to that in Embodiment Mode 4 such as a screen printing method or a droplet discharging method can be used.

Figure 19A:
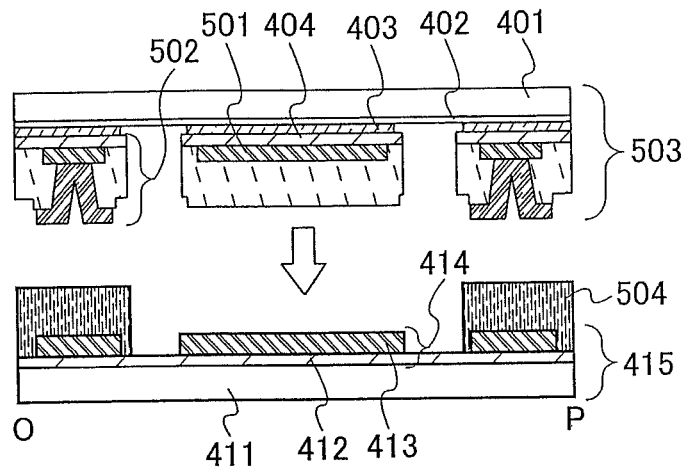
FIGS. 19A to 19C show a manufacturing method of a microstructure of the present invention.

Next, a method for attaching the first layer 502 and the second layer 414 will be described with reference to FIGS. 19A to 19C. Attachment is conducted so that the substrate including the first layer 503 and the substrate including the second layer 415 face each other with the first spacer layer 504 interposed therebetween as shown in FIG. 19A. Thus, when attachment is conducted so that the first layer 502 and the second layer 414 face each other with the anisotropic conductive adhesive (first spacer layer 504) interposed therebetween, the wirings 413b of the second conductive layers 413 are electrically connected to wiring portions of the third conductive layers 501.

Figure 19B:
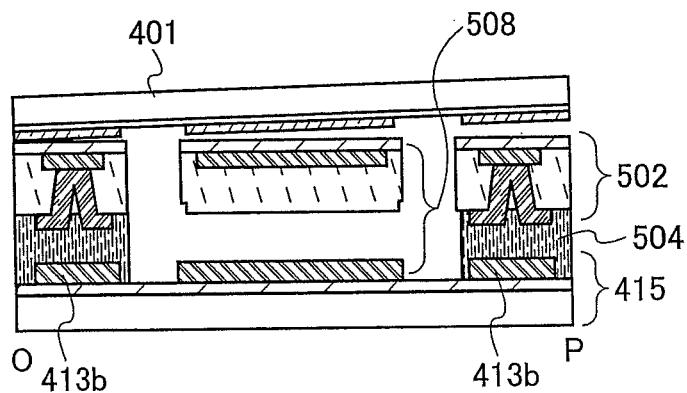
Figure 19C:
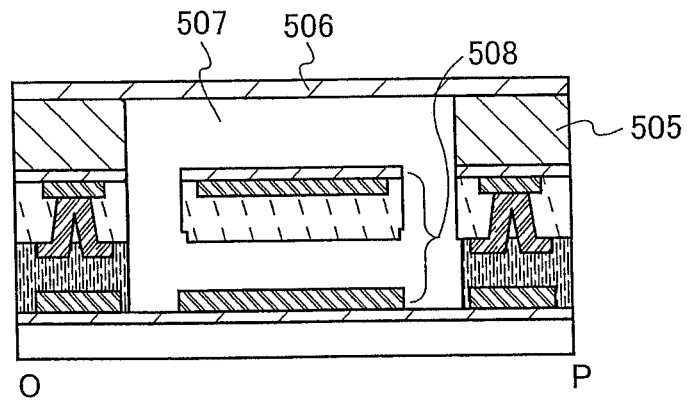

Then, as shown in FIG. 19B, the first substrate 401 is separated from the substrate including the first layer 503. Not only the first substrate 401 but also the protective layer 402 is separated. Then, as shown in FIG. 19C, a second spacer layer 505 can be formed and a fourth substrate 506 (first protective substrate) is attached in order to protect a microstructure 508. Reference numeral 507 denotes a space portion. For the method of separating the first layer 502 from the first substrate 401 and the method of forming the second spacer layer 505 and attaching the second spacer layer 505 to the fourth substrate 506, similar methods to those in Embodiment Mode 4 can be employed.

When external force is applied to the microstructure 508 manufactured in such a manner, the structural layer can move in a direction in which the force is applied, and therefore, the microstructure can function as a sensor by sensing the movement. Alternatively, opposing electrodes can be formed in the first layer 502 and the second layer 414 so that the structural layer moves by electrostatic attraction. Accordingly, the microstructure can function as an actuator. Further, by utilizing this actuator, a switch, a capacitor having variable capacitance, or the like can be manufactured.

Thus, in order to manufacture a microstructure having an arbitrary function, the first layer is processed in accordance with its use. For example, when the first layer 502 is processed to have a post-and-beam structure as shown in FIGS. 17C1 and 17C2, a microstructure in which the structural layer can move in substrate perpendicular directions (upper and lower directions), can be manufactured. Further, the beam can be lengthened or a cantilever structure can be employed in order to lower the spring constant of the structural layer so that the range of movement of the microstructure can be large. Alternatively, the first layer 502 can be formed thick and processed into a comb shape, thereby manufacturing a microstructure including the structural layer which can move in lateral directions.

For example, in the case of manufacturing the microstructure including the structural layer which can move in lateral directions, a first layer 514 can be formed as shown in FIGS. 20A1 and 20A2. As the first layer 514, a base layer 512 and a first conductive layer 513 are formed over a first substrate 509 over which a protective layer 510 and a separation layer 511 are formed. The first conductive layer 513 can be formed by a similar method to that in Embodiment Mode 4, or a method of forming a thick layer in a short time by a method such as plating may be used.

Then, as shown in FIGS. 20B1 and 20B2, first etching is conducted to form openings 516 to form a movable electrode 514a and wirings 514b. By the openings 516, the movable electrode 514a and the wirings 514b are physically separated to be insulated from the other portions. Thus, a substrate including the first layer 515 is formed. Here, after the first etching, separation layer etching or the like, which is a step of weakening the separation layer, may be conducted.

A substrate including a second layer 535 is formed. For the method of forming the substrate including a second layer 535, a method similar to the method of forming the substrate including the second layer 415 shown in FIGS. 18A1 to 18B2, can be employed. A second layer 534 having a lamination structure is formed over a second substrate 531. The second layer 534 is a stack of a protective layer 532 and second conductive layers 533.

Then, as shown in FIG. 20C, the substrate including the first layer 515 and the substrate including the second layer 535 are attached to each other with a first spacer layer 518 (anisotropic conductive adhesive) interposed therebetween. Accordingly, the wirings 514b of the first layer 514 are electrically connected to the second conductive layers 533 of the second layer 534. Then, the first substrate 509 is separated from the first layer 514 so that the first substrate 509 is removed. Here, not only the first substrate 509 but also the protective layer 510 and the separation layer 511 are also separated.

Then, as shown in FIG. 20D, a protective substrate 520 is attached to the first layer 514 with a second spacer layer 519 (anisotropic conductive adhesive) interposed therebetween, so as to protect a microstructure 521. By provision of the protective substrate 520, a space portion 523 is each provided between the first layer 514 and the second layer 534 and between the first layer 514 and the protective substrate 520.

Here, for the method of attaching the substrate including the first layer 515 and the substrate including the second layer 535 with the second spacer layer 519 (anisotropic conductive adhesive) interposed therebetween, the method of separating the first substrate 509 from the first layer 514, and the method of attaching the protective substrate 520, the methods described in Embodiment Mode 4 or the like can be employed. When the first layer 502 is processed into a comb shape, the structural layer of the microstructure 521 thus formed can move in parallel directions to the second substrate 531. For example, when external force is applied to the microstructure, the structural layer can move in parallel directions to the second substrate 531, and therefore, the microstructure can function as a sensor by sensing the movement. Alternatively, opposite electrodes can be formed in the movable electrode 514a and the first conductive layer 513 so that the structural layer moves by electrostatic attraction. Accordingly, the microstructure can function as an actuator. Further, by utilizing this actuator, a switch, a capacitor having variable capacitance, or the like can be manufactured.

When using the manufacturing method of the microstructure described in this embodiment mode, the microstructure can be manufactured without sacrificial layer etching. That is, when this embodiment mode is carried out, the effects (a) to (i) described in Embodiment Modes 1 and 2 can be obtained. Since a similar step to the sacrificial layer etching is conducted in the separation and the attachment, the step can be completed in a considerably short time. In addition, the microstructure does not contact a liquid etchant as in wet etching. Accordingly, a microstructure can be manufactured so as not to generate attachment of the structural layer and the substrate by a capillary phenomenon. Thus, when applying the present invention, the time required for manufacturing can be reduced and generation of defects can be reduced.

This embodiment mode can be implemented by being freely combined with any of other embodiment modes.

Embodiment Mode 6

Embodiment Mode 6 will describe an example of the function and shape of the microstructure which can be manufactured by any of the methods described in Embodiment Modes 1 to 5.

Figure 21A:
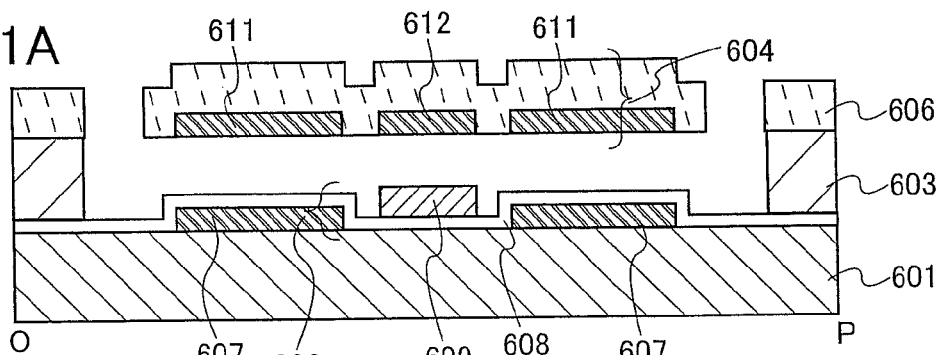
FIGS. 21A to 21D show manufacturing methods of a microstructure of the present invention.

FIG. 21A is a cross sectional view of a microstructure functioning as a switch (also referred to as a microswitch). The microstructure includes a second layer 602 and a spacer layer 603 formed over a second substrate 601, and a first layer 604 attached to the second substrate 601 by the spacer layer 603. The first layer 604 and the second layer 602 can be formed with a single layer structure or a lamination structure using an arbitrary material. This example shows a case where the first layer 604 includes first conductive layers 611 and 612 and a first insulating layer 606, and the second layer 602 includes second conductive layers 607, a second insulating layer 608, and a third conductive layer 609.

Figure 21B:
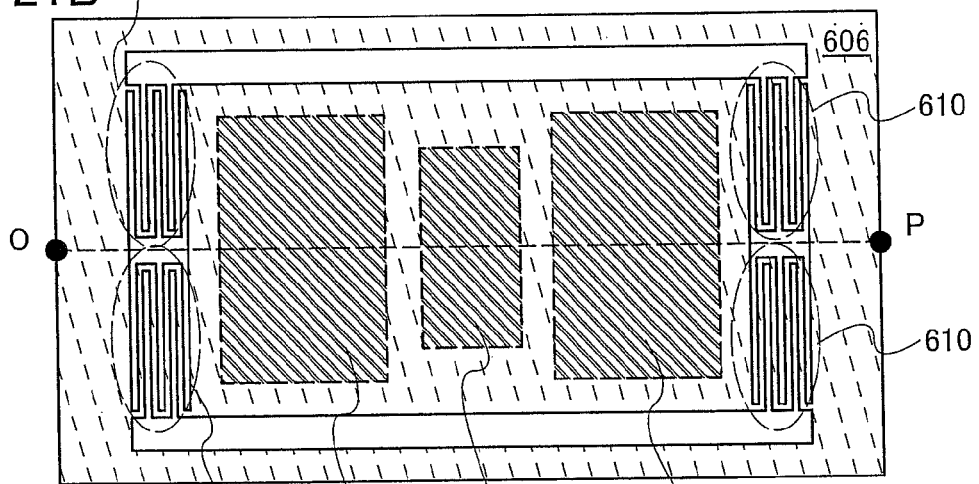

FIG. 21B is a top view of the first layer 604 which is included in the microstructure. By the first layer 604, a structural layer supported by four beams 610, each of which has a bent serpentine shape, is formed. The beams 610 are formed of the first insulating layer 606. The structural layer includes electrodes which move the microstructure by electrostatic attraction (first conductive layers 611 in FIG. 21B, also referred to as pulled electrodes) and an electrode for transferring a signal in response to the contact or change in capacitance (second conductive layer 612 of the structural layer in FIG. 21B). Further, the second conductive layers 607 shown in FIG. 21A function as electrodes which are opposite to the pulled electrodes (first conductive layers 611).

When a voltage is applied between upper and lower pulled electrodes which are formed of the opposite first conductive layers 611 and second conductive layers 607, the structural layer is pulled to the second substrate 601 side (lower direction) by electrostatic attraction. Then, the electrode (second conductive layer 612) for transferring a signal, formed of the first conductive layer 605 contacts the third conductive layer 609, or the distance between the first conductive layer 605 and the third conductive layer 609 changes, so that the capacitance changes. Accordingly, the microswitch functions as a switch.

As is also described in the above embodiment mode, when the beams 610 for supporting the structural layer are made to be thin, the spring constant can be lowered, and therefore the driving voltage at the time of pulling the structural layer can be reduced. When the beams 610 are each processed into a bent serpentine shape, the area of the microstructure can be reduced.

Such a microswitch, differently from a semiconductor element, transfers a signal by the contact of the conductive layers and the conductive layers have a distance therebetween when they do not transfer a signal. Accordingly, a switch with low loss at the transfer of the signal and superior in insulation properties at the time when a signal is not transferred, can be obtained.

Figure 21C:
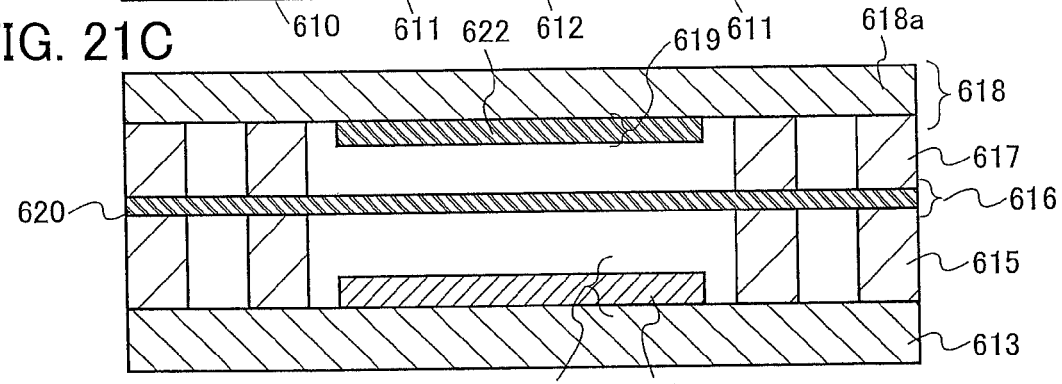

Next, FIG. 21C is a cross sectional view of a microstructure (also referred to as a sensor) which functions as a movement sensor. The microstructure includes a second layer 614, a first spacer layer 615, a first layer 616, a second spacer layer 617, and a substrate including a third layer 618, over a second substrate 613. The first layer 616 is attached to the second substrate 613 by the first spacer layer 615. The substrate including a third layer 618 is attached to the first layer 616 by the second spacer layer 617. The substrate including a third layer 618 includes a third layer 619 having a single layer structure on a substrate 618a.

The first layer 616, the second layer 614, and the third layer 619 can be formed with a lamination structure using an arbitrary material. In this example, the first layer 616 includes a first conductive layer 620, the second layer 614 includes a second conductive layer 621, and the third layer 619 includes a third conductive layer 622. Alternatively, the first layer 616, the second layer 614, and the third layer 619 may each have a lamination structure in which insulating layers or the like are stacked (not shown in FIG. 21C).

Figure 21D:
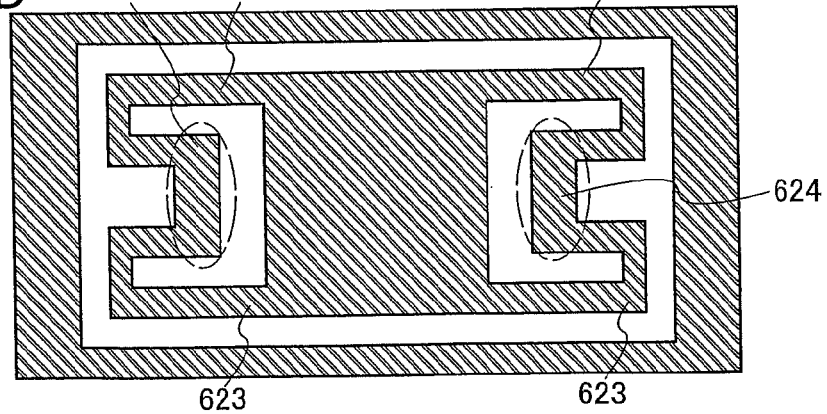

FIG. 21D is a top view of the first layer 616 included in the microstructure. The first layer includes bent beams 623. A microstructure supported by the substrate is formed at end portions where the beams for supporting the structural layer are bent, that is, portions right next to the structural layer (portions surrounded by circles in FIG. 21D). The portions where the beams 623 for supporting the structural layer are fixed to the substrate, are referred to as anchors 624. The anchors 624 are fixed by the first spacer layer 615 and the second spacer layer 617. When external force is applied in a perpendicular direction to the substrate surface to the microstructure including the first layer 616 having such a shape, the structural layer can move in the direction in which the force is applied. Therefore, the microstructure can function as a sensor by sensing the movement of the structural layer.

If the structural layer is supported by the bent beams 623 in this manner, the vibration in the directions parallel to the substrate surface can be reduced and the movement in perpendicular directions to the substrate surface can become easy to be sensed. When the thickness or the lamination structure of the bent beams is changed, the spring constant of the microstructure can be changed to a plurality of levels. A beam structure shown by a model supported by a plurality of springs (normally, two to three springs) can be formed, and for example, the microstructure can be supported by a soft spring at the start and as the range of movement becomes larger, the microstructure is supported by a harder spring, so that the movement of the microstructure can be controlled.

Such a sensor can detect the movement amount of the first layer 616 by the change in capacitance between the first layer 616 and the second layer 614 and the change in capacitance between the first layer 616 and the third layer 619. In the case where a material whose electric characteristic changes by distortion is used for the beams 623 of the first layer 616, the movement amount of the first layer 616 can be detected by the electric characteristic. The detection accuracy of such a sensor can be heightened in accordance with the resolution of external force (physical quantity) that is a detection object.

Figure 22A:
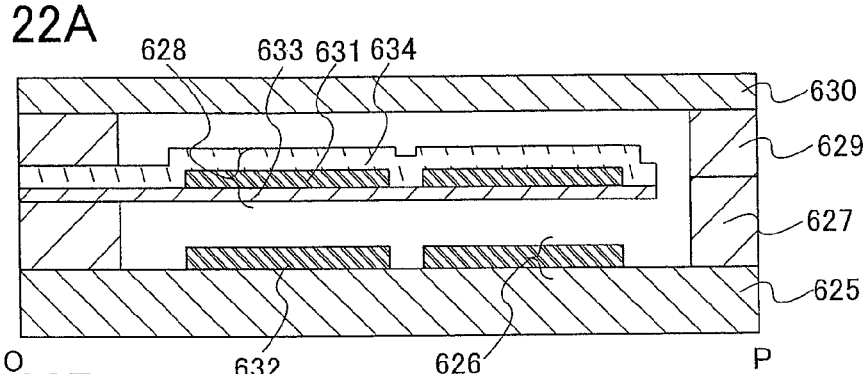
FIGS. 22A to 22D show manufacturing methods of a microstructure of the present invention.

Next, FIG. 22A is a cross sectional view of a microstructure with a cantilever structure, which functions as a variable capacitor (the microstructure is also referred to as a varactor). The microstructure includes a second layer 626, a first spacer layer 627, a first layer 628 attached to the second substrate 625 by the first spacer layer 627, a second spacer layer 629, and a protective substrate 630 which is attached to the first layer 628 by the second spacer layer 629, over a second substrate 625.

The first layer 628 and the second layer 626 can be formed with a single layer structure or a lamination structure using an arbitrary martial. In this example, the first layer 628 includes a first conductive layer 631, and the second layer 626 includes a second conductive layer 632. Further, the first layer 628 and the second layer 626 may have a lamination structure in which insulating layers or the like are stacked. Here, an example where the first layer 628 includes a first insulating layer 633 and a second insulating layer 634 with the first conductive layer 631 interposed therebetween, is described.

Figure 22B:
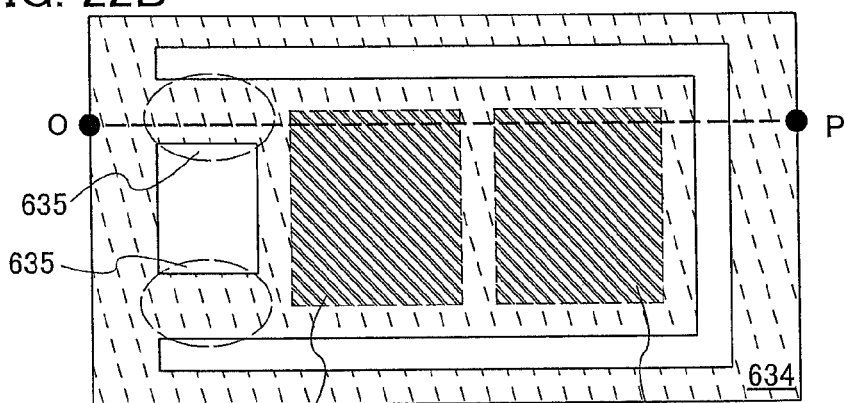

FIG. 22B is a top view of the first layer 628 included in the microstructure. The first layer 628 (structural layer) has a cantilever shape in which a movable portion is supported by two support beams 635.

That is, the first layer (structural layer) 628 includes a first region, a second region and a third region. The first region is a region fixed by the first spacer layer 627 and the second spacer layer 629. The first spacer layer 627 is provided between a surface of the second substrate 625 and the first region and fixes the first region to the second substrate 625. In addition, the second spacer layer 629 is provided between the first region and the protective substrate 630 and fixes the first region to the protective substrate 630. A space portion is each provided between the surface of the second substrate 625, and the second region and the third region, and between the protective substrate 630, and the second region and the third region. The second region faces the surface of the second substrate 625 and the protective substrate 630, with a distance therebetween, and is a movable region. The third region functions as a spring and connects the fixed first region to the movable second region.

The structural layer includes an electrode 631a which moves the microstructure by electrostatic attraction (the electrode next to the support beams in FIG. 22B, also referred to as a pulled electrode) and an electrode 631b which forms a capacitor (the electrode at an end of the cantilever in the drawing). These electrodes are formed of the first conductive layer 631. Further, one of the second conductive layer 632 (left one in FIG. 22A) functions as an electrode which is opposite to the pulled electrode 631a, and the other (right one in FIG. 22A) forms a capacitor which is opposite to the electrode 631b.

When a voltage is applied between upper and lower pulled electrodes which are formed of the opposite first conductive layer 631 and second conductive layer 632, the structural layer is pulled to the second substrate 625 side (lower direction) by electrostatic attraction. Then, the distance between capacitor electrodes formed of the first conductive layer 631 and the second conductive layer 632 changes, so that the capacitance changes. Accordingly, the microstructure shown in FIGS. 22A and 22B can function as a variable capacitor.

When the cantilever structure is employed in this manner, the spring constant of the microstructure can be lowered, and therefore the voltage for moving the structural layer can be reduced. When the beams 635 for supporting the microstructure are separated into two parts as shown in FIG. 22B, the spring constant can be further reduced.

As in the above-described three examples, by attachment of the second substrate after processing of the first layer into a certain shape by etching, microstructures having various shapes can be formed. However, the microstructure can also be manufactured in the following manner: without processing of the shape of the first layer by etching, the first layer is directly attached to the second substrate. An example of a microstructure manufactured by attachment of the second layer without processing of the first layer by etching, will be described.

Figure 22C:
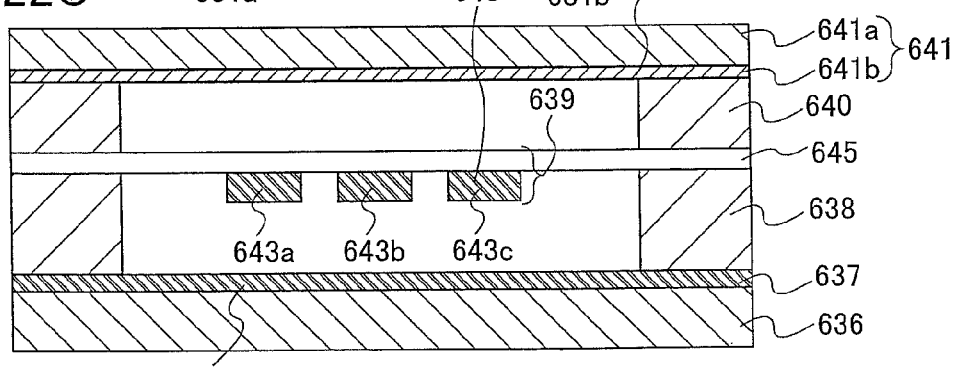

First, FIG. 22C is a cross sectional view of a microstructure which functions as a waveguide for transferring a signal with a high frequency. The microstructure includes a second layer 637, a first spacer layer 638, a first layer 639 attached to the second substrate 636 by the first spacer layer 638, a second spacer layer 640, and a substrate including a third layer 641 which is attached to the first layer 639 by the second spacer layer 640, over a second substrate 636. Reference numeral 641a denotes a substrate, and reference numeral 641b denotes the third layer.

The first layer 639, the second layer 637, and the third layer 641b can have a lamination structure using an arbitrary material. In this example, the first layer 639 includes first conductive layers 643 and a first insulating layer 645, the second layer 637 includes a second conductive layer 642, and the third layer 641b includes a third conductive layer 644. Alternatively, theses layers may have a lamination structure in which insulating layers or the like are stacked. Here, an example where the first layer 639 includes the first insulating layer 645, will be described.

The first layer 639 includes three conductive layers 643a to 643c which are formed in parallel. The two conductive layers 643a and 643c at both ends, the second conductive layer 642, and the third conductive layer 644 are set at a grounding potential (also referred to as a ground potential, an earth, or a reference potential), and the one conductive layer 643b which is located at a center of the first conductive layers 643 is made to serve as a signal line; accordingly, a waveguide for transferring a signal with a high frequency can be formed.

When manufacturing is performed in the above-described manner, a microstructure which functions as a waveguide can be formed without processing the first layer by first etching. In addition, when the signal line is separated by a space and a periphery of the signal line is shielded by a ground potential, the waveguide is less subjected to noises from the outside and loss at the time of transfer can be reduced.

Figure 22D:
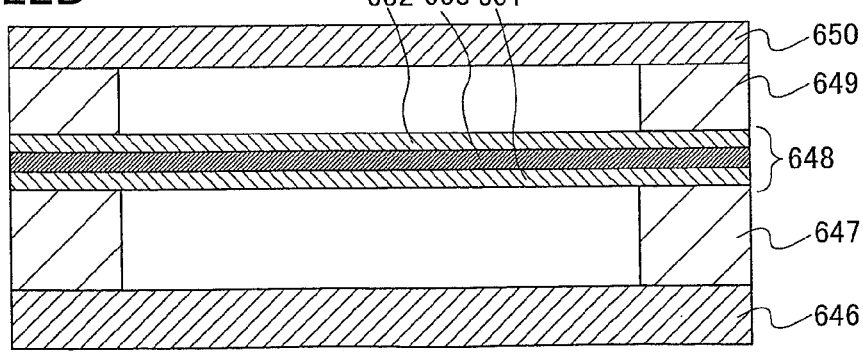

FIG. 22D is a cross sectional view of a microstructure as a piezoelectric element. The microstructure includes a first protective substrate 646, a first layer 648 attached to the first protective substrate 646 by a first spacer layer 647, a second spacer layer 649, and a second protective substrate 650 attached to the first layer 648 by the second spacer layer 649.

The first layer 648 can have a lamination structure using an arbitrary material, and a first conductive layer 651, a second conductive layer 652, and a piezoelectric layer 653 interposed between the first conductive layer 651 and the second conductive layer 652 are included. The piezoelectric layer 653 is formed using a piezoelectric material such as ZnO, AlN, or PZT. Further, the first layer 648 may be formed of a plurality of piezoelectric layers and conductive layers which are stacked. Further, a second layer and a third layer having a lamination structure including an arbitrary material may be formed on the first protective substrate 646 and the second protective substrate 650.

The piezoelectric element in which the piezoelectric layer 653 is interposed between the first conductive layer 651 and the second conductive layer 652 becomes a microstructure which functions as a filter for extracting only a signal having a particular frequency from AC signals having a plurality of frequency bands, a sensor for generating a voltage by the movement of the structural layer owing to pressure or acceleration, or an actuator which can move when being applied with a voltage.

Specifically, a plurality of piezoelectric elements are connected in parallel or in series, thereby forming a filter which extracts only a signal with a particular frequency from AC signals with a plurality of frequency bands. In addition, when the first layer 648 is formed to have a movable structure, the first layer can move by being applied with external force such as pressure or acceleration, and accordingly the difference in electric potential between the first conductive layer 651 and the second conductive layer 652 is generated. The microstructure can function as a sensor by sensing the difference. Further, when a voltage is applied between the first conductive layer 651 and the second conductive layer 652, the first layer 648 can move, and an actuator like a micropump which utilizes this movement can be formed.

As described in this embodiment mode, according to the manufacturing method of the microstructure of the present invention, by processing of the first layer by first etching, microstructures having various shapes can be formed. Further, according to the manufacturing method of the microstructure of the present invention, by formation of the first layer, the second layer and the third layer having a lamination structure using an arbitrary material, microstructures having various shapes can be formed.

This embodiment mode can be implemented by being freely combined with any of other embodiment modes.

Embodiment Mode 7

A micromachine of the present invention includes an electric circuit and a microstructure. The electric circuit includes a plurality of semiconductor elements, and the microstructure includes a structural layer and a space portion adjacent to the structural layer. The electric circuit is electrically connected to the microstructure, and controls the operation of the microstructure or processes a received minute signal which is output from the microstructure. In this embodiment mode, a manufacturing method of a microstructure and a semiconductor element which forms an electronic circuit over the same substrate, will be described with reference to drawings.

Figure 23A:
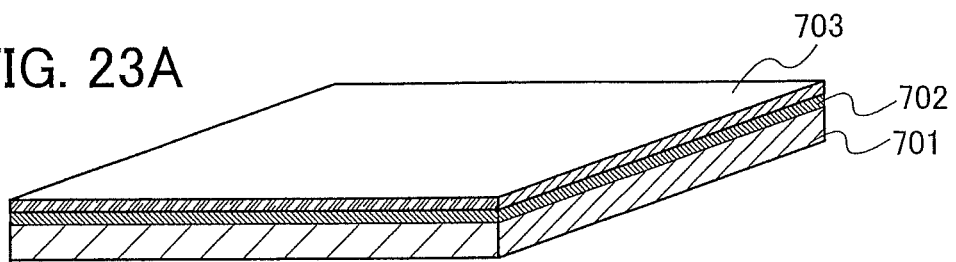
FIGS. 23A to 23C show a manufacturing method of a microstructure of the present invention.

In the manufacturing method of the micromachine of the present invention, a separation layer 702 and a first layer 703 are formed over a first substrate 701 as shown in FIG. 23A. The first layer 703 can be formed with a lamination structure using an arbitrary material, and forms a structural layer of a microstructure. In the case of forming the first layer 703 with a lamination structure, although a plurality of layers can be formed continuously, film formation and processing can be repeated to form a lamination structure. The processing of the formed layer can be conducted by formation of a resist mask by photolithography and etching.

Figure 23B:
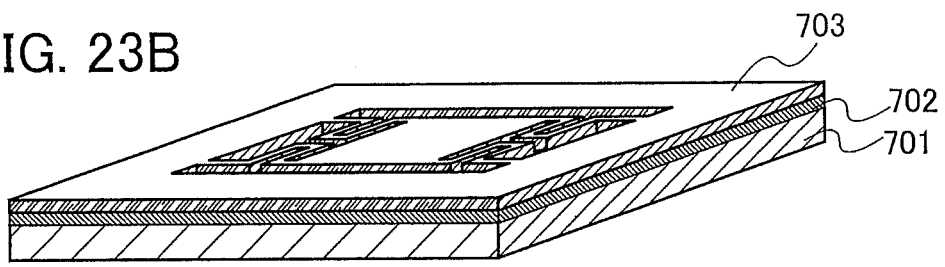

Then, as shown in FIG. 23B, the first layer 703 is processed by first etching, so that a shape of the structural layer is formed. The first etching can be, similarly to the processing of the layer for forming the above-described first layer 703, conducted by formation of a resist mask by photolithography and etching. In the case of forming the first layer 703 with a lamination structure using a plurality of different materials, dry etching is applied for the processing of the first layer 703 by the first etching, so that stacked layers can be continuously processed by switching the etching gas.

Figure 23C:
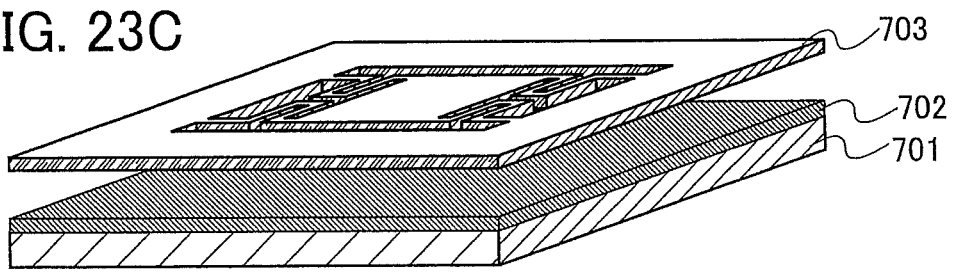

Then, as shown in FIG. 23C, the first layer 703 is separated from the first substrate 701. The separation of the first layer 703 can be conducted from an interface between the separation layer 702 having a low adhesiveness (or having the adhesiveness capable of being lowered) and the first layer 703. For the formation method of the separation layer 702 and the separation method of the first layer, the methods described in Embodiment Mode 1 or the like can be applied.

Figure 24A:
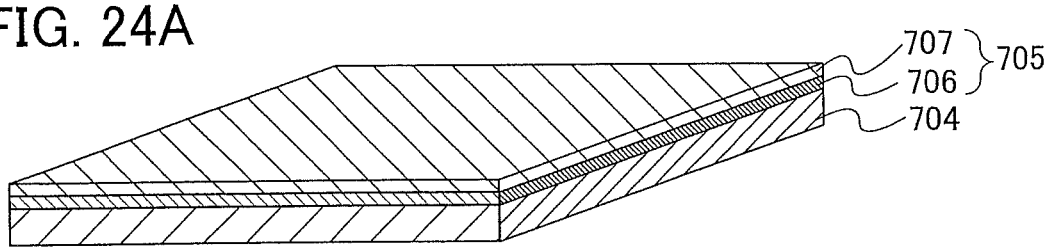
FIGS. 24A to 24C show a manufacturing method of a microstructure of the present invention.

Next, in the manufacturing method of the micromachine of the present invention, a second layer 705 is formed over a second substrate 704 as shown in FIG. 24A. The electric circuit included in the micromachine of the present invention is formed by formation of a semiconductor element in the second layer 705. Accordingly, the second layer 705 includes a layer including the semiconductor element 706 and a layer for forming the microstructure 707 which is opposite to the first layer.

Figure 24B:
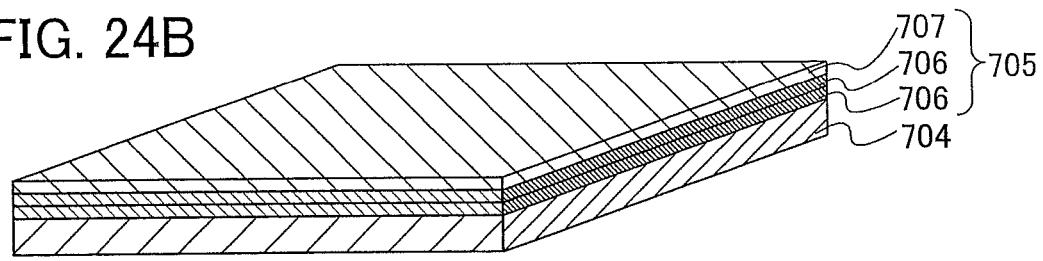

Alternatively, a plurality of layers including a semiconductor element may be stacked. FIG. 24B shows a case where two layers including a semiconductor element 706 are stacked over the second substrate 704. In the case of stacking the layers including a semiconductor element 706 in this manner, the layers may be formed directly over the second substrate 704, or a plurality of the layers including a semiconductor element 706 which is formed over another substrate can be stacked over the second substrate 704 by using a separation process described in the above embodiment mode.

Figure 24C:
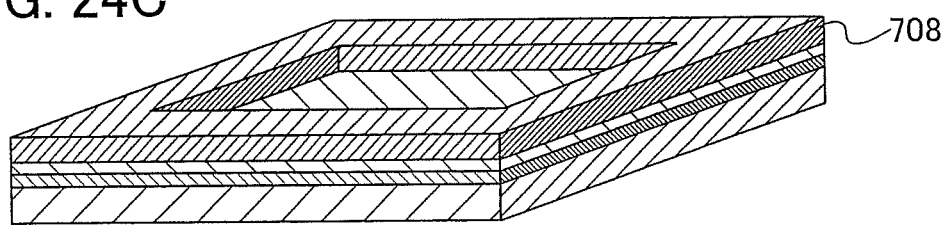

Then, as shown in FIG. 24C, a spacer layer 708 is formed on a selected region over the second substrate over which the second layer 705 is formed. The spacer layer 708 can be formed with a single layer structure or a lamination structure using an insulating inorganic compound or an insulating organic compound, as described in Embodiment Mode 2 or the like. As the method for forming the spacer layer on a selected region, a screen printing method, a droplet discharging method typified by an ink-jet method, or the like can be used. These methods are effective in many cases when an organic material capable of adjusting viscosity by a solvent is used particularly. Alternatively, when using a photosensitive material such as a resist, the spacer layer can be formed only by film formation, exposure to light and development.

Figure 25A:
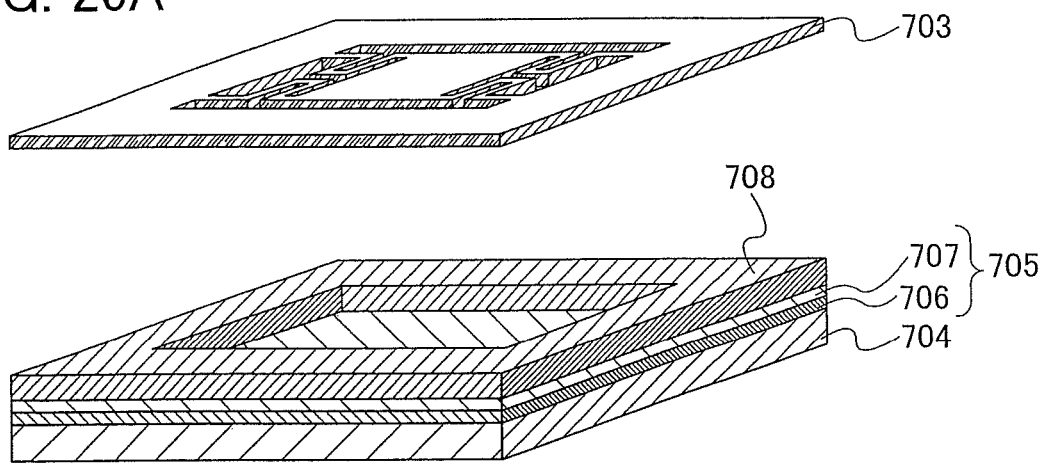
FIGS. 25A and 25B show a manufacturing method of a microstructure of the present invention.
Figure 25B:
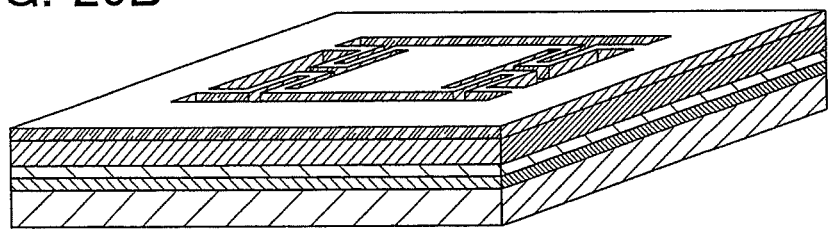

Then, in the manufacturing method of the micromachine of the present invention, as shown in FIGS. 25A and 25B, the first layer 703 manufactured in the above-described process and the second substrate 704 over which the second layer 705 is formed are attached with a spacer layer 708 interposed therebetween. Thus, the first layer 703 and the second layer 705 are attached with the spacer layer 708 interposed therebetween, thereby forming a micromachine including an electric circuit and a microstructure.

Next, a manufacturing method of the layer including a semiconductor element, which is included in the second layer, will be described with reference to the drawings. In the drawings, the FIGS. 26A1, 26B1, 27A, 28A and 29A are top views and the FIGS. 26A2, 26B2, 27B, 28B and 29B are cross sectional views taken along a dashed line O-P of the top views.

The microstructure and the semiconductor element included in the micromachine of the present invention can be manufactured over an insulating substrate such as a glass substrate, a quartz substrate, or a plastic substrate. Alternatively, a conductive substrate of a metal or the like, a semiconductor substrate of silicon, germanium, a compound of silicon and germanium, or the like can also be used. In the case of using the above-mentioned substrate, the substrate can be used directly, or an insulating layer can be formed over a surface of the substrate and then the substrate can be used.

For example, if a microstructure and a semiconductor element are formed over a substrate, which is thin and soft like a plastic film, a thin and highly-flexible micromachine can be manufactured. In the case of manufacturing a microstructure and a semiconductor element with the use of a glass substrate, the substrate can be polished from the rear side to be thin, thereby forming a thin micromachine.

In this embodiment mode, a layer serving as a base (base layer 710) is formed over a substrate including an insulating surface 709 (FIG. 26A2). The base layer 710 can be formed using an insulating film of silicon oxide, silicon nitride, silicon oxynitride, or the like. The base layer 710 may be formed of a single layer containing the above-mentioned material, or may be formed of a stack containing a plurality of the materials. This embodiment mode will describe an example where the base layer has a two-layered structure.

As a first layer of the base layer 710, a silicon oxynitride film can be formed by a plasma CVD method using $SiH_4$, $NH_3$, $N_2O$, and $H_2$ as reactive gases with a thickness of 10 nm to 200 nm (preferably 50 nm to 100 nm). In this embodiment mode, a silicon oxynitride film having a film thickness of 50 nm is formed. After that, as a second layer of the base layer 710, a silicon oxynitride film can be formed by a plasma CVD method using $SiH_4$ and $N_2O$ as reactive gases with a thickness of 50 nm to 200 nm (preferably 100 nm to 150 nm). In this embodiment mode, a silicon oxynitride film having a thickness of 100 nm is formed.

Then, over the base layer 710, gate electrodes 711 forming the semiconductor elements (first conductive layers) are formed. The gate electrodes 711 are formed by film formation of a conductive metal such as molybdenum or tungsten or a compound thereof by a sputtering method, a CVD method, or the like, and processing by photolithography and etching (FIG. 26A1).

The processing of the gate electrodes 711 is conducted by etching (specifically, anisotropic dry etching). As an example of the anisotropic dry etching, ICP (Inductively Coupled Plasma) etching can be used. At this time, workability can be heightened by appropriate adjustment of etching conditions (such as the electric power to be applied to a coil-shaped electrode, the electric power to be applied to an electrode on the substrate 709 side, and the electrode temperature on the substrate side). As an etching gas for processing the first conductive layer, a second conductive layer and the gate electrodes, a chlorine-based gas typified by $CCl_4$, or a fluorine-based gas typified by $CF_4$, $SF_6$, or $NF_3$, with which $O_2$ is combined, can be used.

By adjustment of the above etching conditions, the gate electrodes 711 can be processed into an arbitrary shape such as a trapezoidal shape with a taper angle (FIG. 26A1). Here, the taper angle refers to an obtuse angle between the substrate and a layer side face, and a cross section of a layer with a taper angle is trapezoidal. Alternatively, the layer for forming the gate electrodes can be formed of a stack using different materials in order to improve processability of the above-described etching. When the gate electrode is formed to have a shape with a taper angle as described above, a layer to be formed over a step can be uniformly formed.

Next, a first insulating layer 712 (gate insulating layer) is formed over the gate electrodes 711. The first insulating layer 712 can be formed, similarly to the base layer 710, by a plasma CVD method or a sputtering method using a material containing silicon such as silicon oxide or silicon nitride. For example, a silicon oxynitride film (composition ratio: Si=32%, O=59%, N=7%, and H=2%) can be formed with a thickness of 115 nm by a plasma CVD method as the first insulating layer 712. The first insulating layer 712 is not limited to a silicon oxynitride film, and another insulating film containing silicon may be used in a single layer structure or a lamination structure.

Further, as a material of the first insulating layer 712, a metal oxide having high dielectric constant, for example, hafnium oxide, titanium oxide, or the like can be used. When such a high dielectric constant material is applied to the first insulating layer, the semiconductor element can be driven at a low voltage; thus, a low power consumption micromachine can be manufactured.

Further, the first insulating layer 712 can be formed by high density plasma treatment. The high density plasma treatment is a plasma treatment in which the plasma density is $1\times10^{11}$ cm$^{-3}$ or more, preferably $1\times10^{11}$ cm$^{-3}$ to $9\times10^{15}$ cm$^{-3}$ and a high frequency such as a microwave (for example, frequency: 2.45 GHz) is used. When plasma is produced under such conditions, the electron temperature is as low as 0.2 eV to 2 eV. Thus, by high density plasma, the feature of which is low electron temperature, a film can be formed with low plasma damage and few defects because the kinetic energy of the active species is low.

A substrate is set in a film formation chamber capable of such plasma treatment, the distance between an electrode for generating plasma, which is an antenna, and a target is set to 20 mm to 80 mm, and preferably 20 mm to 60 mm, and then film formation process is carried out. Such high density plasma treatment can make a low temperature process (substrate temperature: 400° C. or lower) possible. Accordingly, glass or plastic having low thermostability can be used as the substrate.

The film formation atmosphere of such an insulating film can be a nitrogen atmosphere, or an oxygen atmosphere. The nitrogen atmosphere is typically a mixed atmosphere of nitrogen and a rare gas, or a mixed atmosphere of nitrogen, hydrogen, and a rare gas. At least one of helium, neon, argon, krypton, and xenon can be used as the rare gas. Further, the oxygen atmosphere is typically a mixed atmosphere of oxygen and a rare gas; a mixed atmosphere of oxygen, hydrogen, and a rare gas; or a mixed atmosphere of dinitrogen monoxide and a rare gas. At least one of helium, neon, argon, krypton, and xenon can be used as the rare gas.

An insulating film formed by the high density plasma treatment is dense and causes little damage to other films. Further, an insulating film formed by high density plasma treatment can improve the state of an interface between the insulating film and a layer to be in contact therewith. For example, when the first insulating layer is formed by high density plasma treatment, a state of an interface with a semiconductor layer formed over the insulating layer can be improved. Accordingly, electric characteristics of the semiconductor element can be improved. In addition, when the insulating layer is formed over a microstructural layer in this manner, damage to the layer which forms the microstructure can be reduced, and strength of the structure layer can be maintained. The high density plasma treatment can be employed not only for forming the first insulating layer but also for forming the base layer or another insulating film.

Next, first semiconductor layers 713 for forming the semiconductor elements are formed over the first insulating layer 712 (FIG. 26A1). The first semiconductor layers 713 can be formed of a material containing silicon. The material containing silicon may be silicon, a silicon-germanium material containing approximately 0.01 atomic % to 4.5 atomic % of germanium, or the like. In the present invention, an amorphous semiconductor layer is formed and heat treatment is conducted to form a crystallized crystalline semiconductor layer. A heating furnace, laser irradiation, or irradiation with light from a lamp instead of a laser beam (hereinafter referred to as lamp annealing), or a combination thereof may be used for the heat treatment.

In the case of using laser irradiation for the heat treatment for crystallizing the amorphous semiconductor layer so as to form a crystalline semiconductor layer, a continuous wave laser beam (a CW laser beam) or a pulsed laser beam can be used. As the laser beam, a beam oscillated from one of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser or a combination thereof may be used. Large grain crystals can be obtained by irradiation with a fundamental wave or one of second to fourth harmonics of such a laser beam. For example, a second harmonic (532 nm) or a third harmonic (355 nm) of an Nd:$YVO_4$ laser (fundamental wave: 1064 nm) can be used. At this time, the laser beam is required to have an energy density of approximately 0.01 MW/cm$^2$ to 100 MW/cm$^2$ (preferably 0.1 MW/cm$^2$ to 10 MW/cm$^2$). Further, the irradiation is conducted at a scanning speed of approximately 10 cm/sec to 2000 cm/sec.

Note that a fundamental wave laser beam of a continuous wave laser and a harmonic laser beam of a continuous wave laser may be used for the irradiation. Alternatively, a fundamental wave laser beam of a continuous wave laser and a harmonic laser beam of a pulsed laser may be used for the irradiation. By irradiation with a plurality of laser beams, the energy can be supplemented.

Further, a pulsed laser beam oscillated from a laser at a repetition rate such that after a semiconductor layer is melted by the pulsed laser beam, it can be irradiated with the next pulsed laser beam before it is solidified, may be used. A crystal grain continuously grown in the scan direction can be obtained using a laser beam oscillated at such repetition rate. The specific repetition rate of the laser beam is 10 MHz or more, which is in a significantly higher frequency band than the generally used frequency band of several dozen Hz to several hundred Hz.

In the case of using a heating furnace for another heat treatment, an amorphous semiconductor layer is heated at 400° C. to 550° C. for 2 to 20 hours. In that case, the temperature is preferably set at multiple levels in the range of 400° C. to 550° C. so as to be gradually increased. Since hydrogen or the like in the amorphous semiconductor layer is released by an initial heating process at a low temperature of about 400° C., film roughness due to crystallization can be reduced. Moreover, a metal element which can promote crystallization, for example, nickel is preferably formed over an amorphous semiconductor layer thereby reducing the heating temperature. As the metal element, a metal such as Fe, Ru, Rh, Pd, Os, Ir, Pt, Cu, or Au can be used. The above-mentioned laser irradiation may be conducted in addition to the heat treatment to form the crystalline semiconductor layer.

Since a metal element promoting crystallization is a contaminant of a semiconductor device, it may be removed after the crystallization. In this case, after crystallization by heat treatment or laser irradiation, a layer to be a gettering sink is formed over a semiconductor layer and heated, thereby moving the metal element into the gettering sink. A polycrystalline semiconductor layer or a semiconductor layer added with impurities can be use for the gettering sink. For example, a polycrystalline semiconductor layer added with an inert element such as argon can be formed over the semiconductor layer and can be used as a gettering sink. By addition of an inert element, distortion can be generated in the polycrystalline semiconductor layer, and the metal element can be efficiently captured using the distortion. Alternatively, the metal element can be captured by formation of a semiconductor layer added with an element such as phosphorus.

The first semiconductor layer may be a silicon layer in which a minute crystal grain is contained in amorphous silicon. For example, crystal grains each having a radius of several tens of nanometers to several micrometers can be formed by a CVD method and appropriate selection of silicon deposition conditions. Although the method in which high density plasma treatment is used to form the first insulating layer is described, the semiconductor layer crystallized as described above may be subjected to high density plasma treatment. The high density plasma treatment can modify the surface of the semiconductor layer. Accordingly, an interface state can be improved, and electric characteristics of the semiconductor element can be improved.

Then, second semiconductor layers 714 which are added with an impurity element imparting n-type conductivity or an impurity element imparting p-type conductivity and have an amorphous structure are formed over the first semiconductor layers 713 formed above. As an impurity element imparting n-type conductivity, phosphorus or arsenic is typically used, and as an impurity element which imparts p-type conductivity, boron can be used. It is desirable that an impurity element is added to the semiconductor including the impurity, in a concentration range of $1\times10^{20}/cm^3$ to $1\times10^{21}/cm^3$. In this embodiment mode, an example of forming amorphous semiconductor added with an impurity element imparting n-type conductivity as the second semiconductor layers 714, is described.

Next, the above-described first semiconductor layers 713 and second semiconductor layers 714 are processed into arbitrary shapes, thereby forming semiconductor layers 715 for forming semiconductor elements (FIGS. 26A1 and 26A2). The processing of the semiconductor layers 715 can be conducted by photolithography and etching, similarly to the above-described example.

Then, second conductive layers 716 are formed over the second semiconductor layers 714 (FIGS. 26B1 and 26B2). The second conductive layers 716 can be formed by film formation of a conductive metal element such as aluminum, titanium, molybdenum, tungsten or silicon, a compound thereof, or the like and processing.

Since the second conductive layers 716 become conductive layers connected to a source electrode and a drain electrode of the semiconductor elements, they can be processed so as to form an electric connection relation for forming a micromachine. At this time, the second conductive layers 716 are not formed over portions to be channel regions of the semiconductor elements. Using the second conductive layers 716 as masks, a part of the second semiconductor layers 714 and the first semiconductor layers 713 is removed by etching, thereby forming channel regions 717 of the semiconductor elements (FIGS. 26B1 and 26B2). In this embodiment mode, by the above-described process, n-channel thin film transistors are formed as the semiconductor elements (FIGS. 26B1 and 26B2).

Figure 27A:
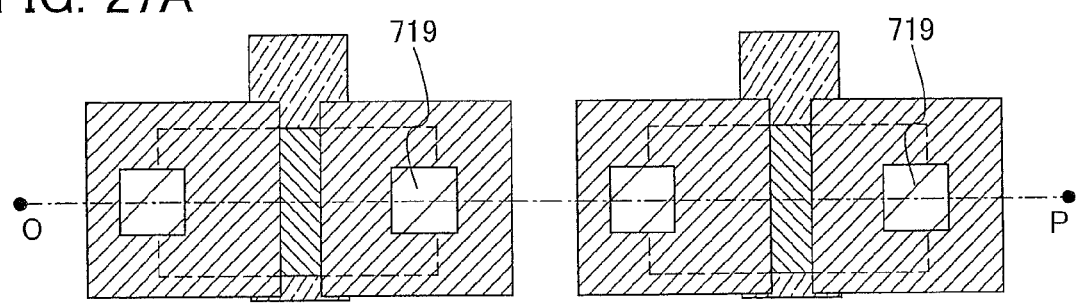
FIGS. 27A and 27B show a manufacturing method of a layer including a semiconductor element of the present invention.

Next, a second insulating layer 718 is formed to cover the n-type semiconductor elements and a portion to be the microstructure (FIG. 27A). The second insulating layer 718 can be formed of an insulating inorganic compound, an insulating organic compound, or the like. The second insulating layer 718 can be formed of the above-mentioned insulating material with a single layer structure or a lamination structure including two or more layers. This second insulating layer 718 insulates the second conductive layers 716 from conductive layers to be formed thereover and reduces parasitic capacitance.

As an inorganic material which forms the second insulating layer 718, silicon oxide or silicon nitride can be used. As an organic material, polyimide, acrylic, polyamide, polyimideamide, resist, benzocyclobutene, siloxane, or polysilazane can be used. Note that a siloxane resin refers to a resin having a skeletal structure including a bond of silicon and oxygen, and corresponds to a resin including a bond of Si—O—Si. As a substituent of the siloxane resin, an organic group (for example, an alkyl group or aromatic hydrocarbon) containing at least hydrogen or a fluoro group can be used. Polysilazane is formed using a polymer material having a bond of silicon and nitrogen as a starting material.

Figure 27B:
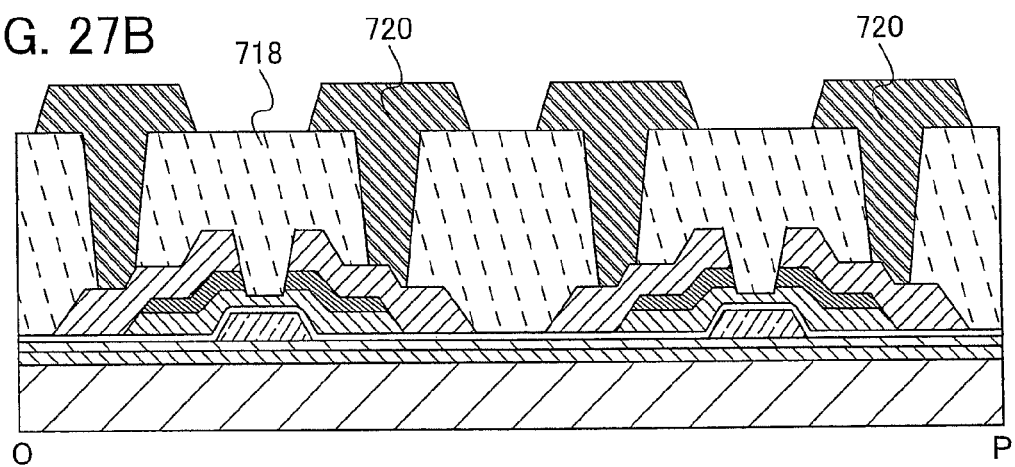

Then, the second insulating layer 718 is etched so that contact holes 719 are formed (FIGS. 27A and 27B). The etching treatment at this time can be conducted by dry etching treatment or a wet etching treatment. In this embodiment mode, an example of forming first contact holes by anisotropic dry etching is described.

Next, third conductive layers 720 are formed over the second insulating layer 718 and the contact holes 719 (FIG. 27B). The third conductive layers 720 can be formed by formation of a conductive metal element, a compound thereof, or the like and processing of them, similarly to the above-described second conductive layers 716. Each of the third conductive layers 720 can be electrically connected to a source electrode or a drain electrode of the semiconductor element but cannot be electrically connected to a gate electrode. Therefore, contact holes reaching the gate electrodes are formed and electrodes are formed in the same step as the third conductive layers 720, and accordingly the electrodes can be connected to the gate electrodes.

Through the above-described process, the layer including the semiconductor elements can be formed. Differently from the above-described method, by addition of an impurity element to a selected region after formation of a semiconductor layer, a semiconductor element can also be formed. Hereinafter, a method of forming semiconductor elements in such a manner will be described.

Figure 28A:
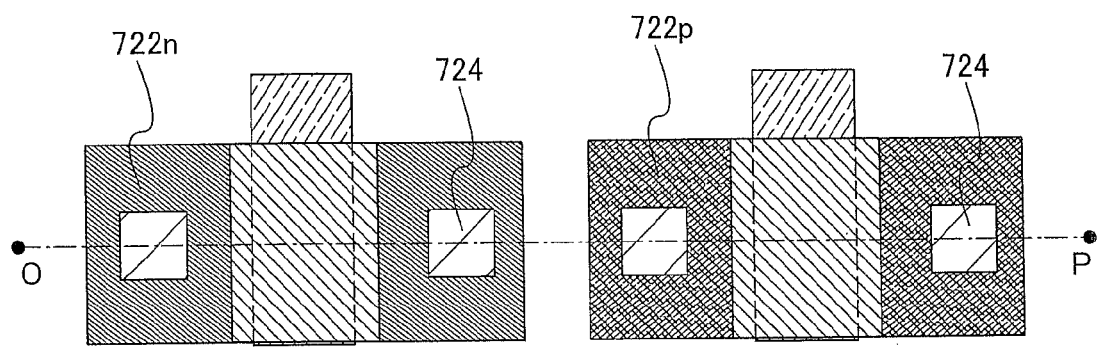
FIGS. 28A and 28B show a manufacturing method of a layer including a semiconductor element of the present invention.
Figure 28B:
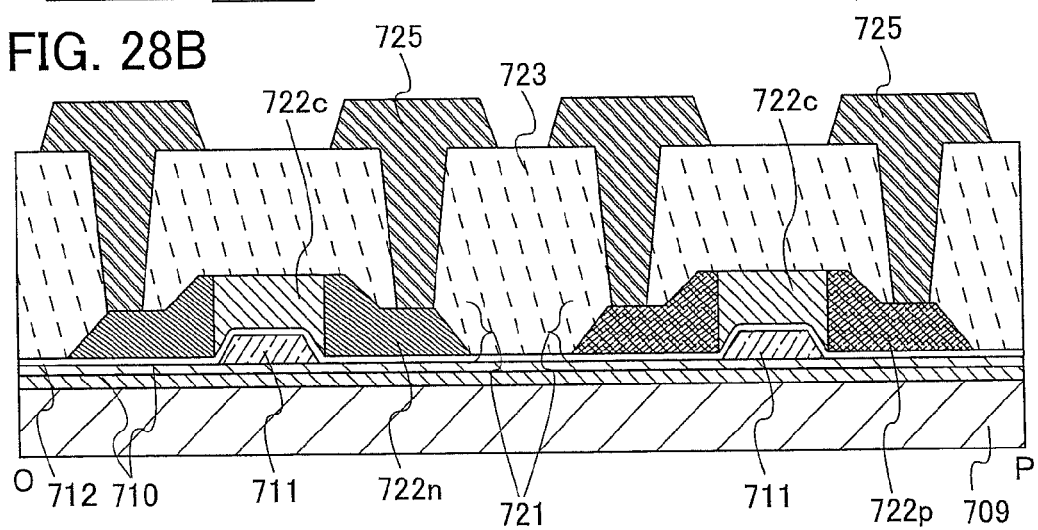

As the manufacturing example described with reference to FIGS. 26A1 to 27B, after the formation of the base layer 710, the first conductive layers 711 (gate electrodes), and the first insulating layer 712 (gate insulating layer) over the substrate 709, semiconductor layers 721 are formed (FIG. 28B). The semiconductor layers 721 can be formed of a material containing silicon, similarly to the above-described example. In the present invention, an amorphous semiconductor layer is formed, heat treatment or laser irradiation is conducted to form a crystallized crystalline semiconductor layer, and processing to a predetermined shape is conducted.

Then, impurity elements are selectively added to the semiconductor layers 721, so that n-type impurity regions 722n and (or) p-type impurity regions 722p are formed (FIGS. 28A and 28B). The impurity regions can be formed by selective formation of a resist mask by photolithography and addition of the impurity elements. The impurity elements can be added by an ion doping method or an ion implantation method. As an impurity element which imparts n-type conductivity, phosphorus or arsenic is typically used, and as an impurity element which imparts p-type conductivity, boron can be used. It is desirable that the impurity element which imparts n-type conductivity is added to the n-type impurity regions $722n$ in a concentration range of $1\times10^{20}/cm^3$ to $1\times10^{21}/cm^3$. In addition, by selective formation of the impurity regions $722n$ and $722p$ in the semiconductor layers $721$, channel formation regions $722c$ are formed.

After the impurity regions $722n$ and $722p$ are formed, heat treatment, infrared light irradiation, or laser light irradiation is carried out to activate the impurity elements. In particular, effective activation can be carried out particularly when the impurity elements are activated using an excimer laser from the front surface or from the rear surface in an atmosphere at room temperature to 300° C. Such activation can also repair plasma damage to the first insulating layer and to an interface between the first insulating layer and the semiconductor layers. Further, a second harmonic of a YAG laser may be used for the activation. The irradiation using the YAG laser is a preferable activation means because the YAG laser requires less maintenance.

Further, a passivation film of an insulating film such as a silicon oxynitride film or a silicon oxide film can be formed so as to cover the semiconductor layers $721$ and the structure layer, so that hydrogenation can be performed. The hydrogenation is to terminate dangling bonds in the semiconductor layers $721$, which are generated by the addition of the impurity elements, by hydrogen contained in the passivation film. At the same time, the aforementioned impurity regions can be activated. For example, the semiconductor layers can be hydrogenated by formation of a silicon oxynitride film over the semiconductor layers by a plasma CVD method with a thickness of 100 nm and then heat treatment at 300° C. to 550° C. for 1 to 12 hours using a clean oven. Alternatively, the heating may be conducted at 410° C. for one hour in a nitrogen atmosphere.

Through the above-described process, an n-channel thin film transistor and a p-channel thin film transistor are formed as the semiconductor elements (FIGS. 28A and 28B). Although the n-type semiconductor element and the p-type semiconductor element are formed in this embodiment mode, the electric circuit can also be formed using only one of them. When the electric circuit is formed using either the n-type semiconductor element or the p-type semiconductor element, the number of reticles (photomasks) used for photolithography can be reduced and the number of manufacturing steps can be reduced.

Then, a second insulating layer $723$ is formed over the semiconductor elements (FIG. 28A). The second insulating layer $723$ can be formed of an insulating inorganic compound, an insulating organic compound, or the like, similarly to the second insulating layer $718$. The second insulating layers can be formed of the above-mentioned insulating material with a single layer structure or a lamination structure including two or more layers.

Then, the second insulating layer $723$ is etched to form contact holes $724$ (FIG. 28). At this time, the etching treatment can be conducted by dry etching treatment or wet etching treatment. In this embodiment mode, an example of forming the contact holes $724$ by anisotropic dry etching will be described.

Next, third conductive layers $725$ are formed over the second insulating layer $723$ and the contact holes $724$. The third conductive layers $725$ can be formed, similarly to the third conductive layers $720$ described in the above example, by formation of a conductive metal element, a compound thereof, or the like and processing. The third conductive layers not only connect to the semiconductor elements to form source electrodes and drain electrodes, but also electrically connect a microstructure to the semiconductor elements (FIG. 28B).

Through the above-described process, the layer including the semiconductor elements can be formed. Differently from the method shown in FIGS. 28A and 28B, after the semiconductor layer is formed, the first conductive layer (gate electrode) can be formed and an impurity element can be added to the semiconductor layer using the first conductive layer as a mask, thereby forming a semiconductor element. Such a manufacturing example will be described with reference to FIGS. 29A and 29B.

In this case, the base layer $710$ is formed over the substrate $709$, and semiconductor layers $726$ are formed over the base layer $710$. The semiconductor layers $726$ can be formed of a material containing silicon, similarly to the above-described example. In the present invention, an amorphous semiconductor layer is formed, heat treatment or laser irradiation is conducted to form a crystallized crystalline semiconductor layer, and processing the semiconductor layer into a predetermined shape is conducted.

Next, a first insulating layer $727$ (gate insulating film) is formed over the semiconductor layers $726$. The first insulating layer $727$ can be formed, similarly to the above-described example, by a plasma CVD method, a sputtering method, or the like using a material containing silicon such as silicon oxide or silicon nitride. The first insulating layer $727$ can be formed by high density plasma treatment. An insulating film formed by the high density plasma treatment is dense, causes little damage to other films, and can improve the state of an interface between the formed insulating film and a layer to be in contact therewith. First conductive layers $728$ (gate electrodes) are formed over the first insulating layer $727$. The first conductive layers $728$ can be formed by formation of a conductive metal element, a compound thereof, or the like and processing, similarly to the first conductive layers $711$ of the above-described example.

Then, similarly to the above-described example, impurity elements are selectively added to the semiconductor layers $726$, so that n-type impurity regions $729n$ and p-type impurity regions $729p$ are formed. By selective addition of the impurity elements, channel formation regions $729c$ are formed. Here, in the case of forming a semiconductor element with a short channel length, it is important to sufficiently reduce the off current value (a drain current flowing when the semiconductor element is in an off state). In order to reduce the off current value, a semiconductor element having a low concentration drain (LDD: Light Doped Drain) region is preferably manufactured. It is preferable in the n-channel transistor that a low concentration impurity region is provided between the channel formation region $729c$ and the high concentration impurity regions (n-type impurity regions $729n$).

The method of forming the low concentration impurity region is, for example, as follows: an impurity element is selectively added using the first conductive layer $728$ as a mask, n-type low concentration impurity regions are formed, then an insulating layer is formed over the first conductive layer $728$, the insulating layer is subjected to anisotropic etching to form insulating layers called side walls on side surfaces of the first conductive layer $728$ so that the side walls overlap the regions to be the n-type low concentration impurity regions of the semiconductor layer $726$. Then, using the first conductive layer $728$ and the side walls as masks, an n-type impurity element is added to the semiconductor layer $726$ including the n-type low concentration impurity regions, to form high concentration impurity regions which have higher concentrations of the impurity element than those of the n-type low concentration impurity regions. In this way, an n-type semiconductor element including LDD regions can be formed.

In order to prevent reduction of the on current value (drain current flowing when the semiconductor element is in an on state) owing to the deterioration caused by the injection of hot carriers, a semiconductor element having a GOLD (Gate-drain Overlapped LDD) structure, in which LDD regions are overlapped with a gate electrode with a gate insulating film interposed therebetween, is preferably manufactured. When such a structure is employed, high electric field at the periphery of the drain is eased, thereby preventing the injection of hot carries, and deterioration of the semiconductor element can be prevented.

Figure 29A:
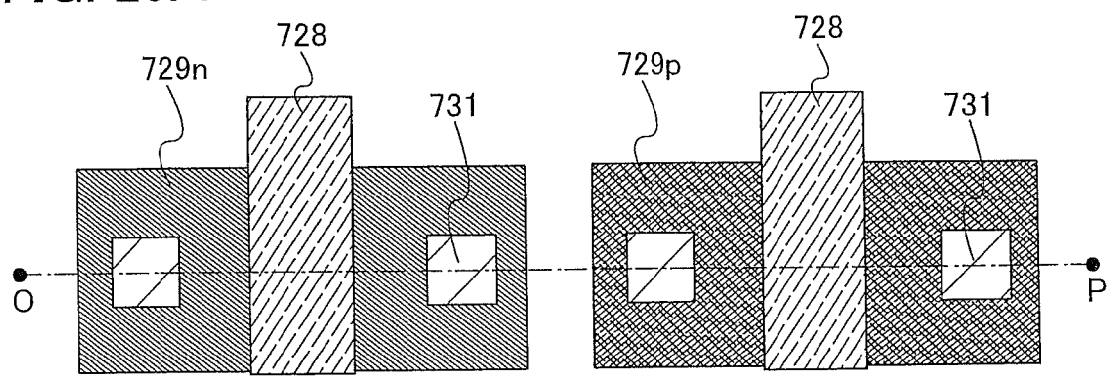
FIGS. 29A and 29B show a manufacturing method of a layer including a semiconductor element of the present invention.
Figure 29B:
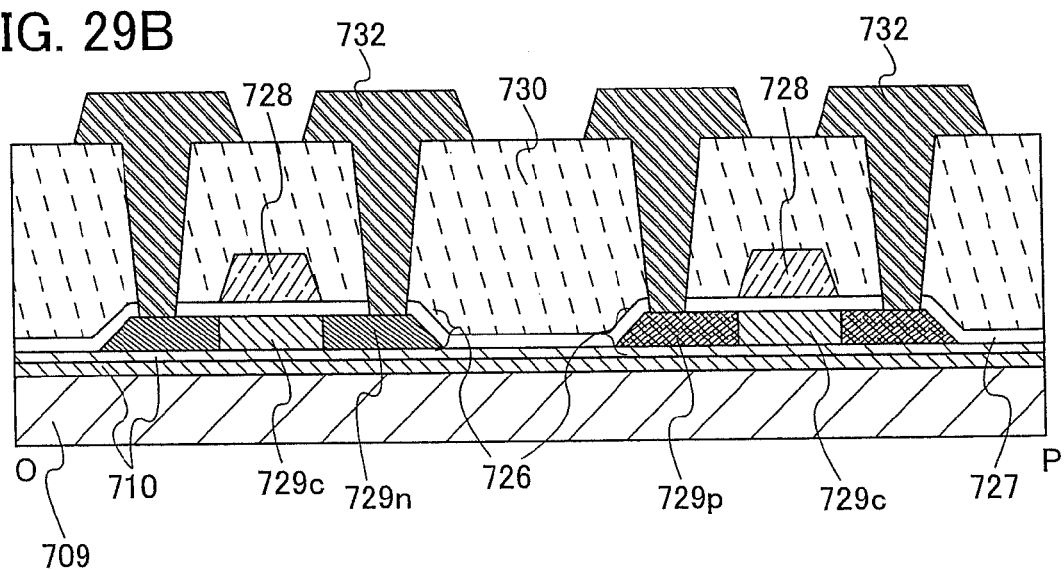

Then, a second insulating layer 730 is formed over the semiconductor elements (FIG. 29B). The second insulating layer 730 can be formed of an insulating inorganic compound, an insulating organic compound, or the like, similarly to the above-described second insulating layer 718. The second insulating layer may be formed of the above-described insulating material with a single layer structure or a lamination structure including two or more layers.

Next, the second insulating layer 730 is etched to form contact holes 731. At this time, the etching treatment can be conducted by dry etching treatment or wet etching treatment. In this embodiment mode, an example of forming first contact holes by anisotropic dry etching, will be described.

Then, second conductive layers 732 are formed over the second insulating layer 730 and the first contact holes 731. The second conductive layers 732 can be formed by formation of a conductive metal element, a compound thereof, or the like and processing, similarly to the third conductive layers 725 described in the above example. The second conductive layers 732 not only connect to the semiconductor elements to form source electrodes and drain electrodes, but also electrically connect a microstructure to the semiconductor elements (FIG. 29B).

Through the above-described process, a layer including the semiconductor elements can be formed.

Here, in the case where the first conductive layers, the second conductive layers, and the third conductive layers each have a pattern including a corner in the manufacturing examples shown in FIGS. 26A1 to 29B, the corner is preferably processed into a rounded shape. Accordingly, the generation of dust caused by flaking of the corner of the layer can be suppressed, and the substrate can be efficiently cleared of dust thereover. This characteristic is preferable when the first conductive layers, the second conductive layers, the gate electrodes, or the like are formed of metal or a metal compound or when a thick layer is processed. Since these conductive layers are thicker than the semiconductor layers or the base layer, when the conductive layers are processed so as to have a cross section including a taper angle, the generation of dust caused by flaking of the corner of the layer can be suppressed, and the substrate can be efficiently cleared of dust thereover.

If needed, a layer forming a microstructure may be further stacked over the layer including the semiconductor elements formed in the above-described manner. For example, a third insulating layer and a fourth conductive layer can be formed over the second insulating layer and the third conductive layers. However, the third insulating layer can also be used as a layer forming a microstructure.

Thus, a second layer including semiconductor elements can be formed over the substrate.

Since sacrificial layer etching is not conducted in the manufacturing method of the present invention, other elements such as semiconductor elements, as well as a microstructure, can be formed at the same time. Particularly by the manufacture of a semiconductor element over a second substrate which forms the second layer (layer which is not separated at the time of attachment), a micromachine including semiconductor element with a conventional characteristic can be manufactured without the reduction of the characteristic caused by the step such as sacrificial layer etching.

When using the above-described manufacturing method of the micromachine of the present invention, effects (a) to (i) similar to those of the manufacturing method of the microstructure described in Embodiment Mode 1 or the like can be obtained. Some effects are described below.

(a) A microstructure can be manufactured without sacrificial layer etching. That is, since a similar step to the sacrificial layer etching is conducted in the separation and the attachment, the step can be completed in a considerably short time.

(b) When separation and attachment are substituted for the sacrificial layer etching, a microstructure can be manufactured so as not to generate attachment of the structural layer and the substrate by a capillary phenomenon because the microstructure does not contact a liquid etchant as in wet etching.

(i) In the present invention, since a sacrificial layer is not formed and further the first layer and the second layer are separately formed and attached to each other, a step portion caused by a thick film like a sacrificial layer is not generated, and a break generated from a portion which crosses the step is not generated. Therefore, a microstructure with high strength can be manufactured.

A micromachine can be manufactured by free combination of this embodiment mode with the microstructure described in the above embodiment mode. That is, any of the structural layers for forming a microstructure is manufactured in the same process as that of manufacturing a semiconductor element for forming an electronic circuit; therefore, a micromachine including the microstructure and the electronic circuit can be manufactured.

Embodiment Mode 8

Embodiment Mode 8 will describe an example of the structure of a micromachine of the present invention and its function. The micromachine of the present invention is characterized by including a microstructure having a three-dimensional structure and an electric circuit which includes a semiconductor element and controls the microstructure.

Figure 30:
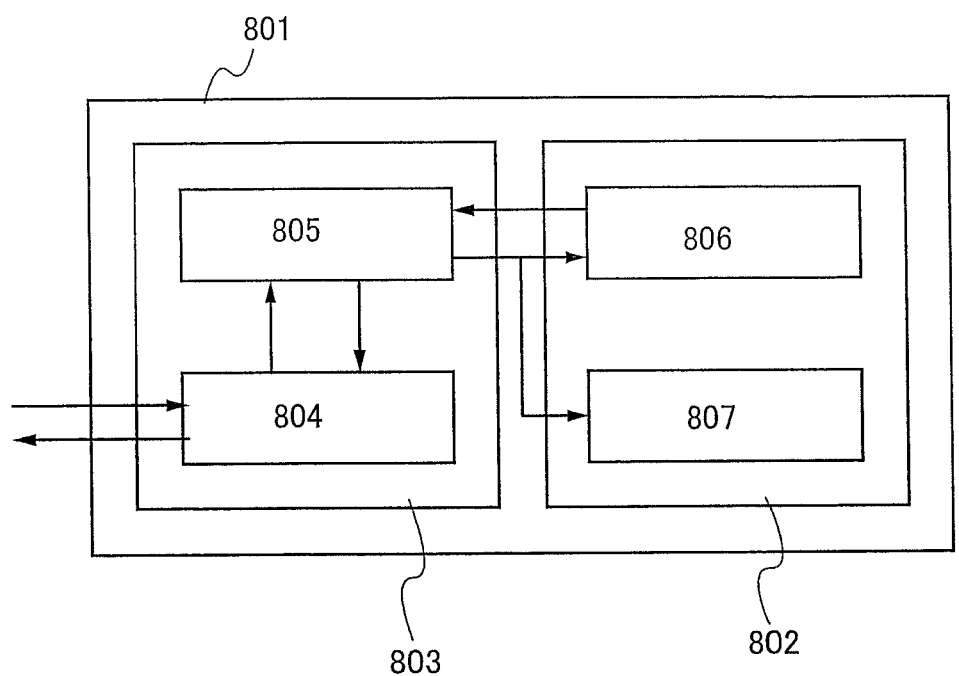
FIG. 30 shows a micromachine of the present invention.

FIG. 30 shows a conceptual diagram of a micromachine. A micromachine 801 includes a microstructure 802 and an electric circuit 803 which includes a semiconductor element.

The microstructure 802 included in the micromachine 801 has a space which is provided between a substrate and a structural layer, and the structural layer is movable in the space in many cases. The microstructure 802 can function as a sensor for detecting a physical quantity or an actuator for converting a signal from the electric circuit 803 into displacement. In addition, as shown in FIG. 30, the micromachine 801 can include a plurality of microstructures (a first microstructure 806, a second microstructure 807, and the like in the diagram).

The electric circuit 803 included in the micromachine 801 includes an interface circuit 804 for performing communication with an external control device, and a control circuit 805 which processes a signal for controlling the microstructure. In addition, the electric circuit 803 can include an amplifier circuit which amplifies an output signal from the microstructure, an A/D converter which converts a control signal from the external control device from an analog signal to a digital signal, a D/A converter which converts from a digital signal to an analog signal, a memory which stores a control program of the microstructure, a memory control circuit which controls the memory, and the like.

Figure 31A:
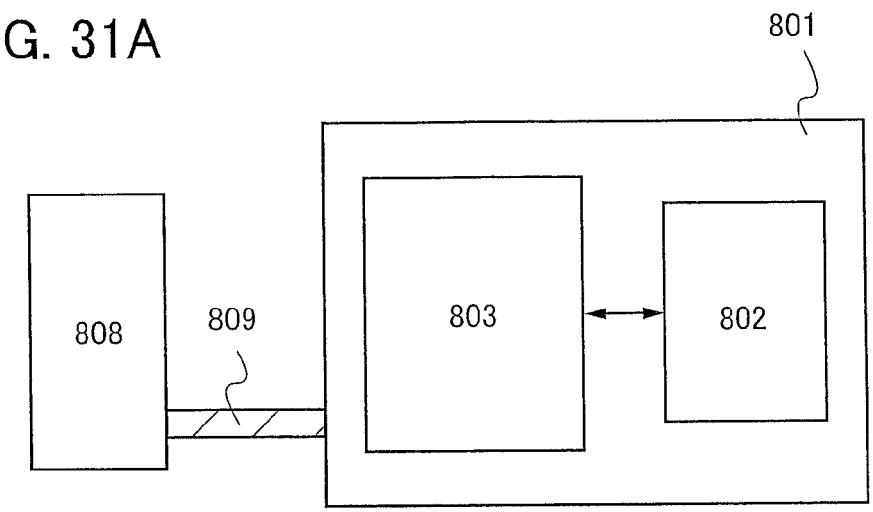
FIGS. 31A to 31C show micromachines of the present invention.

Next, an example of the function of the micromachine having the above-described structure is described with reference to FIGS. 31A to 31C. For example, the micromachine 801 of the present invention includes the microstructure 802 and the electric circuit 803 as shown in FIG. 31A. In addition, the micromachine 801 is connected to an external control device 808 for controlling the micromachine 801 with a cable (transmission line) 809, and a control signal and a driving power are supplied from the external control device 808 to the micromachine 801. Here, one transmission line may be provided for transmitting and receiving a control signal and for supplying a power. Alternatively, a transmission line for transmitting and receiving a control signal and a transmission line for supplying power may be separately provided.

For example, in a case where the microstructure 802 functions to detect a physical quantity, substance concentration, or the like, the micromachine 801 can function as a sensor in which information detected by the microstructure 802 is processed by the electric circuit 803 and is transmitted to the external control device 808. In this case, the electric circuit 803 can include a control circuit, an A/D converter, a D/A converter, a memory, a memory control circuit, and the like as described above.

Figure 31B:
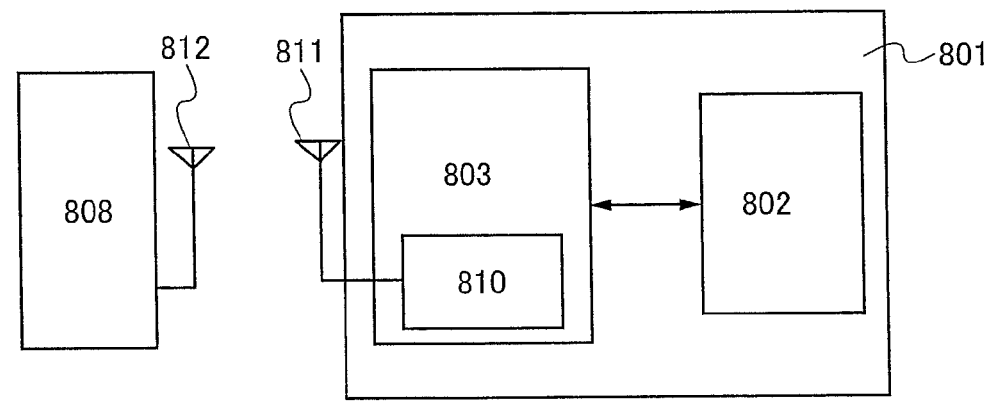

As shown in FIG. 31B, the micromachine 801 of the present invention can include the electric circuit 803 which includes a wireless communication circuit 810 communicating with the external control device wirelessly, and other circuits, and the microstructure 802. Here, the wireless communication circuit 810 can include an antenna 811 for transmitting and receiving an electromagnetic wave, a power supply circuit which generates driving power of the electric circuit 803 and the microstructure 802 from the electromagnetic wave received by the antenna 811, a demodulation circuit which demodulates a signal from the electromagnetic wave received by the antenna 811, and the like. The wireless communication circuit 810 can further include, as a power source, a battery, a power generation circuit which generates power from light, heat, or the like, and the like besides the power supply circuit which generates driving power from the electromagnetic wave.

Thus, when the micromachine includes the wireless communication circuit 810 and communicates with the external control device 808 wirelessly using an electromagnetic wave, the micromachine 801 is not limited by a transmission cable, and the degree of freedom in operable range can be heightened. With the capability of wireless communication as described above, it becomes possible to realize a micromachine which can be located anywhere and is familiar to a user. In this case, the external control device 808 which controls the micromachine 801 also includes a wireless communication circuit, an antenna 812, and the like for communication with the micromachine 801.

Figure 31C:
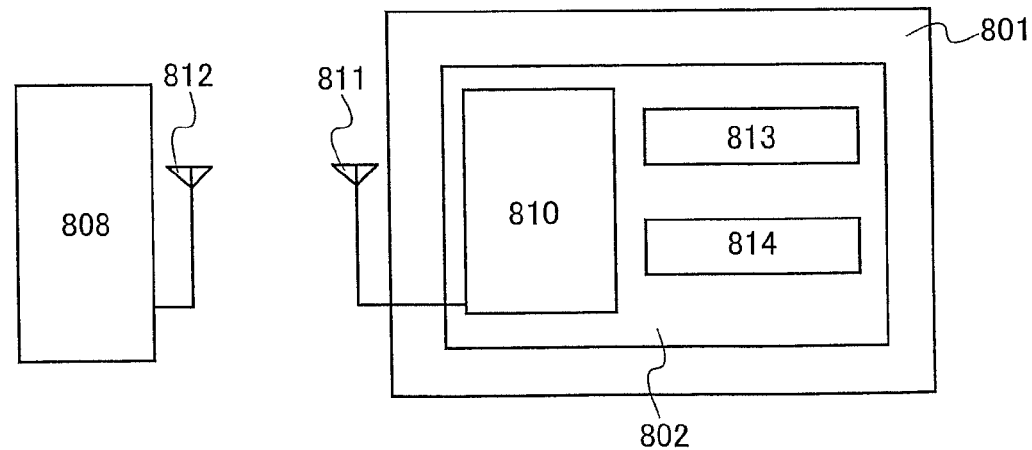

As shown in FIG. 31C, the micromachine 801 can constitute a part of a semiconductor device (such as an RFID tag or an IC tag) which performs wireless communication. In other words, it is possible to manufacture a semiconductor device (=micromachine) in which a passive element such as a capacitor or an inductor, a switch, a waveguide for transmitting a high-frequency signal, or the like included in the wireless communication circuit 810 is formed using a microstructure.

In this case, the micromachine 801 includes the electric circuit 803 including the wireless communication circuit 810, a demodulation circuit 813, a signal processing circuit 814, and the like, and the wireless communication circuit 810, the demodulation circuit 813, and the like each include a passive element, a switch, or the like which is formed using a microstructure.

When the passive element is formed using a microstructure, better characteristics than that of the conventional can be obtained. Accordingly, highly-sensitive wireless communication can be performed when a wireless communication circuit is formed using the passive element. Further, a semiconductor device capable of communication in a higher-frequency band and a broader-frequency band than those of the conventional can be provided.

The microstructures described in this specification are mere examples, and a microstructure can be formed to have a shape suited to a purpose through steps according to the purpose and a predetermined function by various driving methods. For example, the microstructure can be used as a sensor which detects displacement of the structural layer owing to force from an upper surface of the substrate, and can alternatively be used as a variable capacitor which changes a capacitance between two electrodes. Thus, one microstructure can have different functions by using different driving methods.

As described above, the microstructure included in the micromachine of the present invention can constitute not only a part of a sensor or an actuator but also a part of an electric circuit such as a passive element or a waveguide. A passive element (such as a capacitor, an inductor, or a resistor) is an important component, for example, in the case of performing wireless communication using a high-frequency range, but it is difficult to form a passive element which operates at high speed with little loss through a process of forming a general semiconductor element (such as a CMOS or a BiCMOS). However, when a passive element is formed using the microstructure formed through the above-described process, the passive element can have favorable characteristics.

Conventionally, in the case of treating a minute object having a size of a few millimeters or less, such a process has been necessary that a structure of the minute object is magnified first, a person or a computer obtains information thereof and carries out information processing and operation setting, and the operation is reduced in size and sent to the minute object. In contrast, the micromachine described in this embodiment mode can treat a minute object by only transmission of a dominant concept instruction from a person or a computer. In other words, once a person or a computer determines a purpose and transmits an instruction, the micromachine can operate in such a manner: the micromachine obtains information on an object using a sensor or the like and conducts information processing.

This embodiment mode can be implemented by being freely combined with any of other embodiment modes.

Embodiment Mode 9

Embodiment Mode 9 will describe modes of a semiconductor device and an electronic device, which utilize the microstructure described in any of the above embodiment modes. First, a semiconductor device capable of communicating data without contact, will be described below, with reference to FIGS. 32A to 34E.

A semiconductor device 80 has a function of exchanging data without contact with a reader/writer which is provided outside the semiconductor device. The reader/writer transmits a signal to the semiconductor device 80, and the semiconductor device 80 returns a signal corresponding to the transmitted signal. The reader/writer receives the signal transmitted from the semiconductor device, thereby making it possible to read data of the semiconductor device.

Figure 32A:
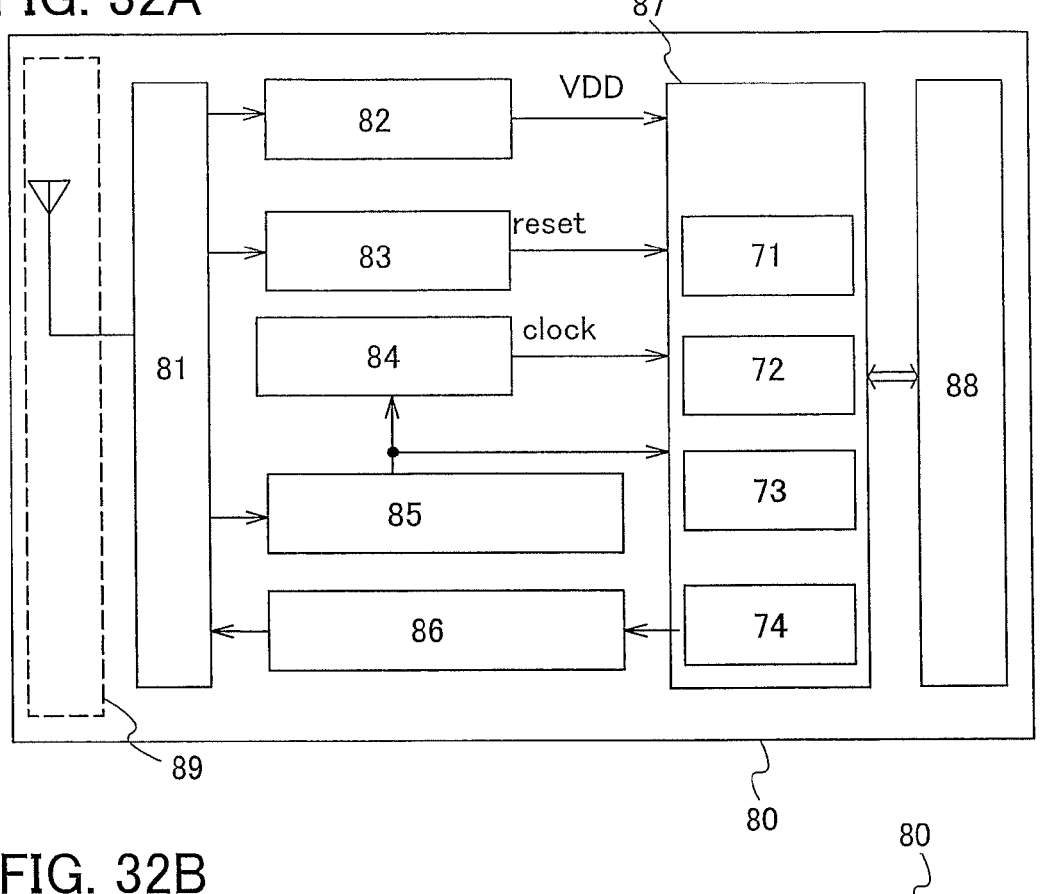
FIGS. 32A and 32B show embodiment modes of a semiconductor device of the present invention.

The semiconductor device 80 includes a high-frequency circuit 81, a power supply circuit 82, a reset circuit 83, a clock generation circuit 84, a data demodulation circuit 85, a data modulation circuit 86, a control circuit 87 for controlling another circuit, a memory circuit 88, and an antenna 89 (FIG. 32A).

The high-frequency circuit 81 receives a signal from the antenna 89 and outputs a signal, which is received from the data modulation circuit 86, from the antenna 89. The power supply circuit 82 generates a power supply potential from a received signal. The reset circuit 83 generates a reset signal. The clock generation circuit 84 generates various clock signals based on a received signal input from the antenna 89. The data demodulation circuit 85 demodulates a received signal and outputs the demodulated signal to the control circuit 87. The data modulation circuit 86 modulates a signal received from the control circuit 87.

As the control circuit 87, for example, a code extraction circuit 71, a code judgment circuit 72, a CRC judgment circuit 73, and an output unit circuit 74 are provided. Note that the code extraction circuit 71 extracts each of plural codes included in an instruction transmitted to the control circuit 87. The code judgment circuit 72 judges the content of the instruction by comparison of the extracted code with a code corresponding to a reference. The CRC judgment circuit 73 detects whether or not there is a transmission error or the like based on the judged code, and the output unit circuit 74 outputs the detection result.

In addition, the number of the memory circuits 88 is not limited to one, and a plurality of memory circuits 88 can be provided, and an SRAM, a flash memory, a ROM, a FeRAM, or the like, or a memory element portion including an organic compound layer can be used.

Next, an example of an operation of the semiconductor device of the present invention capable of exchanging data without contact is described. First, a wireless signal is received by the antenna 89 and then sent to the power supply circuit 82 through the high-frequency circuit 81, thereby generating a high power supply potential (hereinafter referred to as VDD) and a low power supply potential (hereinafter referred to as VSS). The VDD is supplied to each circuit in the semiconductor device 80. Note that the VSS is common in the plural circuits included in the semiconductor device 80 and the VSS can be GND.

A signal sent to the data demodulation circuit 85 through the high-frequency circuit 81 is demodulated (hereinafter this signal is called a demodulated signal). Moreover, signals passed through the reset circuit 83 and the clock generation circuit 84 via the high-frequency circuit 81, and the demodulated signal are sent to the control circuit 87. The signals sent to the control circuit 87 are analyzed by the code extraction circuit 71, the code judgment circuit 72, the CRC judgment circuit 73, and the like. Then, based on the analyzed signals, the information of the semiconductor device stored in the memory circuit 88 is output. The output information of the semiconductor device is encoded through the output unit circuit 74. Further, the encoded information of the semiconductor device 80 passes through the data modulation circuit 86 and then is transmitted by the antenna 89 as a wireless signal.

In this manner, when a signal is transmitted from the reader/writer to the semiconductor device 80 and the signal transmitted from the semiconductor device 80 is received by the reader/writer, the data of the semiconductor device can be read.

The semiconductor device 80 including a wireless communication function as described above is formed of semiconductor elements having various functions, such as a switch, an inductor, a capacitor, a resistance element, and the like. These elements for forming the semiconductor device can be formed using the microstructure described in the above embodiment mode. A microstructure functioning as a waveguide can also be used, as well as microstructures for the switch, the inductor, and the capacitor. Further, a variable inductor which can optionally change an inductance can be formed as an inductor, and a variable capacitor which can optionally change a capacitance can be formed as a capacitor.

A new function can be added since the semiconductor device capable of wireless communication as described above includes a microstructure. For example, when a microstructure functioning as a sensor is included, a semiconductor device which detects external physical quantity can be manufactured. The external physical quantity means a physical quantity such as temperature, pressure, acceleration, or distortion. In particular, the microstructure of the present invention can detect the dynamic physical quantity by the change of the structure.

Figure 32B:
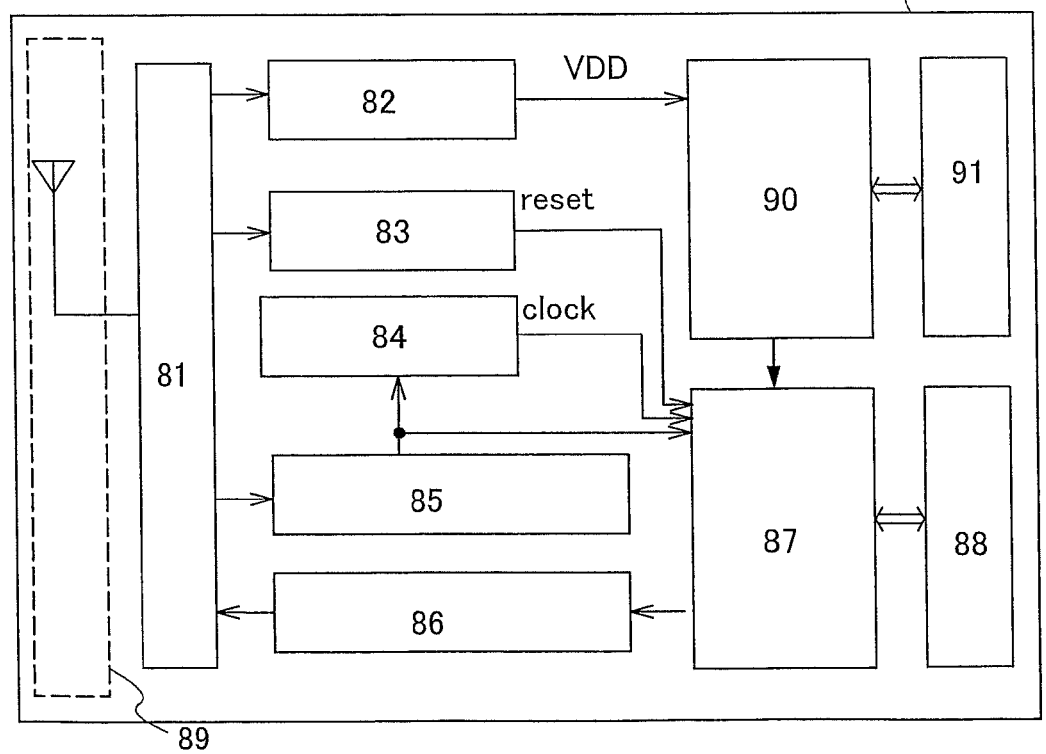

An example of the configuration of such a semiconductor device is shown in FIG. 32B. The semiconductor device 80 includes a sensor control circuit 90 and a sensor element 91 in addition to the above-described configuration. The sensor element 91 includes the microstructure of the present invention and functions as a sensor by changing in accordance with the external physical quantity. The sensor control circuit 90 functions as an interface for exchanging information between the sensor element 91 and the control circuit 87. The semiconductor device 80 having this structure transmits information stored in the memory circuit 88 and information detected by the sensor element 91, to the reader/writer. The information detected by the sensor element 91 can be stored in the memory circuit 88.

Here, the semiconductor device 80 can be a passive type, in which power supply to each circuit is conducted by an electromagnetic wave from the reader/writer. Alternatively, an active type, in which a battery is provided and power is supplied therefrom, can be used. Further, a semiconductor device including a power generation device or a battery (electric storage device) using a microstructure, can also be used. As the microstructure for forming the power generation device, microstructures utilizing a piezoelectric element, a thermoelectric element, a micromotor, or the like can be used. This power generation device converts energy applied from the outside to electric power. Then, the electric power obtained by the power generation device can be used for driving the semiconductor device.

As described in the above embodiment mode, a semiconductor element and a microstructure of the present invention which form a semiconductor device can be formed over a substrate which is thin and soft like a plastic film. When they are formed over such a thin and soft substrate, the semiconductor device can be bent and can be attached to an object having a curved surface.

Figure 33A:
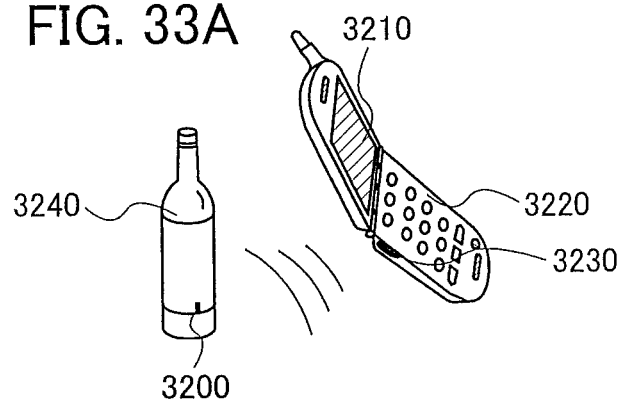
FIGS. 33A and 33B show embodiment modes of a semiconductor device of the present invention.

Next, examples for the usage mode of the semiconductor device capable of exchanging data without contact, about which examples of the structure and operation are described above, will be described. As shown in FIG. 33A, a reader/writer 3230 is provided for a portable terminal 3220 including a display 3210, and a semiconductor device 3200 is provided on a side surface of a product 3240. When the reader/writer 3230 is held over the semiconductor device 3200 by a user of the portable terminal 3220, various information related to the product 3240 such as the materials and place (country) of origin of the product, test results in a manufacturing process, records of the distribution process, further how to use the product, instruction, and the like, is displayed on the display 3210.

The semiconductor device 3200 can be utilized for the management in the production process or the distribution process for the product 3240.

Figure 33B:
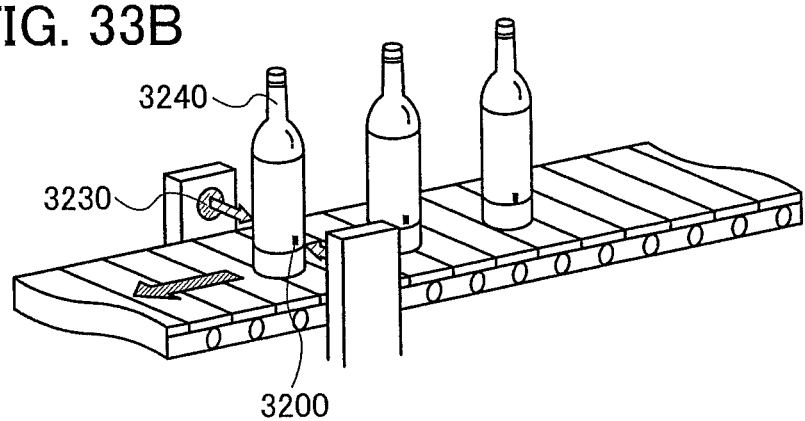

For example, as shown in FIG. 33B, the semiconductor device 3200 is provided for the product 3240 and the product 3240 is transported along on a conveyor belt to which the reader/writer 3230 is provided. Right after an important step or a step requiring the management such as the inspection, the semiconductor device 3200 provided to the product 3240 in the above-described manner communicates with the reader/writer 3230, thereby managing the product 3240.

As thus described, by application of a semiconductor device to a system for managing products, acquisition of information can be performed easily, and high function and high added value can be realized. In addition, as described in the above embodiment mode, even in the case of attaching the semiconductor device to an object having a curved surface, damages of a semiconductor element included in the semiconductor device can be prevented and a highly reliable semiconductor device can be provided.

Further, using a function capable of transmitting and receiving data without contact, a semiconductor device of the present invention can be used for the management of products or for the operation of a system. First, FIGS. 34A to 34D show examples of managing products with the use of the semiconductor device.

As shown in FIG. 34A, for example, a semiconductor device 1120 can be provided for an important personal belonging such as a key 1110. The semiconductor device can be provided for not only the key but also paper money, coins, securities, bearer bonds, certificates (driver's licenses, certificates of residence, or the like), books, and the like; accordingly, important belongings can be managed and management can be conducted so that the important belongings are not easily copied.

As shown in FIG. 34B, the semiconductor device 1120 can be provided to a container such as a petri dish 1111. In addition, the semiconductor device 1120 can be provided to experimental tools such as a reagent bottle, a flask, or a test tube. For example, when an experiment is conducted using a plurality of samples with the use of containers having the same shape, individual information of each container can be managed for each of the containers.

As shown in FIG. 34C, the semiconductor device 1120 can be provided to a bag 1112. In addition, the semiconductor device 1120 can be provided for accessories such as shoes or glasses, and for example, in the case of displaying expensive products on store shelves for sale, the management of the stock status of the products or prevention of shoplifting can be conducted.

As shown in FIG. 34D, the semiconductor device 1120 can be provided to a medicine bottle 1113. In addition, the semiconductor device 1120 can be provided to packing materials such as packing papers. For example, the semiconductor device can be utilized at home or in hospitals for the management of a medicine each patient should take, and for prevention of accidental ingestion and misadministration of medicines.

Further, various articles such as recording media (discs, video tapes, or the like), vehicles (bicycles, or the like), foods, clothing, livingwares, electronic devices (liquid crystal display devices, EL display devices, television devices, portable terminals, or the like), and the like can be managed when the semiconductor device is provided thereto. The semiconductor device can be attached to surfaces of articles having various shapes as described above or can be embedded therein in the manufacturing process of the articles so as to be fixed, in order to utilize the semiconductor device for the management of articles.

Next, an example of operating a system using a semiconductor device capable of communication without contact will be described. For example, as shown in FIG. 34E, the semiconductor device 1120 is provided inside an identification card 1114, and a reader/writer 1121 is provided at an entrance of a building or the like. When a person possessing the identification card 1114 passes through the place of the reader/writer 1121, the reader/writer 1121 reads an identification number inside the identification card 1114 that every person possesses and supplies information related to the identification number that has been read to a computer 1122. The computer 1122 judges whether to permit the person's entrance or exit, based on the information supplied from the reader/writer 1121. In such a manner, by utilizing the semiconductor device, an entrance-exit management system with improved convenience can be provided.

Although the entrance-exit management system has been described as an example with the drawing, when the semiconductor device 1120 is used for a physical distribution and inventory management system, an authentication system, a distribution system, a production record system, a book management system, and the like, the systems can have a higher function, multiple functions, and a higher added value.

In addition, as a signal transmission method in the above-described semiconductor device which can exchange data without contact, an electromagnetic coupling method, an electromagnetic induction method, a microwave method, or the like can be used. The transmission method may be selected as appropriate by a practitioner in consideration of an intended use, and an optimum antenna may be provided in accordance with the transmission method.

In a case of employing, for example, an electromagnetic coupling method or an electromagnetic induction method (e.g., 13.56 MHz band) as the signal transmission method in the semiconductor device, electromagnetic induction caused by a change in magnetic field density is used. Therefore, the conductive film which functions as an antenna is formed in an annular shape (e.g., a loop antenna) or a spiral shape (e.g., a spiral antenna).

A microwave method (e.g., UHF band (860 to 960 MHz band), a 2.45 GHz band, or the like) can be used as the signal transmission method in the semiconductor device. In that case, the shape such as the length of the conductive film which functions as an antenna may be appropriately set in consideration of the wavelength of an electromagnetic wave used for signal transmission. For example, a conductive film which functions as an antenna can be formed in a linear shape (e.g., a dipole antenna), a flat shape (e.g., a patch antenna), a ribbon-like shape, or the like. The shape of the conductive film which functions as the antenna is not limited to a linear shape, and the conductive film which functions as the antenna may be provided in a curved-line shape, a meander shape, or a combination thereof, in consideration of the wavelength of an electromagnetic wave.

The conductive film which functions as the antenna is formed from a conductive material by a CVD method, a sputtering method, a printing method such as screen printing or gravure printing, a droplet discharging method, a dispenser method, a plating method, or the like. The conductive film can be formed with a single layer structure or a lamination structure using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the above element as its main component.

For example, in a case of forming a conductive film which functions as an antenna by a screen printing method, the conductive film can be formed by selective printing of a conductive paste in which conductive particles each having a grain size of several nm to several tens of μm are dissolved or dispersed in an organic resin. For example, in the case of using fine particles (e.g., the grain size of the particles is 1 nm or greater and 100 nm or less) which mainly contains silver, as a material of the conductive paste, a conductive film can be obtained by hardening the conductive paste by baking at temperatures ranging from 150 to 300° C. Alternatively, a conductive paste which mainly contains solder or lead-free solder may be used; in this case, it is preferable to use a fine particle having a grain size of 20 μm or less. Solder or lead-free solder has an advantage in low cost.

Besides the above-mentioned materials, ceramic, ferrite, or the like may be applied to an antenna. Furthermore, a material of which dielectric constant and magnetic permeability are negative in a microwave band (metamaterial) can be applied to an antenna.

In the case of using an electromagnetic coupling method or an electromagnetic induction method, and providing a semiconductor device including an antenna in contact with a metal film, a magnetic material having magnetic permeability is preferably provided between the semiconductor device and the metal film. In the case of providing a semiconductor device including an antenna in contact with a metal film, an eddy current flows in the metal film due to change in a magnetic field, and a demagnetizing field generated by the eddy current impairs the change in a magnetic field and decreases a communication range. Therefore, an eddy current of the metal and a decrease in the communication range can be suppressed by provision of a material having magnetic permeability between the semiconductor device and the metal film. Note that ferrite or a metal thin film having high magnetic permeability and little loss of high frequency wave can be used as the magnetic material.

In the case of providing an antenna, a semiconductor element such as a transistor and a conductive film which functions as an antenna may be formed over the same substrate, or a semiconductor element and a conductive film which functions as an antenna may be provided over separate substrates and then attached to be electrically connected to each other.

Note that sealing treatment can be performed on the above-described semiconductor device. For example, sealing treatment can be performed on a semiconductor integrated circuit or a semiconductor device using a first sheet material (also referred to as a film or a substrate) and a second sheet material. As the first sheet material and the second sheet material used for the sealing, a fim containing polypropylene, polyester, vinyl, polyvinyl fluoride, vinyl chloride, or the like; paper containing a fibrous material; a lamination film of a base material film (polyester, polyamide, an inorganic evaporation film, papers, or the like) and an adhesive synthetic resin film (an acrylic-based synthetic resin, an epoxy-based synthetic resin, or the like); or the like can be used.

For the sealing treatment, heat treatment and pressure treatment are conducted by thermocompression bonding. At the time of thermocompression bonding, an adhesive layer provided on the outermost surface of the film or a layer (not an adhesive layer) provided on the outermost layer is melted by heat treatment to be bonded by being applied with pressure. An adhesive layer may be provided on the surface of the first sheet material and the second sheet material, but it is not necessarily provided. The adhesive layer corresponds to a layer containing an adhesive such as a thermosetting resin, a UV curing resin, an epoxy-based resin, or a resin additive.

The sheet material used for sealing is preferably coated with silica to prevent moisture or the like from entering the inside after the sealing, and for example, a sheet material in which an adhesive layer, a film of polyester or the like, and silica coat are stacked can be used.

In addition, when heat treatment is performed on films, the first sheet material and the second sheet material which have the same thermal expansion coefficient are preferably used. This is because transformation of a semiconductor device can be prevented or abnormal stress can be prevented from being applied to a semiconductor element by setting the shrinkage rates of the sheet materials after heat treatment to be the same.

As the first sheet material or the second sheet material, a film subjected to antistatic treatment for preventing static electricity or the like (hereinafter referred to as an antistatic film) can be used as well. As an antistatic film, a film where an antistatic material is dispersed in a resin, a film to which an antistatic material is attached, and the like can be given. As an antistatic material, metal, an oxide of indium and tin, and a surfactant such as a zwitterionic surfactant, a cationic surfactant, or a nonionic surfactant can be used. Instead, a resin material containing a cross-linked copolymer high molecular compound having a carboxyl group and a quaternary ammonium base in a side chain, or the like may be used as an antistatic material.

A film containing an antistatic material may be a film having one surface provided with an antistatic material, or a film having both surfaces provided with an antistatic material. Note that an antistatic material may be provided over the entire surface or a part of a film. When a semiconductor device is sealed with an antistatic film, semiconductor elements can be protected from external static electricity or the like when the semiconductor device is handled as a product.

In the sealing treatment, only one of the surfaces of the semiconductor device may be sealed selectively by using either one of the first sheet material and the second sheet material. In addition, sealing may be performed using a glass substrate instead of the first sheet material or the second sheet material. By such sealing treatment, an impurity element, moisture, and the like which enter semiconductor elements from the outside can be suppressed.

This embodiment mode can be implemented by being freely combined with any of the other embodiment modes. That is, the material and the formation method described in the above embodiment modes can be utilized by being combined with those in this embodiment mode, and the material and the formation method described in this embodiment mode can be utilized by being combined with those in the above embodiment modes.

Next, a semiconductor device (electronic device), particularly, a display device manufactured with the use of a microstructure of the present invention will be described with reference to FIGS. 35 to 37F. The microstructure of the present invention described in the above embodiment modes can be used for a display device. In this embodiment mode, an example of forming a pixel portion of a display device with the use of a microstructure having a switching function will be described.

Figure 35:
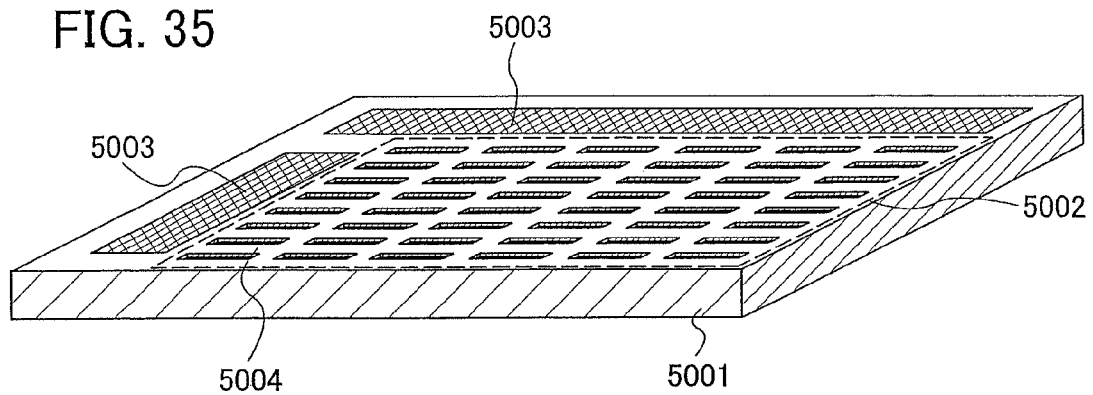
FIG. 35 shows an embodiment mode of a semiconductor device of the present invention.

As shown in FIG. 35, a display device 5001 includes a pixel portion 5002 which displays an image and a driver circuit 5003 which controls the pixel portion 5002. In the pixel portion 5002, pixels each including a microstructure 5004 are provided in matrix. In the pixel portion, pixels each including the microstructure may be provided in a line. A known driver circuit for sequentially transmitting signals to the pixel portion 5002 can be used as the driver circuit 5003. The microstructure 5004 included in the pixel portion 5002 can move in accordance with selection state/non-selection state of the pixel and displays an image. By such a structure, a liquid crystal display device, an electrophoretic display device, a display device utilizing refraction of light called GLV (Grating Light Valve), or the like can be manufactured.

For example, in the case of structuring an electrophoretic display device with the above-described structure, the operation of an electrophoretic display particle in each pixel can be controlled to display an image, by turning on or off the switching element formed with the use of a microstructure on and off.

The case of manufacturing a display device which utilizes refraction with the above-described structure will be described. The display device has a feature that it controls the direction or color of light, or the like by utilizing diffraction effect of light. A pixel portion of the display device is formed by arranging minute diffractive elements which are formed using a microstructure, and projection is conducted by laser light irradiation to the diffractive elements. Therefore, the microstructure is formed of a material which reflects visible light. A diffraction grating having a beam structure can be moved independently by an electric signal. By the adjustment of the movement amount, the diffraction amount can be varied. Accordingly, light and dark of an image can be produced by making a difference in shape change between diffraction gratings. The typical example of the display device is a projector type display called GLV, and the pixel portion has a structure where microstructures are formed of a material reflecting visible light, have a long-and-thin beam structure, and are provided in a line. The microstructures having the beam structure provided in a line can move up and down by application of a voltage between a conductive layer (fixed electrode) and a structural layer (movable electrode) which are provided over a substrate, and function as diffractive elements. Thus, the microstructures provided in a line become a laminar diffraction grating having a rectangular ditch by alternately moving the microstructures, and therefore the diffraction efficiency can be determined by the width of the microstructures with respect to the alignment cycle of the microstructures. Then, by light irradiation to this pixel portion from a light source, the voltage to be applied to the microstructures is changed and the movement amount of the microstructures is controlled, thereby changing the diffraction amount. Thus, light and dark of an image can be produced. In the case of color display of the display device, as a light source, three laser beams of red, green, and blue are used. Here, the laser having a high color purity is preferably used. Then, using a filter which selectively transmits only diffracted light from the pixel portion, only diffracted light is extracted, condensed by a lens, and an image is projected onto a screen.

In this manner, a display device utilizing diffraction of light can perform display with a high fineness, a high contrast, and a wide color gamut, and the image can express the stereognostic sense or the texture in detail. Such a display device can be utilized for a front projector or a projection television.

Figure 36A:
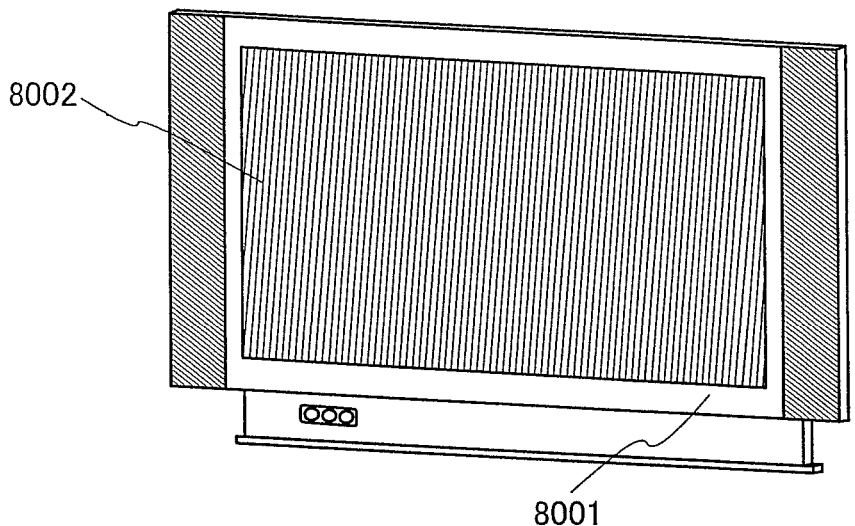
FIGS. 36A to 36E show embodiment modes of a semiconductor device of the present invention.
Figure 36B:
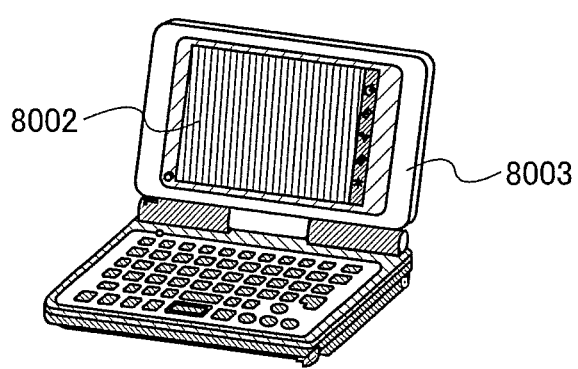
Figure 36C:
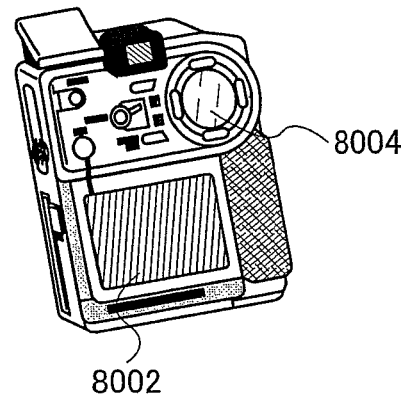
Figure 36D:
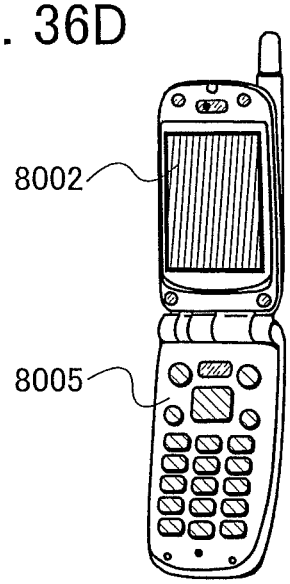
Figure 36E:
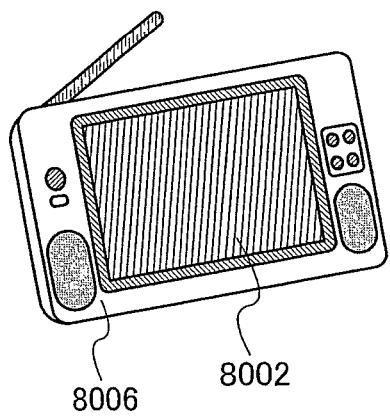

Next, an example of a semiconductor device (electronic device) including a display device having the above-described structure will be described. FIG. 36A shows a television 8001 including a display device 8002, a driver circuit for driving the display device 8002, or the like. FIG. 36B shows an information terminal device 8003 including the display device 8002, an electronic control circuit, an input-output interface, and the like. FIG. 36C shows a video camera 8004 including the display device 8002, an image processing circuit, and the like. FIG. 36D shows a cellular phone 8005 including the display device 8002, a wireless communication circuit, and the like. FIG. 36E shows a portable television 8006 including the display device 8002, a driver circuit, a wireless communication circuit, and the like.

Semiconductor devices such as the television 8001, the information terminal device 8003, the video camera 8004, the cellular phone 8005, and the portable television 8006 can be manufactured by application of the semiconductor device including the above-described microstructure to the display device 8002, a driver circuit, an electronic control circuit, a wireless communication circuit, a memory device, or the like. Note that the display device 8002 included in the semiconductor device can be widely applied to various devices such as a small sized one incorporated in a portable terminal such as a cellular phone handset or a portable television, a medium sized one which is portable, and a large sized one (for example, 40 inches or more in size). The semiconductor device (electronic device) of the present invention is not limited to those in FIGS. 36A to 36E, and can be applied to display devices, driver circuit portions, and the like which include a plurality of microstructures or semiconductor elements.

In addition, when a semiconductor device (electronic device) including a display device is manufactured over a thin and soft substrate, the semiconductor device can be flexible. Specific examples of a semiconductor device (electronic device) including a microstructure, which is manufactured over a flexible substrate, will be described with reference to FIGS. 37A to 37F.

Figure 37A:
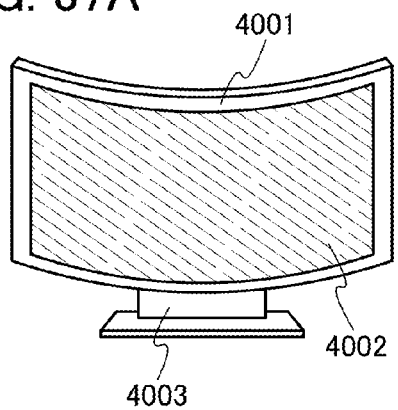
FIGS. 37A to 37F show embodiment modes of a semiconductor device of the present invention.

FIG. 37A shows a large display 4001 which includes a display device 4002 and a support base 4003. The display device 4002 is formed using a flexible substrate to realize a lightweight and thin display device 4001. Further, the display device 4002 can be curved, detached from the support base 4003, or mounted along a curved wall. Thus, the flexible display 4001 can be provided over a curved surface as well as a flat surface; therefore, it can be used for various applications.

Figure 37B:
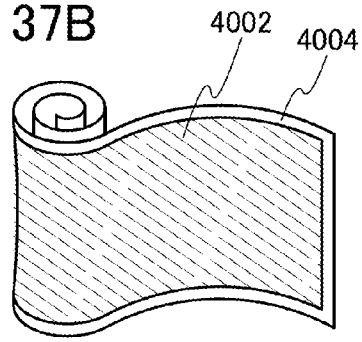

FIG. 37B shows a display 4004 which can be wound and includes the display device 4002. The display device 4002 of the display 4004 is formed using a flexible substrate to carry around the display 4004 in a bent or wound state. Therefore, even if the display 4004 is large, the display can be easily carried around.

Figure 37C:
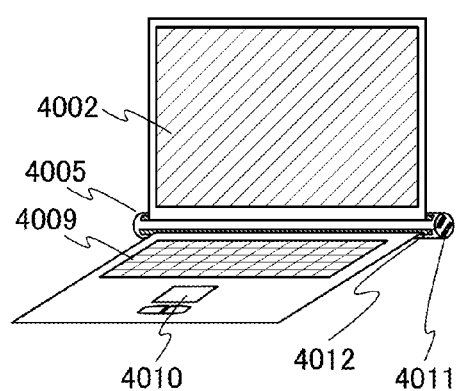

FIG. 37C shows a sheet computer 4005 which includes the display device 4002, a keyboard 4009, a touch pad 4010, an external connection port 4011, a power supply plug, a battery, and the like. The display device 4002 is formed using a flexible substrate to realize a lightweight and thin computer 4005. In addition, the display device 4002 can be wound and stored in the computer 4005 when a storage space 4012 is provided in a body of the computer 4005. In addition, when the keyboard 4009 is also formed to be flexible, the keyboard 4009 can be wound and stored in the storage space 4012, similarly to the display device 4002. The sheet computer 4005 having such a structure is easy to be carried around and can be stored without occupying space when it is not used.

Figure 37D:
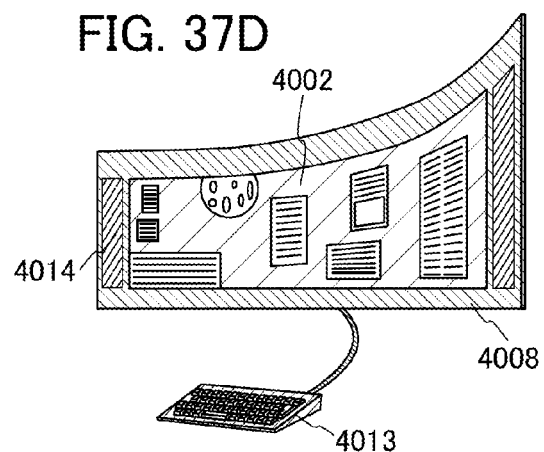

FIG. 37D shows a large display 4008 with a size of 20 to 80 inches, which includes the display device 4002, a keyboard 4013 that is an operating portion, a speaker 4014, and the like. The display device 4002 is formed using a flexible substrate, and can be carried in a bent or wound state with the keyboard 4013 detached. In addition, the communication between the keyboard 4013 and the display device 4002 can be performed wirelessly. The display 4008 can be mounted along a curved wall and can be operated wirelessly with the keyboard 4013.

Figure 37E:
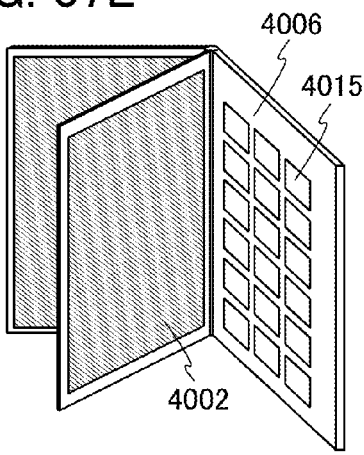

FIG. 37E shows an electronic book 4006 which includes the display device 4002, an operation key 4015, and the like. The display device 4002 can display a moving image as well as a still image such as a character. A modem may be incorporated in the electronic book 4006. The display device 4002 is formed using a flexible substrate to be bent or wound. Therefore, the electronic book can be carried or stored without occupying space.

Figure 37F:
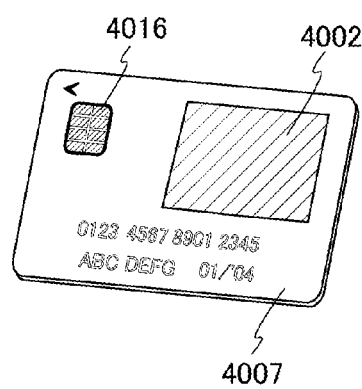

FIG. 37F shows an IC card 4007 which includes the display device 4002, a connection terminal 4016, an information processing circuit, a memory device, and the like. Since the display device 4002 is formed using a flexible substrate to have a lightweight and thin sheet shape, it can be attached onto a card surface and then be used. When the IC card 4007 obtains information from the outside through communications, the information can be displayed. Further, the structure in which the IC card 4007 does not include the connection terminal 4016 and can receive data from the outside without contact, can be formed. In that case, the IC card 4007 includes an antenna, a wireless communication circuit, or the like.

When a display device including a microstructure of the present invention described in any of the above embodiment modes is used as in this embodiment mode, semiconductor devices (electronic devices) having various functions such as a display and a wireless communication device can be manufactured. Thus, the present invention can be applied to a wide range of fields, and can be applied to semiconductor devices and electronic devices in any fields. This embodiment mode can be used in combination with any of the other embodiment modes.

This application is based on Japanese Patent Application serial no. 2006-138835 filed in Japan Patent Office on May 18, 2006, the entire contents of which are hereby incorporated by reference.

EXPLANATION OF REFERENCE

71: code extraction circuit, 72: code judgment circuit, 73: CRC judgment circuit, 74: output unit circuit, 80: semiconductor device, 81: high-frequency circuit, 82: power supply circuit, 83: reset circuit, 84: clock generation circuit, 85: data demodulation circuit, 86: data modulation circuit, 87: control circuit, 88: memory circuit, 89: antenna, 90: sensor control circuit, 91: sensor element, 101: first substrate, 102: separation layer, 102: first layer, 104: substrate including a first layer, 105: second substrate, 106: second layer, 107: substrate including a second layer, 108: spacer layer, 109: space portion, 110: microstructure, 201: first substrate, 202: separation layer, 203: first layer, 204: opening, 205: substrate including a first layer, 206: second substrate, 207: second layer, 208: spacer layer, 209: substrate including a second layer, 301: first substrate, 302: first separation layer, 303: first layer, 304: substrate including a first layer, 305: second substrate, 306: first spacer layer, 307: third substrate, 308: second spacer layer, 309: space portion, 310: microstructure, 311: second substrate, 312: second layer, 313: substrate including a second layer, 314: third substrate, 315: third layer, 316: substrate including a third layer, 317: first spacer layer, 318: second spacer layer, 319: space portion, 320: microstructure, 321: second separation layer, 322: second layer, 323: first protective substrate, 324: adhesive, 325: substrate including a second layer, 326: first spacer layer, 327: second spacer layer, 328: third substrate, 329: space portion, 330: microstructure, 331: third substrate, 332: third layer, 333: substrate including a third layer, 334: space portion, 335: microstructure, 336: third substrate, 337: third separation layer, 338: third layer, 339: second protective substrate, 340: adhesive, 341: substrate including a third layer, 342: first spacer layer, 343: second spacer layer, 344: space portion, 345: microstructure, 401: first substrate, 402: protective layer, 403: separation layer, 404: base layer, 405: first conductive layer, 406: first insulating layer, 407: first layer, 408: opening, 409: substrate including a first layer, 410: beam, 411: second substrate, 412: protective layer, 413: second conductive layer, 413a: fixed electrode, 413b: wiring, 414: second layer, 415: substrate including a second layer, 416: first spacer layer, 417: adhesive, 418: third substrate, 419: conductive paste, 420: microstructure, 421: space portion, 422: second spacer layer, 423: fourth substrate, 424: space portion, 501: third conductive layer, 502: first layer, 503: substrate including a first layer, 504: first spacer layer, 505: second spacer layer, 506: fourth substrate, 508: microstructure, 509: first substrate, 510: protective layer, 511: separation layer, 512: base layer, 513: first conductive layer, 514: first layer, 514a: movable electrode, 514b: wiring, 515: substrate including a first layer, 516: opening portion, 535: substrate including a second layer, 518: first spacer layer, 519: second spacer layer, 520: protective substrate, 521: microstructure, 522: layer, 523: space portion, 531: second substrate, 532: protective layer, 533: second conductive layer, 534: second layer, 535: substrate including a second layer, 601: second substrate, 602: second layer, 603: spacer layer, 604: first layer, 605: first conductive layer, 606: first insulating layer, 607: second conductive layer, 608: second insulating layer, 609: third conductive layer, 610: beam, 611: first conductive layer, 612: second conductive layer, 613: second substrate, 631a: electrode, 631b: electrode, 614: second layer, 615: first spacer layer, 616: first layer, 617: second spacer layer, 618: substrate including a third layer, 618a: substrate, 619: third layer, 620: first conductive layer, 621: second conductive layer, 622: third conductive layer, 623: beam, 624: anchor, 625: second substrate, 626: second layer, 627: first spacer layer, 628: first layer, 629: second spacer layer, 630: protective substrate, 631: first conductive layer, 632: second conductive layer, 633: first insulating layer, 634: second insulating layer, 635: support beam, 636: second substrate, 637: second layer, 638: first spacer layer, 639: first layer, 640: second spacer layer, 641: substrate including a third layer, 641a: substrate, 641b: third layer, 642: second conductive layer, 643: first conductive layer, 643a: conductive layer, 643b: conductive layer, 643c: conductive layer, 644: third conductive layer, 645: first insulating layer, 646: first protective layer, 647: first spacer layer, 648: first layer, 649: second spacer layer, 650: second protective substrate, 651: first conductive layer, 652: second conductive layer, 653: piezoelectric layer, 701: first substrate, 702: separation layer, 703: first layer, 704: second substrate, 705: second layer, 706: layer including a semiconductor element, 707: layer for forming a microstructure, 708: spacer layer, 709: substrate, 710: base layer, 711: gate electrode (first conductive layer), 712: first insulating layer, 713: first semiconductor layer, 714: second semiconductor layer, 715: semiconductor layer, 716: second conductive layer, 717: channel region, 718: second insulating layer, 719: contact hole, 720: third conductive layer, 721: semiconductor layer, 723: second insulating layer, 724: contact hole, 725: third conductive layer, 726: semiconductor layer, 727: first insulating layer (gate insulating film), 728: first conductive layer, 730: second conductive layer, 731: contact hole, 732: second conductive layer, 801: micromachine, 802: microstructure, 803: electric circuit, 804: interface circuit, 805: control circuit, 806: first microstructure, 807: second microstructure, 808: control device, 809: cable, 810: wireless communication circuit, 811: antenna, 812: antenna, 813: demodulation circuit, 814: signal processing circuit, 1110: key, 1111: petri dish, 1112: bag, 1113: medicine bottle, 1114: identification card, 1120: semiconductor device, 1121: reader/writer, 1122: computer, 3200: semiconductor device, 3210: display portion, 3220: portable terminal, 3230: reader/writer, 3240: product, 4001: display, 4002: display device, 4003: support base, 4004: display, 4005: computer, 4007: IC card, 4008: display, 4009: keyboard, 4010: touch pad, 4011: external connection port, 4012: storage space, 4013: keyboard, 4015: operation key, 4016: connection terminal, 5001: display device, 5002: pixel portion, 5003: driver circuit, 5004: microstructure, 8001: television, 8002: display device, 8003: information terminal device, 8004: video camera, 8005: cellular phone, and 8006: television.

The invention claimed is:

1. A display device comprising:
a substrate;
a pixel portion including a microstructure over the substrate; and
a driver circuit for controlling the pixel portion,
wherein the microstructure comprising:
a spacer layer which is selectively formed over a protective substrate,
and a layer which is formed over the spacer layer,
wherein the layer includes a fixed portion formed over the spacer layer and a movable portion below which the spacer layer is not formed, and the fixed portion and the movable portion are at least partially connected physically,
a space is provided between the movable portion of the layer and the protective substrate, and
the protective substrate is a light-transmitting substrate.

2. A display device according to claim 1, wherein the substrate is a flexible substrate.

3. A display device according to claim 1, wherein a part of the microstructure is movable.

4. A display device according to claim 1, wherein the display device is IC card.

5. A display device comprising:
a substrate;
a pixel portion including a microstructure over the substrate; and
a driver circuit for controlling the pixel portion,
wherein the microstructure are provided in a line,
wherein the microstructure is formed of a material which reflects visible light,
wherein the pixel portion has a structure where microstructures have a long-and-thin beam structure.

6. A display device according to claim 5, wherein the display device is a front projector.

7. A display device according to claim 5, wherein the display device is a projection television.

8. A display device comprising:
a substrate;
a pixel portion including a microstructure over the substrate; and
a driver circuit for controlling the pixel portion,
wherein the microstructure are provided in a matrix,
wherein the microstructure is formed of a material which reflects visible light,
wherein the pixel portion has a structure where microstructures have a long-and-thin beam structure.

9. A display device according to claim 8, wherein the display device is a front projector.

10. A display device according to claim 8, wherein the display device is a projection television.

* * * * *